(12) United States Patent
Zhou et al.

(10) Patent No.: US 11,631,792 B2
(45) Date of Patent: Apr. 18, 2023

(54) PACKAGED WHITE LIGHT EMITTING DEVICES COMPRISING PHOTOLUMINESCENCE LAYERED STRUCTURE

(71) Applicant: Intematix Corporation, Fremont, CA (US)

(72) Inventors: Jun-Gang Zhou, Fremont, CA (US); Gang Wang, Sunnyvale, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 17/379,272

(22) Filed: Jul. 19, 2021

(65) Prior Publication Data

US 2021/0408342 A1    Dec. 30, 2021

Related U.S. Application Data

(63) Continuation-in-part of application No. PCT/US2020/023095, filed on Mar. 17, 2020.
(Continued)

(51) Int. Cl.
*H01L 33/50* (2010.01)
*C09K 11/61* (2006.01)
(Continued)

(52) U.S. Cl.
CPC .......... *H01L 33/502* (2013.01); *C09K 11/616* (2013.01); *C09K 11/665* (2013.01);
(Continued)

(58) Field of Classification Search
CPC ... H01L 33/502; H01L 25/0753; H01L 33/06; C09K 11/616; C09K 11/665
See application file for complete search history.

(56) References Cited

U.S. PATENT DOCUMENTS 8,529,791 B2   9/2013  Wu et al.
8,597,545 B1   12/2013 Liu et al.
(Continued)

FOREIGN PATENT DOCUMENTS

CN   1719633 A   1/2006
CN   1818012 A   8/2006
(Continued)

OTHER PUBLICATIONS

U.S. Appl. No. 15/282,551, filed May 25, 2017, Zhu et al.
(Continued)

*Primary Examiner* — Jay C Chang
*Assistant Examiner* — Mikka Liu
(74) *Attorney, Agent, or Firm* — CrossPond Law

(57) ABSTRACT

A light emitting device includes a Chip Scale Packaged (CSP) LED, the CSP LED including an LED chip that generates blue excitation light; and a photoluminescence layer that covers a light emitting face of the LED chip, wherein the photoluminescence layer comprises from 75 wt % to 100 wt % of a manganese-activated fluoride photoluminescence material of the total photoluminescence material content of the layer. The device/CSP LED can further include a further photoluminescence layer that covers the first photoluminescence and that includes a photoluminescence material that generates light with a peak emission wavelength from 500 nm to 650 nm.

16 Claims, 33 Drawing Sheets

Related U.S. Application Data

(60) Provisional application No. 62/820,249, filed on Mar. 18, 2019, provisional application No. 62/886,317, filed on Aug. 13, 2019.

(51) Int. Cl.
  *C09K 11/66* (2006.01)
  *H01L 25/075* (2006.01)
  *H01L 33/60* (2010.01)
  *C09K 11/77* (2006.01)

(52) U.S. Cl.
  CPC .... *C09K 11/7774* (2013.01); *C09K 11/77348* (2021.01); *H01L 25/0753* (2013.01); *H01L 33/60* (2013.01); *H01L 2933/0041* (2013.01); *H01L 2933/0058* (2013.01)

(56) References Cited

U.S. PATENT DOCUMENTS

| | | | |
|---|---|---|---|
| 8,614,539 B2 | 12/2013 | Dai et al. | |
| 8,663,502 B2 | 3/2014 | Tao | |
| 8,890,403 B2 | 11/2014 | Sakuta et al. | |
| 8,957,585 B2 | 2/2015 | Li et al. | |
| 9,261,242 B2 | 2/2016 | Ge et al. | |
| 9,752,734 B2 | 9/2017 | Tanda et al. | |
| 9,967,943 B1 | 5/2018 | Wang et al. | |
| 10,026,874 B1 | 7/2018 | Li et al. | |
| 10,468,564 B1 | 11/2019 | Zhao et al. | |
| 10,495,263 B2 | 12/2019 | Chowdhury et al. | |
| 10,535,805 B2 | 1/2020 | Li et al. | |
| 10,568,172 B2 | 2/2020 | Li et al. | |
| 2004/0124758 A1 | 7/2004 | Danielson et al. | |
| 2007/0108888 A1 | 5/2007 | Chen et al. | |
| 2007/0125984 A1 | 6/2007 | Tian et al. | |
| 2010/0013373 A1 | 1/2010 | Hata et al. | |
| 2010/0142189 A1 | 6/2010 | Hong et al. | |
| 2010/0163892 A1 | 7/2010 | Liu | |
| 2010/0289044 A1 | 11/2010 | Krames et al. | |
| 2011/0001157 A1 | 1/2011 | McKenzie et al. | |
| 2011/0068354 A1 | 3/2011 | Tran et al. | |
| 2011/0227469 A1 | 9/2011 | Yuan et al. | |
| 2012/0032219 A1 | 2/2012 | Ooyabu et al. | |
| 2012/0217862 A1 | 8/2012 | Matsuda et al. | |
| 2012/0275157 A1 | 11/2012 | Hsu | |
| 2012/0306340 A1 | 12/2012 | Hoetzl et al. | |
| 2013/0069089 A1 | 3/2013 | Hussell et al. | |
| 2013/0320363 A1 | 12/2013 | Pan et al. | |
| 2014/0103373 A1 | 4/2014 | Li et al. | |
| 2014/0167601 A1 | 6/2014 | Harry et al. | |
| 2014/0231857 A1 | 8/2014 | Nammalwar et al. | |
| 2014/0353704 A1 | 12/2014 | Kamikawa | |
| 2015/0008835 A1* | 1/2015 | Sugiura | H05B 45/44 315/192 |
| 2015/0035430 A1 | 2/2015 | Yoshida et al. | |
| 2015/0069442 A1 | 3/2015 | Liu et al. | |
| 2015/0270449 A1* | 9/2015 | Park | H01L 33/504 257/98 |
| 2015/0280080 A1 | 10/2015 | Wada et al. | |
| 2015/0329770 A1 | 11/2015 | Kaneyoshi et al. | |
| 2015/0357528 A1 | 12/2015 | Tsumori et al. | |
| 2015/0364659 A1* | 12/2015 | Setlur | H01L 33/504 257/98 |
| 2016/0097495 A1 | 4/2016 | Yamamoto et al. | |
| 2016/0116124 A1 | 4/2016 | Podowitz et al. | |
| 2016/0161067 A1* | 6/2016 | Oepts | F21V 9/32 362/84 |
| 2016/0202555 A1 | 7/2016 | Tanaka | |
| 2016/0233387 A1 | 8/2016 | Kitano et al. | |
| 2016/0233393 A1 | 8/2016 | Okuno et al. | |
| 2016/0254416 A1 | 9/2016 | Cheng | |
| 2016/0351757 A1 | 12/2016 | Yoshimura et al. | |
| 2016/0372638 A1 | 12/2016 | Todorov et al. | |
| 2017/0125650 A1 | 5/2017 | Pickett et al. | |
| 2017/0145310 A1 | 5/2017 | Li et al. | |
| 2017/0283695 A1 | 10/2017 | Yoshida et al. | |
| 2018/0040786 A1 | 2/2018 | Chen | |
| 2018/0204984 A1 | 7/2018 | Li et al. | |
| 2018/0212128 A1* | 7/2018 | Hayashi | H01L 33/507 |
| 2018/0226549 A1 | 8/2018 | Nakabayashi et al. | |
| 2018/0287019 A1 | 10/2018 | Hashimoto et al. | |
| 2018/0315899 A1 | 11/2018 | Li et al. | |
| 2018/0328543 A1 | 11/2018 | Bergmann et al. | |
| 2019/0139943 A1 | 5/2019 | Tiwari et al. | |
| 2019/0194537 A1 | 6/2019 | Sekiguchi et al. | |
| 2019/0198719 A1 | 6/2019 | Fujioka et al. | |
| 2019/0198722 A1 | 6/2019 | Nakabayashi et al. | |
| 2020/0056747 A1 | 2/2020 | Jiang et al. | |
| 2020/0058835 A1 | 2/2020 | Rintamaki et al. | |
| 2020/0066949 A1 | 2/2020 | Jiang et al. | |
| 2020/0088355 A1 | 3/2020 | Dutta et al. | |
| 2020/0176646 A1 | 6/2020 | Li et al. | |
| 2020/0287102 A1 | 9/2020 | Bertram et al. | |

FOREIGN PATENT DOCUMENTS

| | | |
|---|---|---|
| CN | 103547858 A | 1/2014 |
| CN | 102439682 B | 3/2016 |
| CN | 103717701 B | 8/2016 |
| CN | 207350041 U | 5/2018 |
| CN | 207906894 U | 9/2018 |
| CN | 208871526 U | 5/2019 |
| CN | 209196573 U | 8/2019 |
| CN | 110234926 A | 9/2019 |
| CN | 110388612 A | 10/2019 |
| CN | 209558063 U | 10/2019 |
| DE | 102016105211 A1 | 9/2017 |
| EP | 2747157 B1 | 3/2016 |
| EP | 3226313 A1 | 10/2017 |
| EP | 3279952 A1 | 2/2018 |
| EP | 3568630 A1 | 11/2019 |
| EP | 2629341 | 4/2020 |
| KR | 101683270 B1 | 12/2016 |
| WO | 2010053341 A1 | 5/2010 |
| WO | 2011138707 A1 | 11/2011 |
| WO | 2017044380 A1 | 3/2017 |
| WO | 2017062314 A1 | 4/2017 |
| WO | 2018132778 A1 | 7/2018 |
| WO | 2019005597 A1 | 1/2019 |
| WO | 2019118959 A1 | 6/2019 |
| WO | 2020015420 A1 | 1/2020 |
| WO | PCTUS2023095 | 3/2020 |

OTHER PUBLICATIONS

U.S. Appl. No. 16/669,449, filed Oct. 30, 2019, Gang Wang.
Office Action dated Mar. 18, 2020; CN app. No. 201880007010.4.
European Search Opinion, dated Jul. 2020, EP18738546.
International Search Report.
International Search Report, PCT/US2020/023095.
International Search Report, PCT/US2020/023110.
International Search Report, PCT/US2020/023187.
IPRP, Jul. 2020; PCT/US18/65952.
Supplementary European Search Report, dated Jul. 2020, EP18738546.
Written Opinion of the International Search Authority.
Written Opinion of the International Search Authority, PCT/US2020/023095.
Written Opinion of the International Search Authority, PCT/US2020/023187.
Written Opinion of the ISA.
Written Opinion of the ISA, PCT/US2020/023110.

* cited by examiner

SECTION A-A

PACKAGED WHITE LIGHT EMITTING DEVICES COMPRISING PHOTOLUMINESCENCE LAYERED STRUCTURE

CROSS REFERENCE TO RELATED APPLICATIONS

This application claims the benefit of priority to international PCT application No. PCT/US2020/023095, filed Mar. 17, 2020, of which this application is a bypass continuation-in-part, which in turn claims the benefit of priority to (i) U.S. provisional application No. 62/820,249, filed Mar. 18, 2019, entitled "PHOTOLUMINESCENCE LAYER LIGHT EMITTING DEVICE" and (ii) U.S. provisional application No. 62/886,317, filed Aug. 13, 2019, entitled "PACKAGED WHITE LIGHT EMITTING DEVICES COMPRISING PHOTOLUMINESCENCE LAYERED STRUCTURE", each of which are hereby incorporated by reference in their entirety.

FIELD OF THE INVENTION

Embodiments of the present invention are directed to packaged white light emitting devices comprising photoluminescence material layers and embodiments concerning packaged light emitting devices including manganese-activated fluoride photoluminescence materials. More particularly, although not exclusively, embodiments of the present invention are directed to packaged white light emitting devices that utilize Chip Scale Packaged (CSP) LEDs.

BACKGROUND OF THE INVENTION

Photoluminescence wavelength converted light emitting LEDs ("LEDs") include one or more photoluminescence materials (typically inorganic phosphor materials), which absorb a portion of the excitation light (typically blue) emitted by the LED and re-emit light of a different color (wavelength). Manganese-activated fluoride phosphors such as $K_2SiF_6:Mn^{4+}$ (KSF), $K_2TiF_6:Mn^{4+}$ (KTF), and $K_2GeF_6:Mn^{4+}$ (KGF) have a very narrow red spectrum (Full Width Half Maximum of less than 10 nm for their main emission line spectrum) which makes them highly desirable for attaining high color gamut (NTSC, DCI-P3, Rec2020) in display applications and for attaining a high General Color Rendering Index (CRI Ra) in general lighting applications.

FIG. 1 is a sectional view of a known packaged white light emitting device that utilizes a manganese-activated fluoride phosphor material. Referring to FIG. 1, the packaged light emitting device 10 comprises a package 12 having a cavity 14 that contains at least one LED die (chip) 16. The cavity 14 is filled with a transparent optical encapsulant 18 having a mixture of a manganese-activated fluoride phosphor and yellow to green light emitting phosphor such as a garnet based phosphor material incorporated (dispersed) in the encapsulant.

While manganese-activated fluoride photoluminescence materials are highly desirable for the above reasons, there are several drawbacks that make their widespread use challenging. First, the absorption capability of manganese-activated fluoride phosphors is substantially lower (typically about a tenth) than that of europium-activated red nitride phosphor materials (such as CASN) that are currently commonly used in photoluminescence wavelength converted LEDs. Therefore, depending on the application, in order to achieve the same target color point, the usage amount of manganese-activated fluoride phosphors typically can be from 5 to 20 times greater than the usage amount of a corresponding europium-activated red nitride phosphor. The increased amount of phosphor usage significantly increases the cost of manufacture since manganese-activated fluoride phosphors are significantly more expensive than europium-activated red nitride phosphors (at least five times more expensive). As a result of the higher usage and higher cost, use of manganese-activated fluoride red phosphors can be prohibitively expensive for many applications. Moreover, since a very high photoluminescence material loading in silicone is required to achieve the desired color point this can reduce the stability of the dispensing process making it difficult to reliably dispense in packaged devices.

Another problem with fluoride-based phosphor materials is that they readily react with water or moisture which causes damage to the dopant manganese which leads to a reduction or loss of their photoluminescence emission (i.e. quantum efficiency) of the phosphor. Moreover, the reaction of the fluoride-based compound with water can generate very corrosive hydrofluoric acid that can react with LED packaging material thereby leading to component failure.

The present invention intends to address and/or overcome the limitations discussed above by presenting new designs and methods not hitherto contemplated nor possible by known constructions. More particularly, there is a need for a cost-effective light emitting device that utilizes less manganese-activated fluoride photoluminescence material, enables a more stable dispensing process during manufacture, and possesses an optimized LED packaging design that may effectively isolate the fluoride-based photoluminescence material from metal wires, electrodes, lead frame materials, and any water/moisture in the surrounding environment.

SUMMARY OF THE INVENTION

Embodiments of the invention relate to packaged white light emitting devices comprising a photoluminescence material layered structure. More particularly, embodiments concern a white light emitting package comprising a first photoluminescence layer disposed adjacent to the solid-state excitation source (LED) which, in terms of a total photoluminescence material content within the layer, contains a majority wt % of manganese-activated fluoride photoluminescence material (phosphor), for example 75 wt % to 100 wt %. The devices further comprise a second photoluminescence layer disposed on the first photoluminescence layer containing photoluminescence material that generate light in the green to red region (500 nm to 650 nm) part of the visible spectrum. The inventors have discovered that by locating the manganese-activated fluoride photoluminescence material in an "individual layer" separate from the other photoluminescence materials, the amount of manganese-activated fluoride photoluminescence material required to achieve a given color target can be reduced by as much as 60%. In this patent specification, a packaged light emitting device is used to specify that the photoluminescence material layered structure constitutes a part of the light emitting device package. This is to be contrasted with remote phosphor (photoluminescence) devices in which a phosphor component is provided "remotely" to the excitation source, that is, in a physically spaced relationship and separated by an air gap.

According to an aspect of the invention, there is provided a white light emitting package comprising: a solid-state excitation source for generating excitation light with a dominant wavelength in a range 440 nm to 470 nm; and a layered photoluminescence structure comprising: a first photoluminescence layer comprising from 75 wt % to 100 wt % a manganese-activated fluoride photoluminescence material of a total photoluminescence material content of the first photoluminescence layer, and a second photoluminescence layer comprising photoluminescence material for generating light with a peak emission wavelength in a range from 500 nm to 650 nm; wherein the second photoluminescence layer is disposed on the first photoluminescence layer, and wherein the first photoluminescence layer is disposed adjacent to the solid-state excitation source. It may be understood that the first photoluminescence layer is in closer proximity to the solid-state excitation source than the second photoluminescence layer. It may be understood that "closer proximity" is used to define the spatial relationship of the first and second photoluminescence layers relative to the excitation source and is used to specify that the first photoluminescence layer is proximal (i.e. a proximal layer) to the excitation source, while the second photoluminescence layer is distal (i.e. a distal layer) to the excitation source. Moreover, "closer proximity" means that there are no other photoluminescence materials in the light path between the solid-state excitation source and the first photoluminescence layer, though there may be light transmissive layers or light transmissive layers containing materials other than photoluminescence materials, for example light diffusive/scattering materials. Light emitting devices in accordance with the invention provide an effective solution to address the high usage of manganese-activated fluoride photoluminescence materials in packaged light emitting devices. Providing the manganese-activated fluoride photoluminescence material as a respective layer, that in terms of a total photoluminescence content of the layer, the layer contains a majority (at least 75 wt % of the total photoluminescence material content of the layer) up to exclusively consisting of (100 wt %) manganese-activated fluoride photoluminescence material, is found to significantly reduce the usage amount of the manganese-activated fluoride photoluminescence material within the device (a reduction of from about 25% to 60%).

Comparing with known constructions (FIG. 1), a conventional white light emitting device comprises a single photoluminescence layer comprising a mixture of a manganese-activated fluoride photoluminescence material and other (non-fluoride) photoluminescence materials (for example, a green phosphor material, typically a garnet based phosphor material or a red nitride-based phosphor such as CASN). In such an arrangement the manganese-activated fluoride photoluminescence material and other photoluminescence material(s) have equal exposure to excitation light, for example blue excitation light. Since manganese-activated fluoride photoluminescence materials have a much lower blue light absorption capability than other photoluminescence materials (for example, green/yellow garnet-based phosphors or red nitride phosphors), a greater amount of manganese-activated fluoride photoluminescence material is necessary to convert enough blue light to the required red emission. By contrast, in the structure according to the invention, the manganese-activated fluoride photoluminescence material in its separate respective layer is exposed to blue excitation light individually (that is it is not competing with other photoluminescence materials); thus, more of the blue excitation light can be absorbed by the manganese-activated fluoride photoluminescence material and unconverted blue excitation light can penetrate through to the second photoluminescence layer containing the other photoluminescence materials. Advantageously, in this structure/light emitting device, the manganese-activated fluoride photoluminescence material can more effectively convert the blue excitation light to red emission without competition from other photoluminescence materials such as green/yellow or orange to red emitting photoluminescence materials for example. Therefore, the amount (usage) of a manganese-activated fluoride photoluminescence material required to achieve a target color point can be significantly reduced, up to 80%, compared with known arrangements of a single-layer comprising a mixture of photoluminescence materials. Therefore, a major benefit of the white light emitting devices of the invention is a substantial reduction in manufacturing cost of the device (i.e. package) as significantly less manganese-activated fluoride photoluminescence material is required to attain a desired color point of generated light.

A further advantage of light emitting devices in accordance with the invention is that the provision of a second photoluminescence layer disposed over the first photoluminescence layer is able to protect and isolate the manganese-activated fluoride photoluminescence material in the first layer from direct contact with any water/moisture in the surrounding environment. Such a multi-layer or two-layer photoluminescence layered structure provides an effective solution to address the poor moisture reliability of manganese-activated fluoride photoluminescence materials, as discussed above. Thus, the inclusion of a second photoluminescence layer provides the benefit of improved moisture reliability to the light emitting device (i.e. LED package). It may be that the second photoluminescence material layer is in direct contact with the first photoluminescence layer. Direct contact improves the ability of the light to traverse the interface between the first and second photoluminescence layers due to the elimination of an air interface.

Embodiments of the invention find particular utility to CSP (Chip Scale Packaged) LEDs. In this specification, a CSP LED is an LED flip chip (die) having one or more photoluminescence layers that cover one or more of its light emitting faces (e.g. top and/or side light emitting faces). As is known, an LED flip chip die has electrodes on its base and a top light emitting face that is free of electrodes, bond wires or other packaging materials. Preferably, the photoluminescence layer(s) comprising the manganese-activated fluoride photoluminescence material is of a substantially uniform thickness and may be applied to the face(s) of the LED chip using, for example, an optical coupling layer. In the case where the manganese-activated fluoride photoluminescence material layer is deposited on only a top light emitting face of the flip chip, the manganese-activated fluoride photoluminescence material is prevented from contacting metal electrodes or bonding wire and packaging materials which might otherwise react with the manganese-activated fluoride photoluminescence material.

According to a first aspect of the invention, a light emitting device comprises: a Chip Scale Packaged (CSP) LED, said CSP LED comprising: an LED chip that generates blue excitation light; and a photoluminescence layer that covers a light emitting face of the LED chip, wherein the photoluminescence layer comprises from 75 wt % to 100 wt % of a manganese-activated fluoride photoluminescence material of the total photoluminescence material content of the layer. The photoluminescence layer can comprise a substantially uniform thickness layer such as a film comprising the manganese-activated fluoride photoluminescence material. The photoluminescence film can be manufactured by, for example, extrusion, slot die coating or screen printing and the film then applied to at least the principle (top) light emitting face of the LED chip using, for example, a light transmissive medium such a silicone material. The photoluminescence layer comprising the manganese-activated fluoride photoluminescence material may have a thickness from 20 µm to 300 µm.

The device or CSP LED may comprise a further photoluminescence layer comprising photoluminescence material that generates light with a peak emission wavelength from 500 nm to 650 nm wherein the further photoluminescence layer covers the photoluminescence layer comprising the manganese-activated fluoride photoluminescence material. In embodiments where the further photoluminescence layer constitutes part of the device, the further photoluminescence layer can be constituted by substantially covering (or completely covering) the CSP LED with the further photoluminescence material by, for example, filling a cavity in which the CSP is mounted. In such embodiments, the further photoluminescence layer may not be of uniform thickness. A benefit of providing the further photoluminescence layer as part of the device is that since the further photoluminescence layer will have a greater volume this can make it is easier to adjust the color temperature of light generated by the device and easier to achieve a given color temperature. Moreover, such arrangements allow the same CSP LED to be used to manufacture devices that generate different color temperatures by changing the composition of the further photoluminescence layer. In embodiments where the further photoluminescence layer constitutes a part of the CSP LED, the further photoluminescence layer may be directly applied to the photoluminescence layer comprising the manganese-activated fluoride photoluminescence material. In such embodiments, the further photoluminescence layer may be of substantially uniform thickness. Such arrangements may have a fixed color temperature.

In some embodiments, the photoluminescence layer substantially covers only a top light emitting face of the LED chip and a light reflective material substantially covers the light emitting side faces of the LED chip. The light reflective material can comprise a white material. Like the further photoluminescence material, the light reflective material may comprise a part of the device or CSP LED. In embodiments where the light reflective material constitutes part of the device, the light reflective material can be constituted by a layer of light reflective material that substantially covers the side faces of the LED chip without covering the photoluminescence layer by, for example, partially filling a cavity in which the CSP LED(s) are mounted with the light transmissive material. In embodiments where the light reflective material constitutes a part of the CSP LED, the light reflective material may be directly applied to the side light emitting faces of the LED chip.

The light reflective material layer ensures that all blue light generated by light emitting side faces of the LED chip passes into the photoluminescence layer comprising a manganese-activated fluoride photoluminescence material. This can be of particular benefit for devices that are configured to generate lower CCT (warm light) light, for example up to 3000K, which require a greater proportion of red light to achieve the desired color temperature. In this way, the inclusion of a light reflective material that substantially covers the light emitting side faces of the LED chip can lessen a need of having to include more manganese-activated fluoride photoluminescence material in the photoluminescence layer to compensate for a "dilution" effect by cooler white created by the emission of blue light from the light emitting side faces of the LED chip. That is, the blue light emission from the light emitting side faces of the LED chip can necessitate more manganese-activated fluoride photoluminescence material usage in the photoluminescence layer to generate the desired lower CCT (warm light) light, for example up to 3000K. A desired warmer color temperature can thus be attained without using more manganese-activated fluoride photoluminescence material in the photoluminescence layer due to the inclusion of a light reflective material that substantially covers the light emitting side faces of the LED chip. Since manganese-activated fluoride photoluminescence material is significantly more expensive than other types of photoluminescence materials (for example, green/yellow garnet-based phosphors), reducing the amount of manganese-activated fluoride photoluminescence material to attain a desired color temperature (warm) by using a relatively inexpensive light reflective material in this way provides a significant cost saving and makes the invention more cost effective and economical to manufacture the light emitting device.

A further benefit of having a light reflective material layer that at least substantially covers the light emitting side faces of the LED chip is that this may lead to a more uniform color and uniform color over angle of emitted light.

The device or CSP LED can comprise a light transmissive material (layer) disposed between the light emitting side faces of the LED chip and the light reflective material. The inclusion of such a light transmissive material layer can increase the amount of blue light generated by the light emitting side faces of the LED chip that reaches the photoluminescence layer. In such arrangements the photoluminescence layer is preferably oversized such that it extends out from (project out from) the periphery of the top light emitting face and covers at least the light transmissive material. Typically, the light transmissive material can constitute a part of the CSP and can be formed, for example, by bonding the top light emitting face of the LED chip to the photoluminescence layer using a curable light transmissive liquid (such as silicone) and selecting the quantity of light transmissive liquid such that the liquid forms a meniscus that extends up the light emitting side faces of the LED chip.

The device or CSP LED may comprise a further photoluminescence layer comprising photoluminescence material that generates light with a peak emission wavelength from 500 nm to 650 nm wherein the further photoluminescence layer covers the photoluminescence layer comprising the manganese-activated fluoride photoluminescence material. As described herein, where the further photoluminescence layer constitutes part of the device, the further photoluminescence layer can be constituted by completely covering the CSP LED with the further photoluminescence material by for example filling a cavity in which the CSP is mounted. In such arrangements, the further photoluminescence layer may not be of uniform thickness. A benefit of providing the further photoluminescence layer as part of the device is that since the layer has a greater volume this can make it is easier to adjust the color temperature of light generated by the device and easier to achieve a given color temperature. Moreover, such arrangements allow the same CSP LED to be used to manufacture devices that generate different color temperatures by changing the composition of the further photoluminescence layer. Where the further photoluminescence layer constitutes a part of the CSP LED the further photoluminescence layer may be directly applied to the photoluminescence layer comprising the manganese-activated fluoride photoluminescence material. In such embodiments, the further photoluminescence layer may be of substantially uniform thickness. Such arrangements may have a fixed color temperature.

In some embodiments, the photoluminescence layer comprising the manganese-activated fluoride photoluminescence material covers all light emitting faces of the LED chip. In such embodiments, the photoluminescence layer can comprise a substantially uniform thickness photoluminescence layer such as a film. The photoluminescence layer/film may comprise a substantially conformal coating layer. The device or CSP LED may comprise a further photoluminescence layer comprising photoluminescence material that generates light with a peak emission wavelength from 500 nm to 650 nm wherein the further photoluminescence layer covers the photoluminescence layer comprising the manganese-activated fluoride photoluminescence material. As described herein, where the further photoluminescence layer constitutes part of the device, the further photoluminescence layer can be constituted by completely covering the CSP LED with the further photoluminescence material by, for example, filling a cavity in which the CSP is mounted. In such embodiments, the further photoluminescence layer may not be of uniform thickness. A benefit of providing the further photoluminescence layer as part of the device is that since the layer has a greater volume this can make it is easier to adjust the color temperature of light generated by the device and easier to achieve a given color temperature. Moreover, such arrangements allow the same CSP LED to be used to manufacture devices that generate different color temperatures by changing the composition of the further photoluminescence layer. In embodiments where the further photoluminescence layer constitutes a part of the CSP LED the further photoluminescence layer may be directly applied to the photoluminescence layer comprising the manganese-activated fluoride photoluminescence material. In such embodiments the further photoluminescence layer may be of substantially uniform thickness and may comprise a substantially conformal coating layer.

In various embodiments, the photoluminescence layer comprising the manganese-activated fluoride photoluminescence material comprises from 95 wt % to 100 wt % manganese-activated fluoride photoluminescence material of the total photoluminescence material content of the photoluminescence layer.

The manganese-activated fluoride photoluminescence material layer can comprise at least one of: $K_2SiF_6:Mn^{4+}$, $K_2TiF_6:Mn^{4+}$, and $K_2GeF_6:Mn^{4+}$.

The manganese-activated fluoride photoluminescence material may comprise less than 45 wt % of a total photoluminescence material content of the device.

According to a second aspect, a white light emitting device comprises: a Chip Scale Packaged (CSP) LED, said CSP LED comprising: an LED chip that generates blue excitation light; a first photoluminescence layer that covers a light emitting face of the LED chip; and a second photoluminescence layer that covers the first photoluminescence layer; wherein the first photoluminescence layer comprises from 75 wt % to 100 wt % of a manganese-activated fluoride photoluminescence material of the total photoluminescence material content of the first photoluminescence layer; and wherein the second photoluminescence layer comprises a photoluminescence material that generates light with a peak emission wavelength from 500 nm to 650 nm.

One or both of the first and second photoluminescence layers can have a uniform thickness comprise a substantially conformal coating layer.

One or both of the first and second photoluminescence layers may have a thickness from 20 μm to 300 μm.

The first photoluminescence layer may comprise from 95 wt % to 100 wt % manganese-activated fluoride photoluminescence material of the total photoluminescence material content of the first photoluminescence layer.

The manganese-activated fluoride photoluminescence material layer can comprise at least one of: $K_2SiF_6:Mn^{4+}$, $K_2TiF_6:Mn^{4+}$, and $K_2GeF_6:Mn^{4+}$.

The manganese-activated fluoride photoluminescence material may comprise less than 45 wt % of a total photoluminescence material content of the device. In embodiments, the photoluminescence material in the second photoluminescence layer comprises a green to yellow photoluminescence material that generates light with a peak emission wavelength in a range from 500 nm to 565 nm and/or an orange to red photoluminescence material that generates light with a peak emission wavelength in a range from 580 nm to 650 nm.

According to an aspect, there is provided a Chip On Board (COB) white light emitting device comprises: a substrate; an array of CSP LEDs mounted on the substrate; and a further photoluminescence layer that covers the plurality of CSP LEDs, said further photoluminescence layer comprising photoluminescence material that generates light with a peak emission wavelength from 500 nm to 650 nm; and wherein the CSP LED comprises: an LED chip that generates blue excitation light; and a photoluminescence layer that covers a light emitting face of the LED chip, wherein the photoluminescence layer comprises from 75 wt % to 100 wt % of a manganese-activated fluoride photoluminescence material of the total photoluminescence material content of the layer.

According to an aspect, there is contemplated a Chip On Board (COB) white light emitting device comprises: a substrate; an array of CSP LEDs mounted on the substrate; and a further photoluminescence layer that covers the plurality of CSP LEDs, said further photoluminescence layer comprising photoluminescence material that generates light with a peak emission wavelength from 500 nm to 650 nm, wherein the CSP LED comprises: an LED chip that generates blue excitation light; a photoluminescence layer that covers a top light emitting face of the LED chip; and a light reflective material that covers the light emitting side faces of the LED chip, wherein the photoluminescence layer comprises from 75 wt % to 100 wt % of a manganese-activated fluoride photoluminescence material of the total photoluminescence material content of the layer.

According to an aspect, there is envisaged a Chip On Board (COB) white light emitting device comprises: a substrate; an array of CSP LEDs mounted on the substrate; and a further photoluminescence layer that covers the array of CSP LEDs, said further photoluminescence layer comprising photoluminescence material that generates light with a peak emission wavelength from 500 nm to 650 nm, wherein the CSP LED comprises: an LED chip that generates blue excitation light; and a photoluminescence layer that covers all light emitting faces of the LED chip, wherein the photoluminescence layer comprises from 75 wt % to 100 wt % of a manganese-activated fluoride photoluminescence material of the total photoluminescence material content of the layer.

Various embodiments of the invention also find utility in color temperature tunable white light emitting devices.

According to an aspect, the present invention encompasses a color tunable Chip On Board (COB) white light emitting device comprises: a substrate; a first array of CSP LEDs mounted on the substrate; a second array of blue LED chips that generate blue excitation light; and a further photoluminescence layer that covers the first array of CSP LEDs and the second array of blue LED chips, said further photoluminescence layer comprising photoluminescence material that generates light with a peak emission wavelength from 500 nm to 650 nm; and wherein the CSP LEDs comprise: an LED chip that generates blue excitation light; and a photoluminescence layer that covers a light emitting face of the LED chip, wherein the photoluminescence layer comprises from 75 wt % to 100 wt % of a manganese-activated fluoride photoluminescence material of the total photoluminescence material content of the layer.

According to an aspect, there is provided a color tunable Chip On Board (COB) white light emitting device comprises: a substrate; a first array of CSP LEDs mounted on the substrate; a second array of blue LED chips that generate blue excitation light; and a further photoluminescence layer that covers the first array of CSP LEDs and the second array of blue LED chips, said further photoluminescence layer comprising photoluminescence material that generates light with a peak emission wavelength from 500 nm to 650 nm; and wherein the CSP LED comprises: an LED chip that generates blue excitation light; a photoluminescence layer that covers a top light emitting face of the LED chip; and a light reflective material that covers the light emitting side faces of the LED chip, wherein the photoluminescence layer comprises from 75 wt % to 100 wt % of a manganese-activated fluoride photoluminescence material of the total photoluminescence material content of the layer.

According to an aspect, the present invention envisages a color tunable Chip On Board (COB) white light emitting device comprises: a substrate; a first array of CSP LEDs mounted on the substrate; a second array of blue LED chips that generate blue excitation light; and a further photoluminescence layer that covers the first array of CSP LEDs and the second array of blue LED chips, said further photoluminescence layer comprising photoluminescence material that generates light with a peak emission wavelength from 500 nm to 650 nm; and wherein the CSP LEDs comprise: an LED chip that generates blue excitation light; and a photoluminescence layer that covers all light emitting faces of the LED chip, wherein the photoluminescence layer comprises from 75 wt % to 100 wt % of a manganese-activated fluoride photoluminescence material of the total photoluminescence material content of the layer.

According to an aspect, the present invention encompasses a color tunable Chip On Board (COB) white light emitting device comprises: a substrate; a first array of CSP LEDs mounted on the substrate; and a second array of CSP LEDs mounted on the substrate; wherein CSP LEDs of the first array generate white light of a first color temperature and CSP LEDs of the second array generate white light of a second different color temperature; and wherein CSP LEDs of the first and second array each comprise: an LED chip that generates blue excitation light; a photoluminescence layer that covers a top light emitting face of the LED chip; a light reflective material that covers the light emitting side faces of the LED chip; and a further photoluminescence layer that covers the photoluminescence layer; wherein the photoluminescence layer comprises from 75 wt % to 100 wt % of a manganese-activated fluoride photoluminescence material of the total photoluminescence material content of the layer and wherein the further photoluminescence layer comprises photoluminescence material that generates light with a peak emission wavelength from 500 nm to 650 nm.

According to an aspect, the present invention contemplates a color tunable Chip On Board (COB) white light emitting device that comprises: a substrate; a first array of CSP LEDs mounted on the substrate; and a second array of CSP LEDs mounted on the substrate; wherein CSP LEDs of the first array generate white light of a first color temperature and CSP LEDs of the second array generate white light of a second different color temperature; and wherein CSP LEDs of the first and second array each comprise: an LED chip that generates blue excitation light; a photoluminescence layer that covers all light emitting faces of the LED chip; and a further photoluminescence layer that covers the photoluminescence layer; wherein the photoluminescence layer comprises from 75 wt % to 100 wt % of a manganese-activated fluoride photoluminescence material of the total photoluminescence material content of the layer and wherein the further photoluminescence layer comprises photoluminescence material that generates light with a peak emission wavelength from 500 nm to 650 nm.

In various aspects/embodiments of the invention, the photoluminescence material in the further photoluminescence layer can comprise a green to yellow photoluminescence material that generates light with a peak emission wavelength from 500 nm to 565 nm and/or an orange to red photoluminescence material that generates light with a peak emission wavelength from 580 nm to 650 nm.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
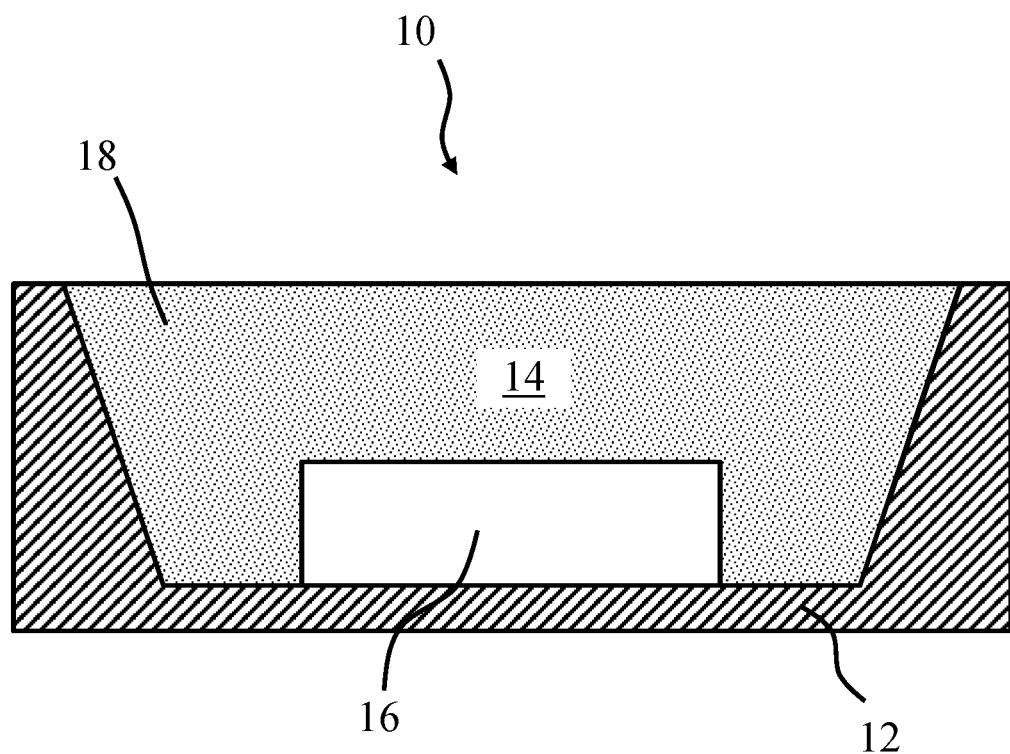
FIG. 1 is a sectional view of a known white light emitting device that utilizes manganese-activated fluoride photoluminescence materials.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Throughout this specification like reference numerals are used to denote like parts. For all figures other than FIG. 1, the reference numeral is preceded by the figure number. For example, an LED chip 30 is referred to as 230 in FIG. 2, 330 in FIG. 3 and so forth.

Packaged White Light Emitting Devices

A packaged white light emitting device 220 in accordance with an embodiment of the invention will now be described with reference to FIG. 2 which shows a sectional side view of the device 220.

The light emitting device 220 is a packaged-type device comprising, for example an SMD (Surface Mount Device) package such as an SMD 2835 LED package (lead frame) 222. The SMD package 222 comprises a rectangular base 224 and side walls 226A, 226B extending upwardly from opposing edges of the rectangular base 224. The interior surfaces of the side walls 226A, 226B slope inwardly to their vertical axis and together with the interior surface of the solid rectangular base 224 define a cavity 228 in the shape of an inverted frustum of a pyramid.

In this embodiment, the cavity 228 can comprise three InGaN (Indium Gallium Nitride) blue (455 nm) LED dies (solid-state excitation sources) 230, and a first photoluminescence layer 232 comprising a manganese-activated fluoride photoluminescence material filling approximately 70% of the cavity 228. The LED dies (chips) 230 can be serially connected and the rated driving condition is 100 mA, 9 V.

The first photoluminescence layer 232 contains a majority, at least 75 wt %, of manganese-activated fluoride photoluminescence material compared with other photoluminescence materials that may be in the layer. The first photoluminescence layer 232 may contain other materials such as light scattering particles or light diffusive material for example. More particularly, in this embodiment, the first photoluminescence layer 32 only contains $K_2SiF_6:Mn^{4+}$ (KSF), but not other types of photoluminescence materials. It will be appreciated, however, that other materials such as a light diffusive material can be added into the manganese-activated fluoride photoluminescence material layer 232, but the amount of the other materials is typically no more than 30% weight of the manganese-activated fluoride photoluminescence material layer 232. Further, in this embodiment, the first photoluminescence layer 232 is constituted by $K_2SiF_6:Mn^{4+}$ incorporated (dispersed) in dimethyl silicone. The first photoluminescence layer 232 is directly in contact with and adjacent the blue LED 230. There are no other photoluminescence materials or photoluminescence material containing layers between the first photoluminescence layer 232 and the blue LED dies 230.

Comparing with known constructions, as shown for example in FIG. 1, in a conventional single-layer light emitting device, the dispensing process during manufacture involves dispensing a mixture of a manganese-activated fluoride photoluminescence material and other photoluminescence material(s) (typically a green phosphor material) which have equal exposure to excitation light, for example blue excitation light. Since a manganese-activated fluoride photoluminescence material may have a much lower blue light absorption capability than other types of photoluminescence materials (for example, a green/yellow garnet-based phosphors), a greater amount of manganese-activated fluoride photoluminescence material is necessary to convert enough blue light to the required red emission. By contrast, in the light emitting device 220 according to the invention, the manganese-activated fluoride photoluminescence material in its separate individual layer 232 is exposed to blue excitation light individually; thus, more of the blue excitation light from the blue LED dies (chips) 230 can be absorbed by the manganese-activated fluoride photoluminescence material and the remaining blue excitation light can penetrate through to a second photoluminescence layer(s) 234 for instance. Advantageously, in this light emitting device 220, the first photoluminescence layer 232 can more effectively convert the blue excitation light to red emission without competition from other types of photoluminescence materials present in the second photoluminescence layer 234 for example. Therefore, the amount/usage of a manganese-activated fluoride photoluminescence material required to achieve a target color point can be significantly reduced compared with known arrangements of a single layer comprising a mixture of photoluminescence materials for instance. Therefore, a benefit of the photoluminescence light emitting device 220 of the invention is a reduction in the manufacturing cost of the device since less (up to 60% less) manganese-activated fluoride photoluminescence material is required to attain a desired color point compared with known single-layer devices.

In this embodiment, the cavity 228 also comprises a second photoluminescence layer 234 dispensed on top of the first photoluminescence layer 232 that fills the remaining 30% of the cavity 228. In this embodiment, the second photoluminescence material layer 234 comprises a cerium-activated yellow garnet phosphor having a general composition $Y_3(Al,Ga)_5O_{12}:Ce$. It will be appreciated that the second photoluminescence layer typically comprises green or yellow phosphors or other minority orange red phosphors that work in conjunction with the first photoluminescence layer to create the desired white point.

In this way, the light emitting device 220 effectively is able to isolate the manganese-activated fluoride photoluminescence material contained (incorporated (dispersed)) within the first photoluminescence layer 232 from direct contact with any water/moisture in the surrounding environment. Such a multi-layer or two-layer design of the light emitting device 220 provides an effective solution to address the poor moisture reliability of manganese-activated fluoride photoluminescence materials in known constructions. Thus, the inclusion of the second photoluminescence material layer 234 provides the benefit of improved moisture reliability to the light emitting device (i.e. LED package) 220.

The first photoluminescence layer 232 is adjacent (in closer proximity) to the blue LED 230 than any other photoluminescence material layer including the second photoluminescence material layer 234; that is the first photoluminescence layer 232 is adjacent (proximal—i.e. a proximal layer) to the blue LED 230, while the second photoluminescence material layer 234 is distal (i.e. a distal layer) to the blue LED 230.

Figure 2:
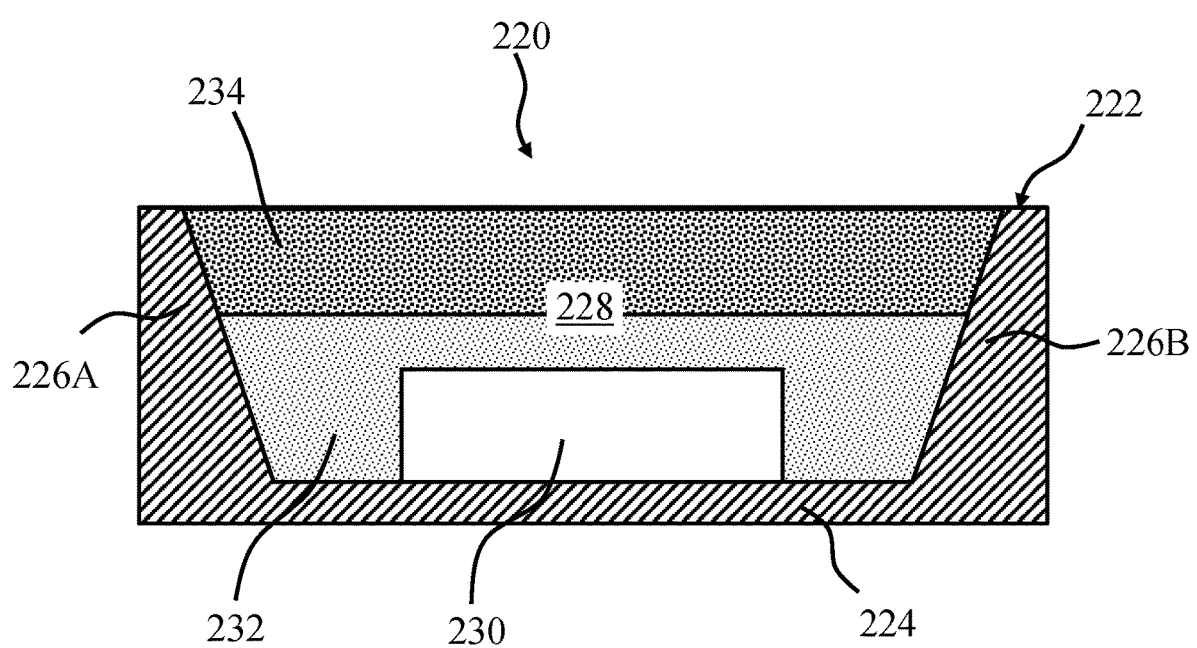
FIG. 2 is a sectional view of a packaged white light emitting device in accordance with an embodiment of the invention.
Figure 3:
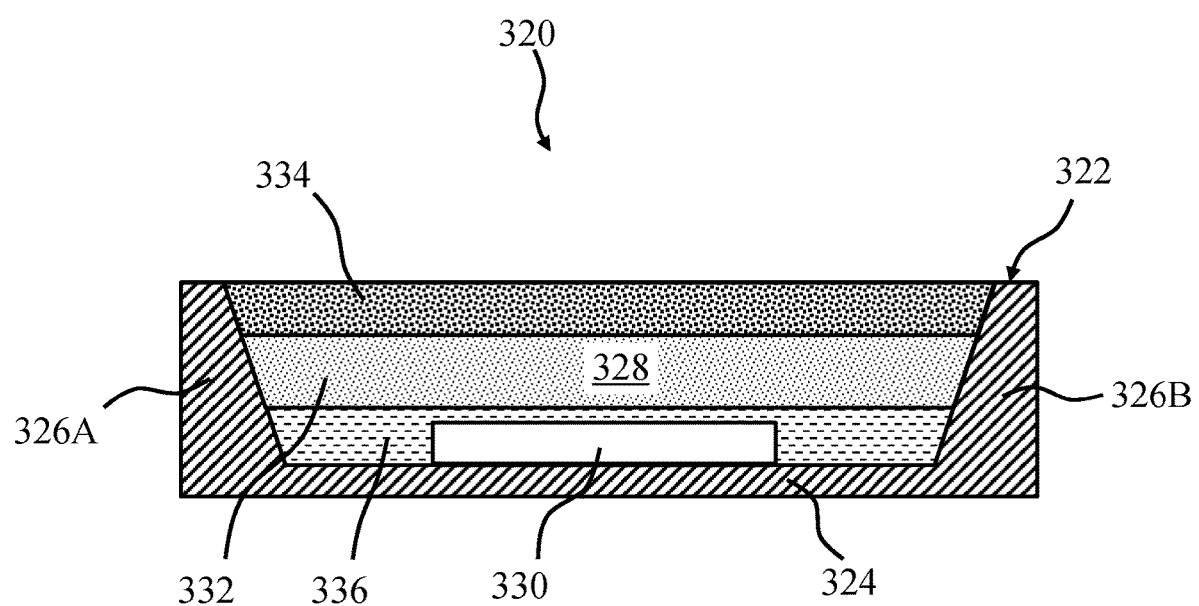
FIG. 3 is a sectional view of a light emitting device in accordance with an embodiment of the invention.

Referring now to FIG. 3, there is shown a packaged white light emitting device 320 (white light emitting device package) formed according to another embodiment of the invention. This embodiment differs from FIG. 2 only in that the light emitting device 320 further comprises a light transmissive (transparent) passivation layer 336 disposed on the blue LED die(s) 330 before the first photoluminescence layer 332. In order to fully protect the first photoluminescence layer 332 from water/moisture, the clear passivation layer 336 is applied over the floor of the cavity 328 and LED dies (chips) 330 as shown in FIG. 3. In this embodiment, the passivation layer 336 can be a layer of dimethyl silicone. This passivation layer 336 also serves to isolate the bottom electrode (not shown) and blue LED dies 330 from the first photoluminescence layer 332.

Figure 4:
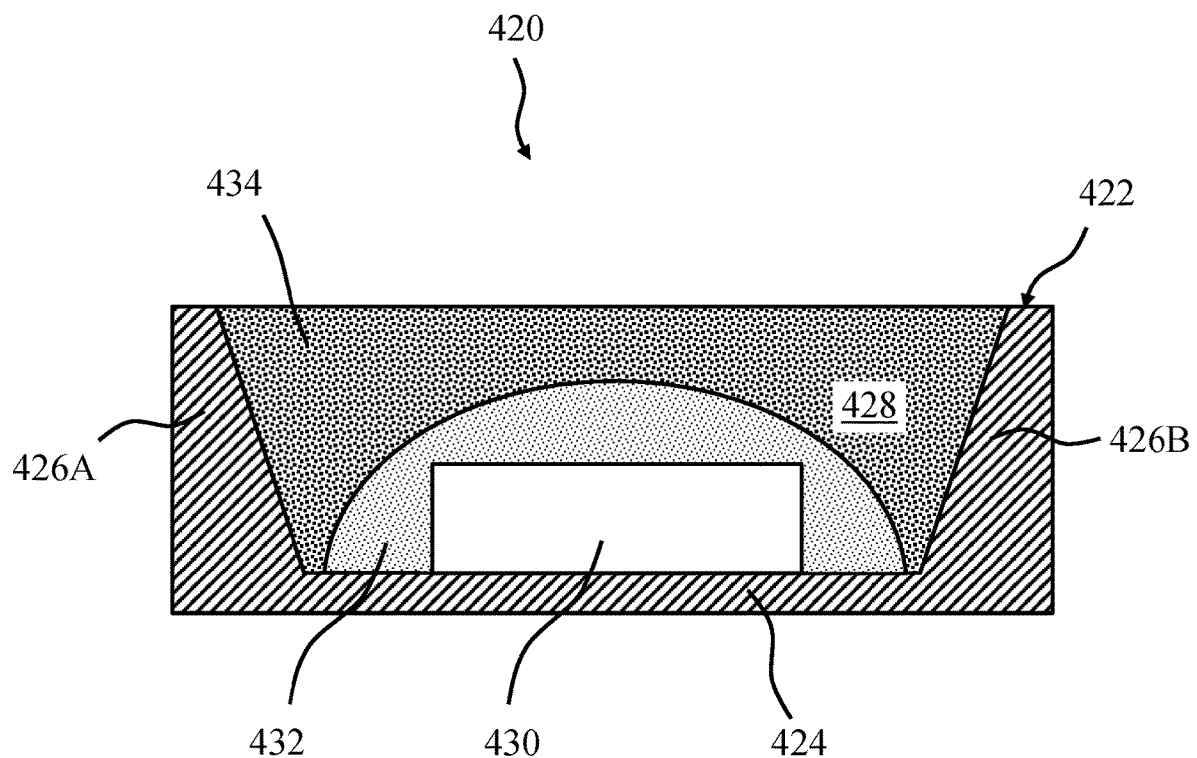
FIG. 4 is a sectional view of a light emitting device in accordance with an embodiment of the invention.

Referring to FIG. 4, there is shown a packaged white light emitting device 420 (white light emitting device package) formed according to another embodiment of the invention. In this embodiment the first photoluminescence layer 432, containing the manganese-activated fluoride photoluminescence material, comprises a coating layer disposed on and covering an individual LED chip 430. As illustrated the first photoluminescence layer 432 can be generally hemispherical (dome-shaped) in form. Compared with the first photoluminescence layer 232 of the light emitting device of FIG. 2, the first photoluminescence layer 432 is more uniform in thickness and this reduces the variation in excitation light photon density received by the manganese-activated fluoride photoluminescence material within different physical location within the layer. Initial test data indicates that such an arrangement can reduce manganese-activated fluoride photoluminescence material usage by up to 80% by weight compared with the known white light emitting devices comprising a single photoluminescence layer (for example FIG. 1)

The white light emitting device 420 can be manufactured by firstly depositing the first photoluminescence layer 432 onto the LED chip 430 and then filling the cavity 428 with the other photoluminescence material to form the second photoluminescence layer 452.

Packaged White Light Emitting Devices Utilizing CSP LEDs

Figure 5A:
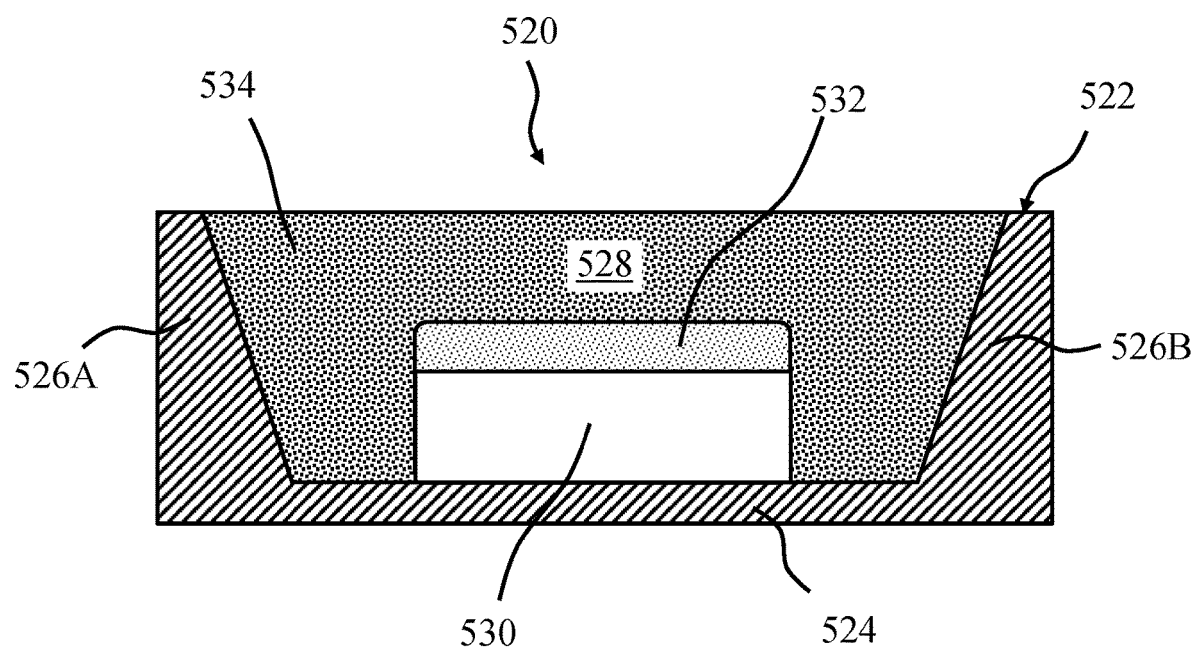
FIGS. 5A to 5H are sectional views of light emitting devices in accordance with an embodiment of the invention that utilize CSP (Chip Scale Packaged) LEDs.
Figure 5B:
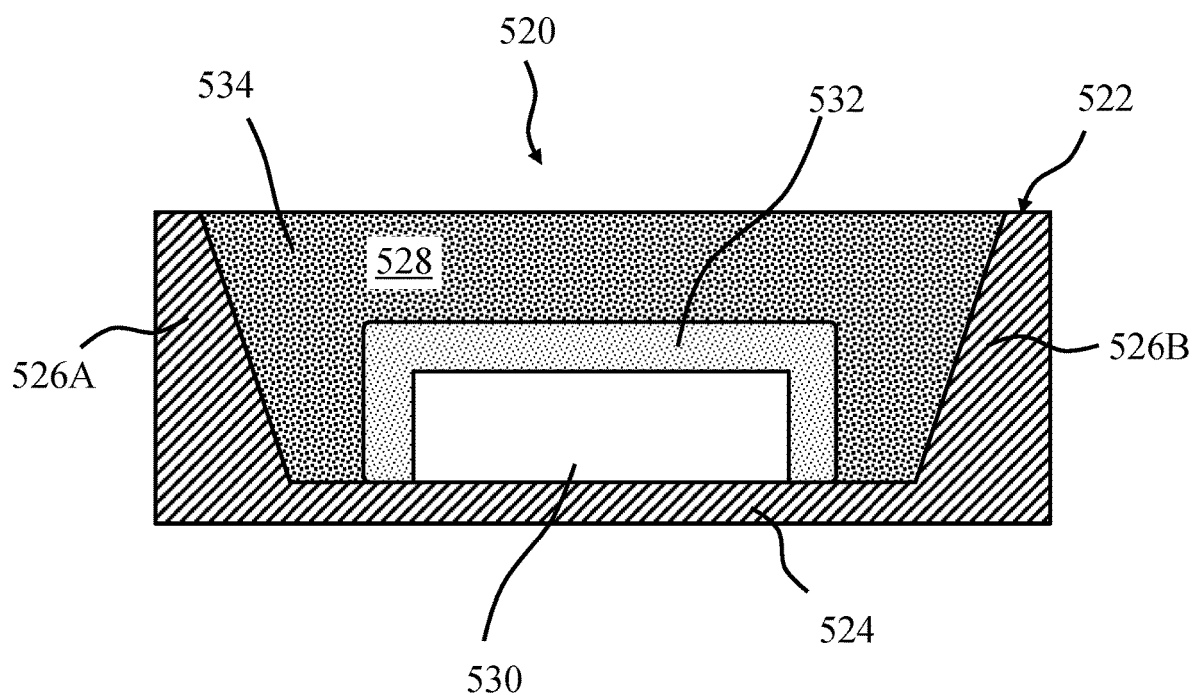

FIGS. 5A and 5B are sectional views of packaged light emitting device in accordance with an embodiment of the invention that utilize CSP (Chip Scale Packaged) LEDs. In the light emitting devices of FIGS. 5A and 5B, the first photoluminescence layer 532 comprises a substantially uniform thickness coating layer that is applied to at least the principle (top) light emitting face of the LED chip 530. LED chips with a layer (film) of phosphor on their light emitting faces are often referred to as CSP (Chip Scale Packaged) LEDs. As illustrated in FIG. 5A, the device 520 comprises a CSP LED comprising an LED chip 530 having a uniform thickness first layer 532 applied to it top (principle) light emitting face only. As illustrated in FIG. 5B, the device 520 comprises a CSP LED comprising an LED chip 530 having a uniform thickness first layer 532 that covers (applied to) the top light emitting face and four side light emitting faces and can, as shown, be in the form of a conformal coating.

The light emitting devices of FIGS. 5A and 5B can be manufactured by first applying the first photoluminescence layer 532 to at least the principle light emitting face of the LED chip 530, for example using a uniform thickness (typically 20 µm to 300 µm) photoluminescence film comprising the manganese-activated fluoride photoluminescence material. The LED chip 530 is then mounted to the base 524 of the package 522 and the second photoluminescence layer 532 is then deposited so as to fill the cavity 528 and cover LED chip 530.

Figure 5C:
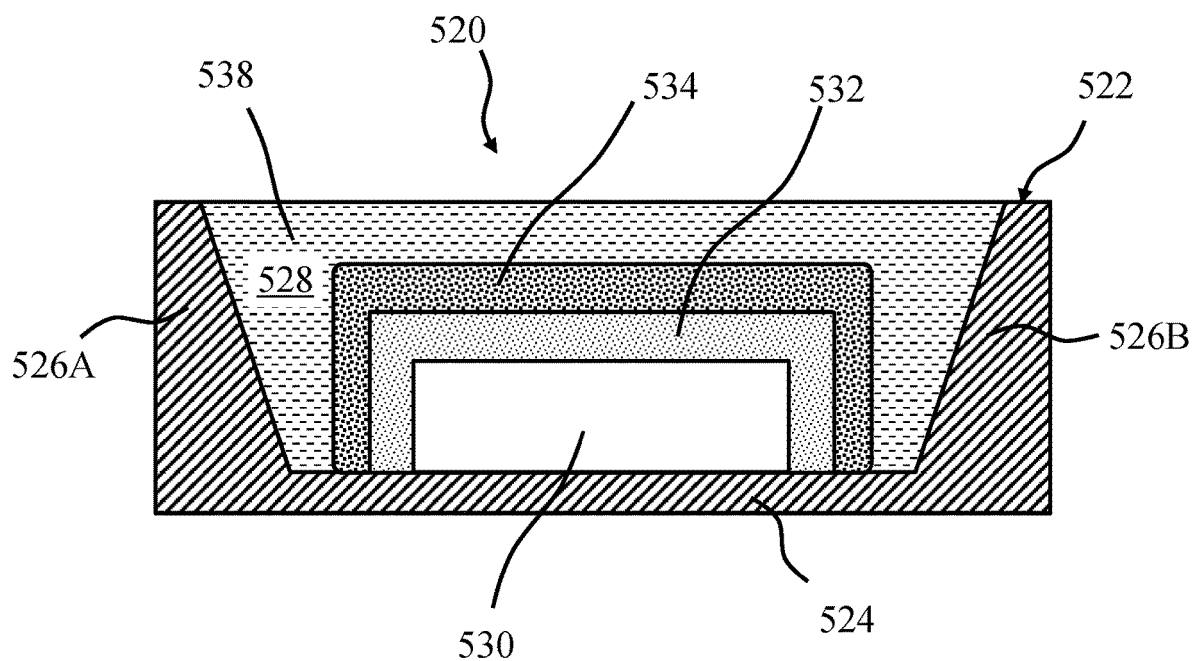

FIG. 5C is a sectional view of a further packaged light emitting device in accordance with an embodiment of the invention that utilizes CSP LEDs. In this embodiment, the CSP LED includes first and second photoluminescence layers 532, 534 comprising a coating layer applied to at least the principle (top) light emitting face of the LED chip 530. As illustrated in FIG. 5C, the first and second photoluminescence layers 532, 534 can be applied to the top light emitting and four side light emitting faces and may be of uniform thickness and in the form of a conformal coating. As shown, the package cavity 528 may be filled with a light transmissive material (optical encapsulant) 538 such as a silicone material to provide environmental protection of the CSP LED. The light emitting device of FIG. 5C can be manufactured by first manufacturing the CSP LED by applying the first and second photoluminescence layers 532, 534 to light emitting faces of the LED chip 530, for example using a first uniform thickness photoluminescence film comprising the manganese-activated fluoride photoluminescence material and then using a second uniform thickness photoluminescence film comprising the other photoluminescence materials. The manufactured CSP LED chip is then mounted to the base 524 of the package 522 and a light reflective material 542 dispensed into the cavity 528 around the CSP LED up to the level of the first photoluminescence layer 532. Finally, the second photoluminescence layer 534 is deposited so as to fill the cavity 528 and cover LED chip 530.

FIGS. 5D to 5H are sectional views of packaged light emitting device in accordance with an embodiment of the invention that utilize CSP (Chip Scale Packaged) LEDs having photoluminescence material that covers the top light emitting face of the LED chip 530 only and additionally include a light reflective material (layer) 542 that at least substantially covers the light emitting side faces of the LED chip. The light reflective material 542 can comprise a white material such as a white silicone material or alike.

The light reflective material layer 542 ensures that all blue light generated by light emitting side faces of the LED chip 530 passes into the first photoluminescence layer 532 comprising a manganese-activated fluoride photoluminescence material. This can be of particular benefit for devices that are configured to generate lower CCT (warm light) light, for example up to 3000K, which require a greater proportion of red light to achieve the desired color temperature. In this way, the inclusion of a light reflective material 542 that substantially covers the light emitting side faces of the LED chip 530 can lessen a need of having to include more manganese-activated fluoride photoluminescence material in the photoluminescence layer to compensate for a "dilution" effect by cooler white created by the emission of blue light from the light emitting side faces of the LED chip. That is, the blue light emission from the light emitting side faces of the LED chip can necessitate more manganese-activated fluoride photoluminescence material usage in the photoluminescence layer to generate the desired lower CCT (warm light) light, for example up to 3000K. A desired warmer color temperature can thus be attained without using more manganese-activated fluoride photoluminescence material in the photoluminescence layer due to the inclusion of a light reflective material that substantially covers the light emitting side faces of the LED chip. Since manganese-activated fluoride photoluminescence material is significantly more expensive than other types of photoluminescence materials (for example, green/yellow garnet-based phosphors), reducing the amount of manganese-activated fluoride photoluminescence material to attain a desired color temperature (warm) by using a relatively inexpensive light reflective material in this way provides a significant cost saving and makes the invention more cost effective and economical to manufacture the light emitting device.

A further benefit of having a light reflective material layer that at least substantially covers the light emitting side faces of the LED chip is that this may lead to a more uniform color and uniform color over angle of emitted light.

Figure 5D:
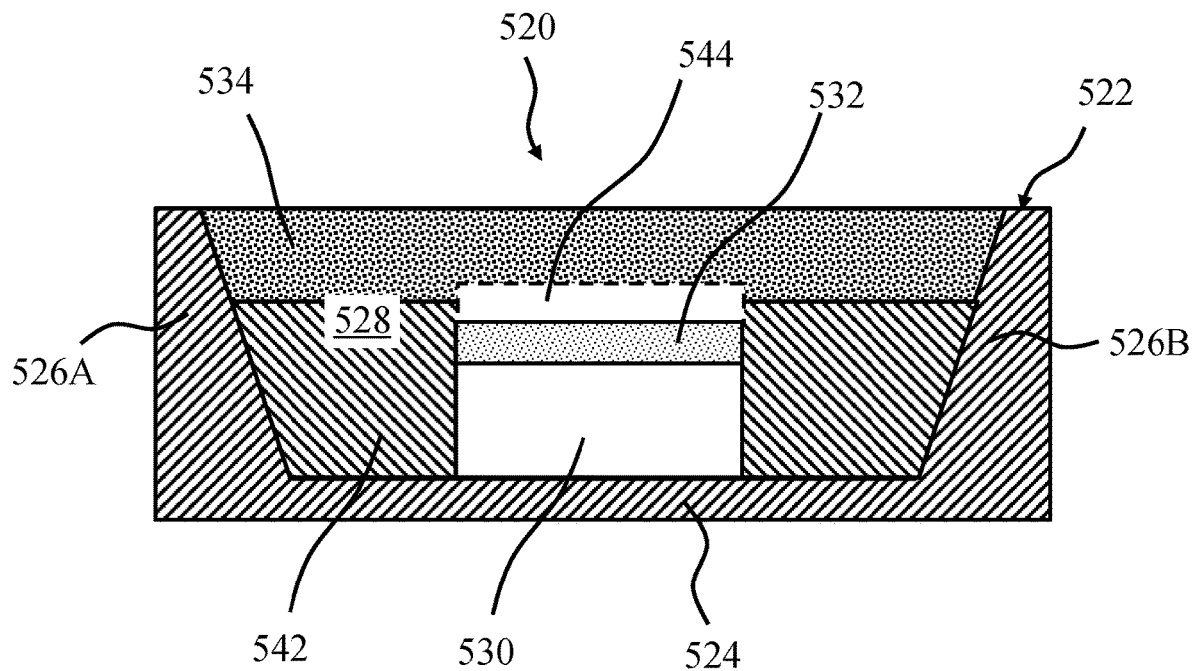

As shown in FIG. 5D the light reflective material 542 comprises a layer of light reflective material 542 that fills the cavity 528 to a level that substantially covers the side faces of the LED chip without covering the first photoluminescence layer 532, and in at least some embodiments the reflective material 542 may fill the cavity 528 to a level that completely covers the side faces of the LED chip without covering the first photoluminescence layer 532. That is, the layer of light reflective material 542 fills the cavity 528 to a level that at least covers the side faces of the LED chip without covering the first photoluminescence layer 532. Consequently, the light reflective material 542 can be considered to constitute a part of the package 522 rather than the CSP LED. Optionally, as indicated in FIG. 5D, the CSP LED may comprise a light transmissive layer 544 (indicated by a dashed line) such as a glass or polymer film that covers the first photoluminescence layer 532. The second photoluminescence layer 534 fills the remainder of the cavity 528 and covers the first photoluminescence layer 532.

The light emitting device of FIG. 5D can be manufactured by first manufacturing the CSP LED by applying the first photoluminescence layer 532 to the light emitting top face of the LED chip 530, for example applying a uniform thickness photoluminescence film comprising the manganese-activated fluoride photoluminescence material to the LED chip. Optionally, the first photoluminescence layer 532 may be provided on a light transmissive substrate 544 (indicated by a dashed line) such as a glass substrate or light transmissive polymer film. Since the first photoluminescence layer 532 may be thin, a benefit of depositing/fabricating the photoluminescence layer on a substrate can be ease of manufacture when manufacturing the first photoluminescence layer as a separate component and then applying this to the LED chip. The manufactured CSP LED chip is mounted to the base 524 of the package 522 and the cavity 528 filled with a light reflective material 542 to a level that substantially/completely covers the side faces of the LED chip 530 without covering the first photoluminescence layer 532 or light transmissive layer (substrate) when present. A further benefit of the light transmissive layer (substrate) 544 can be ease of manufacture when filing the cavity with the light reflective material 542. More particularly, inclusion of the light transmissive layer (substrate) 544 effectively increases the thickness of the first photoluminescence layer 532 thereby allowing for a greater margin of error when filling the cavity 528 with the light reflective material 542 to ensure that it is not filled beyond a level that would otherwise obstruct the emission of light from the first photoluminescence layer 532 or light transmissive layer 544 (substrate) when present. In this way, since less accuracy is required to fill the cavity 528 with the light reflective material 542 to the correct level, this eases the complexity of the manufacturing process thereby diminishing costs.

Figure 5E:
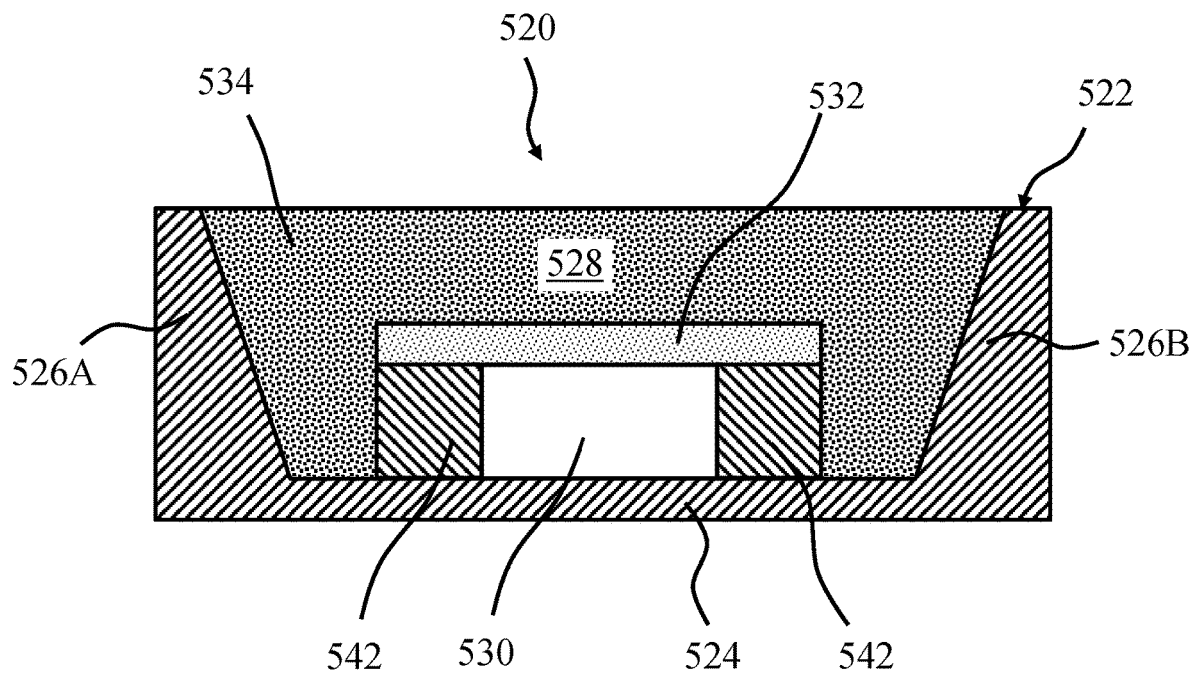
Figure 5F:
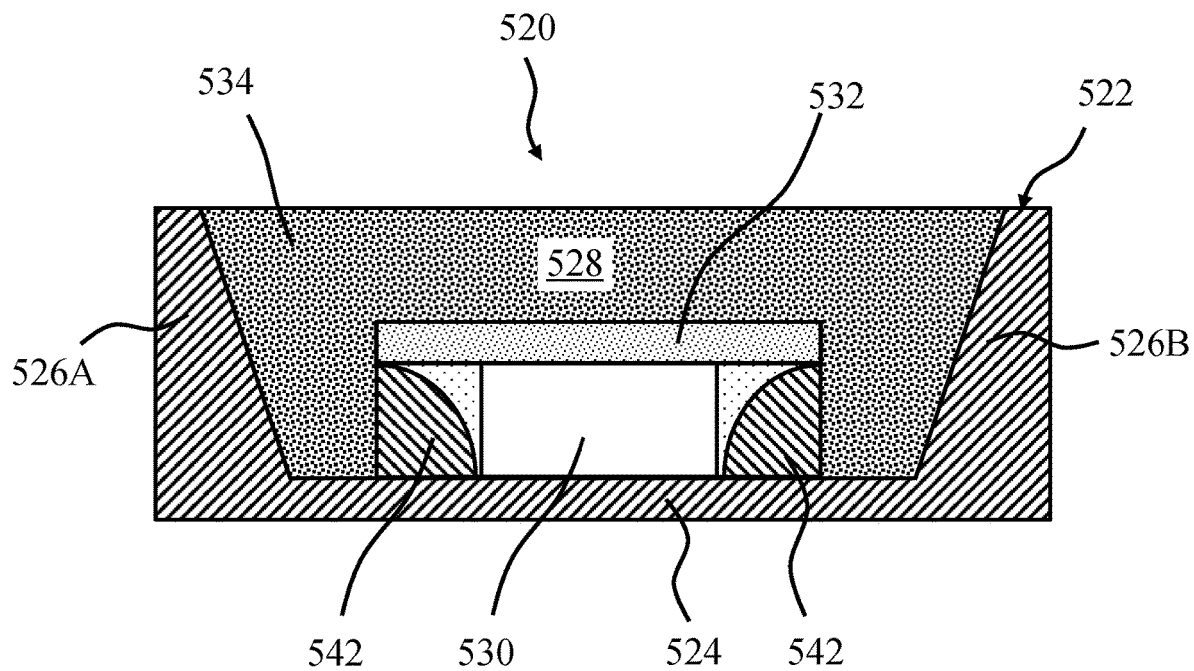
Figure 9A:
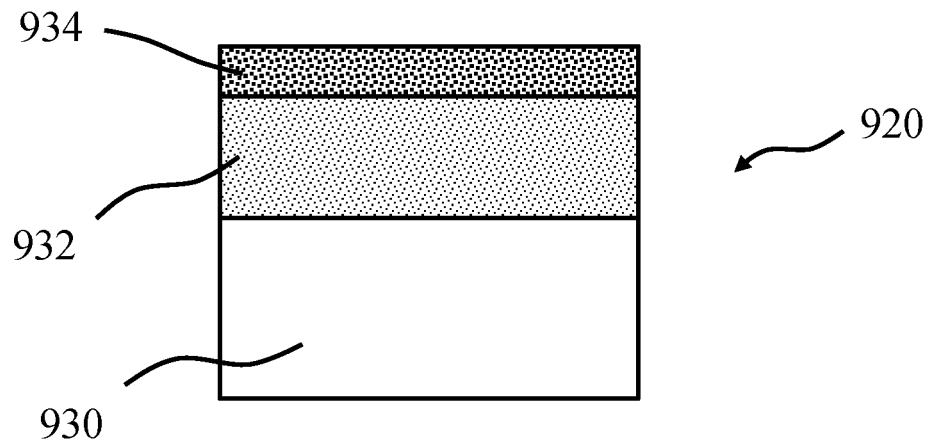
FIGS. 9A to 9D are sectional views of Chip Scale Packaged (CSP) white light emitting devices in accordance with embodiments of the invention.
Figure 9B:
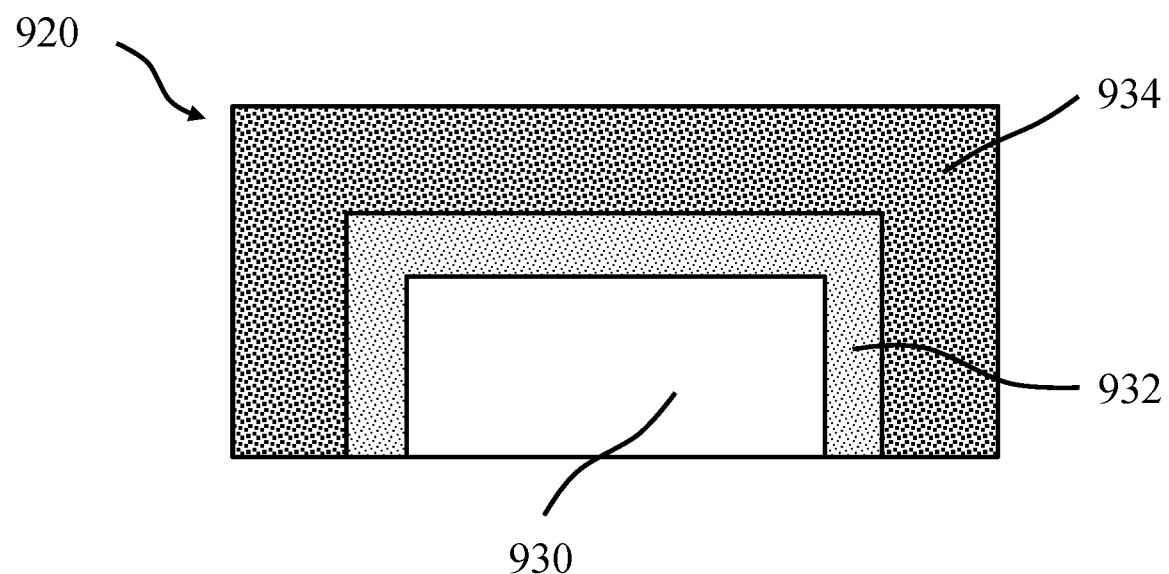
Figure 9C:
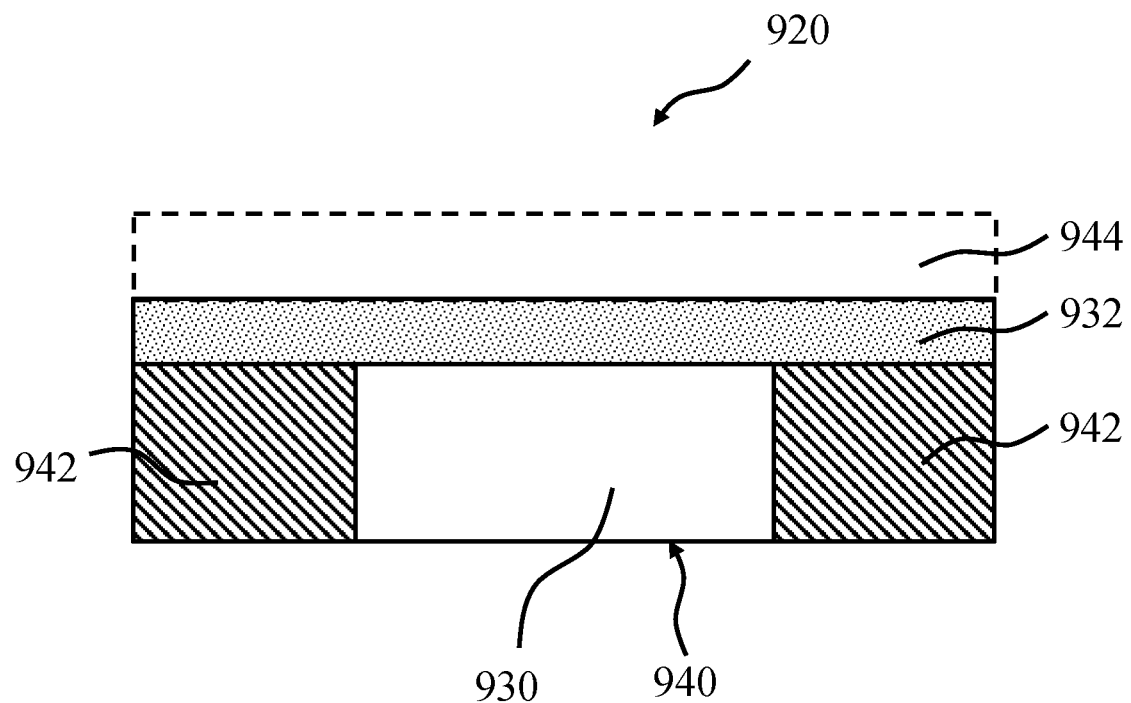
Figure 9D:
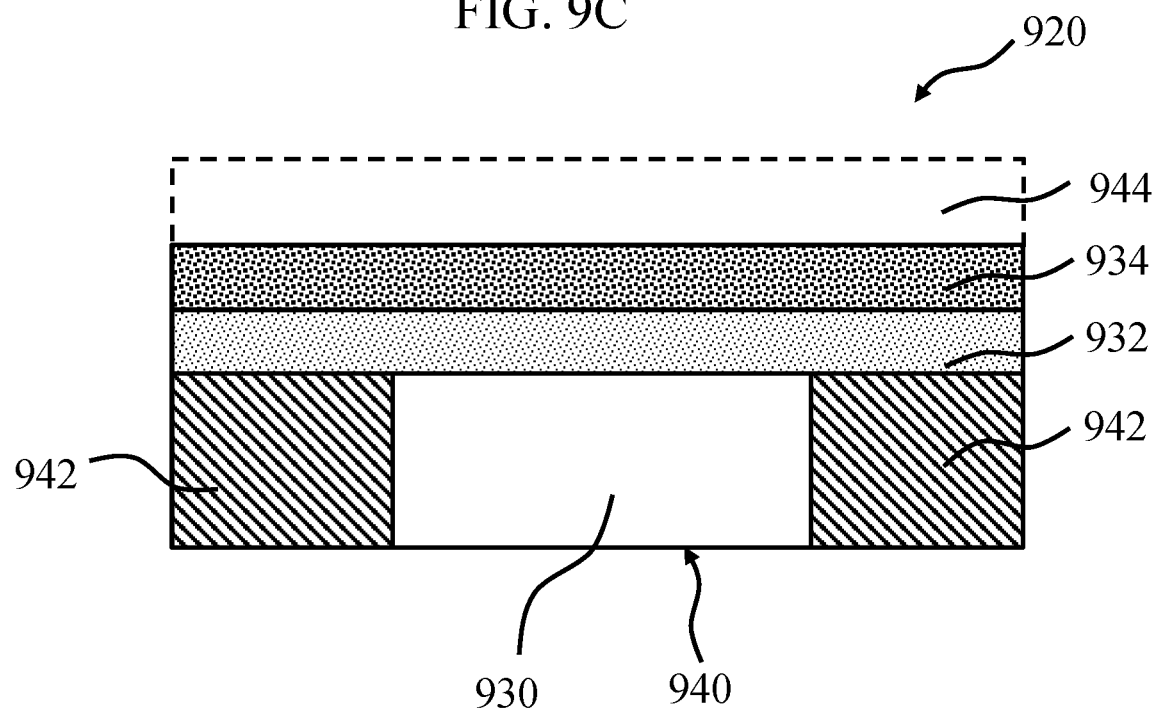
Figure 9E:
FIGS. 9E to 9K illustrate a method of manufacture of the Chip Scale Packaged (CSP) white light emitting device of FIG. 9D.
Figure 9F:
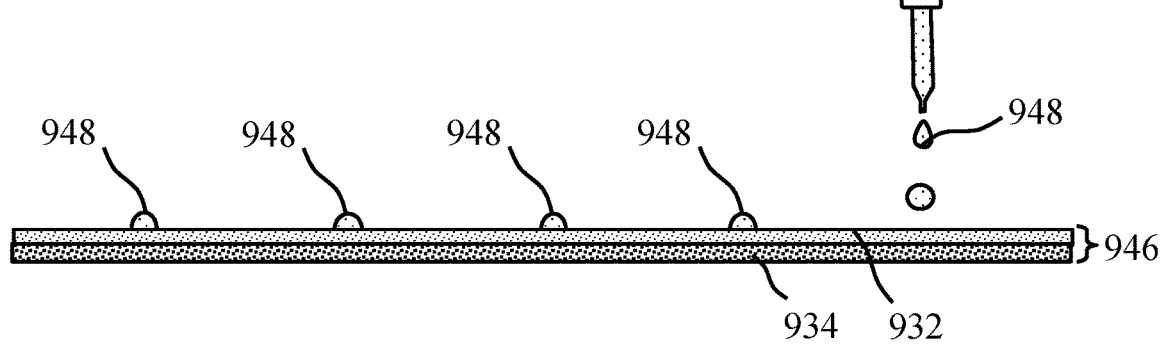
Figure 9G:
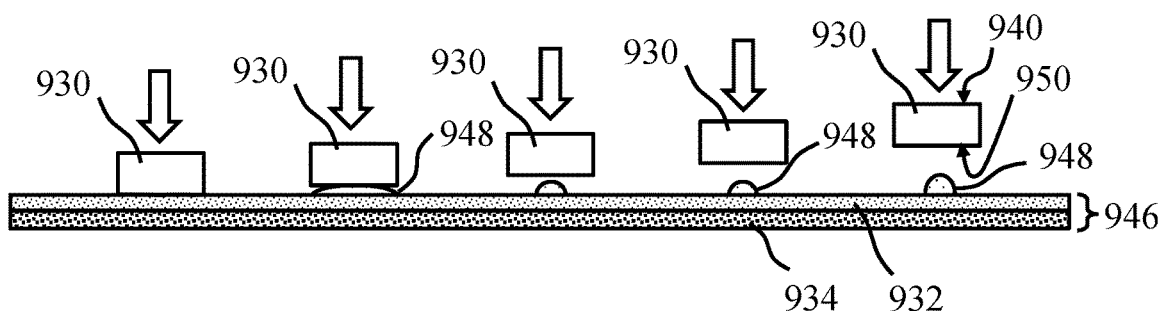
Figure 9H:
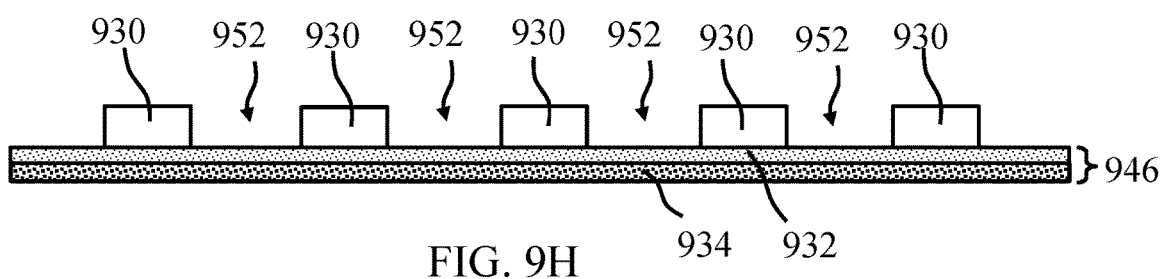
Figure 9I:
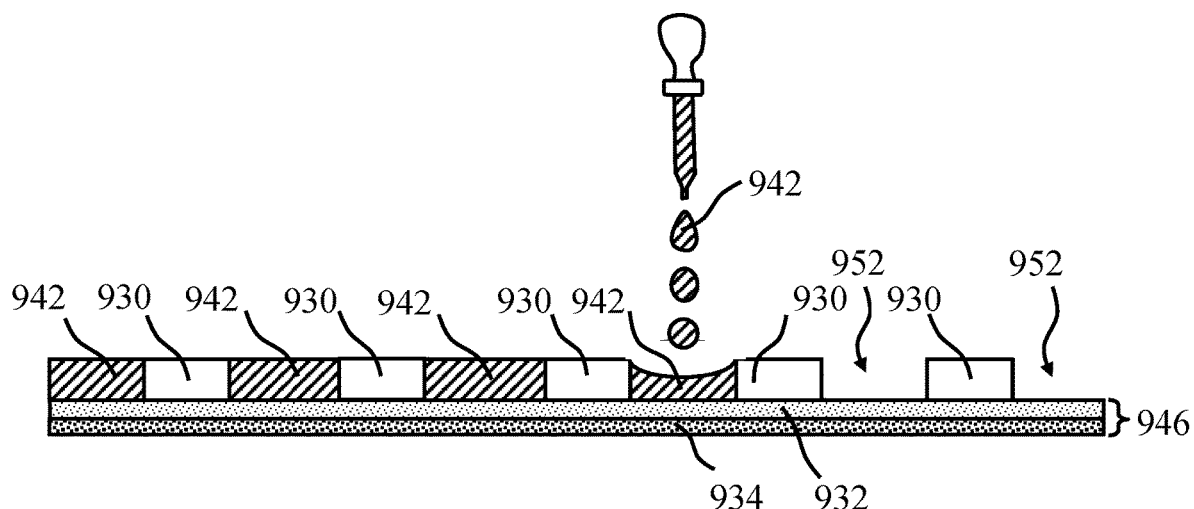
Figure 9J:
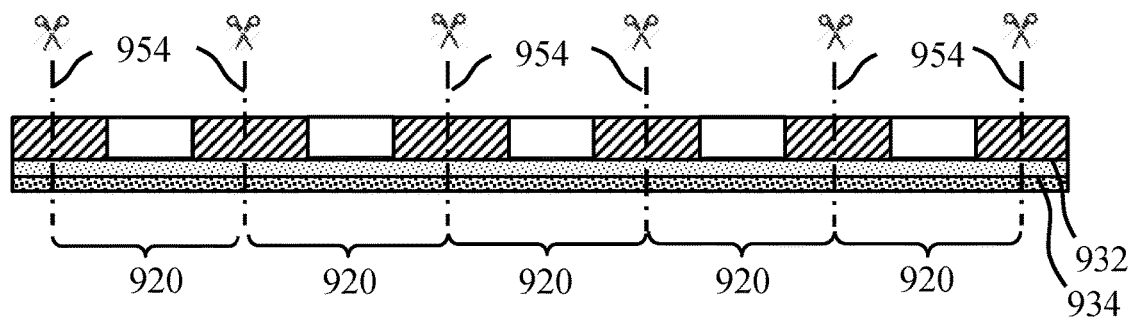
Figure 9K:
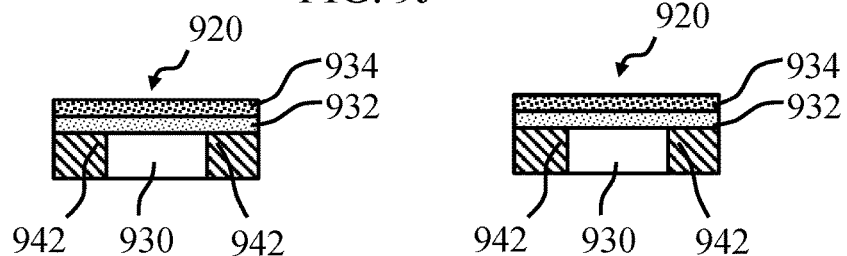
Figure 9L:
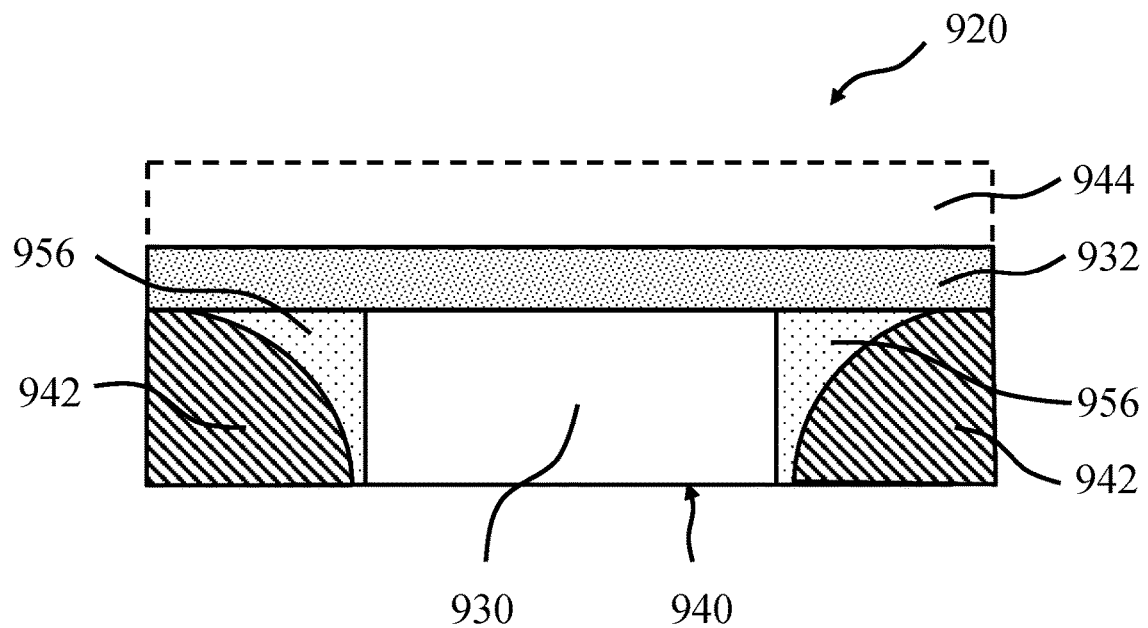
FIGS. 9L and 9M are sectional views of Chip Scale Packaged (CSP) white light emitting devices in accordance with embodiments of the invention.

The light emitting devices 520 of FIG. 5E and FIG. 5F utilize a CSP LED of FIG. 9C and FIG. 9L respectively and each CSP LED comprises a first photoluminescence layer 532 that covers the top light emitting face of the LED chip 530 and a light reflective material 542 that covers each of the four light emitting side faces. The light emitting devices 520 of FIG. 5G and FIG. 5H utilize a CSP LED of FIG. 9E and FIG. 9M respectively and each CSP LED comprises a first photoluminescence layer 532 that covers the top light emitting face of the LED chip 530, a light reflective material 542 that covers the light emitting side faces, and a second photoluminescence layer 534 that covers the first photoluminescence layer. The CSP LEDs of FIGS. 9D, 9E, 9L and 9M are further described below together with their method of manufacture.

The light emitting devices of FIGS. 5E and 5F can be manufactured by first manufacturing the CSP LEDs as described herein, mounting the CSP LED to the base 524 of the package 522, and then depositing the second photoluminescence layer 532 so as to fill the cavity 528 and cover LED chip 530.

Figure 5G:
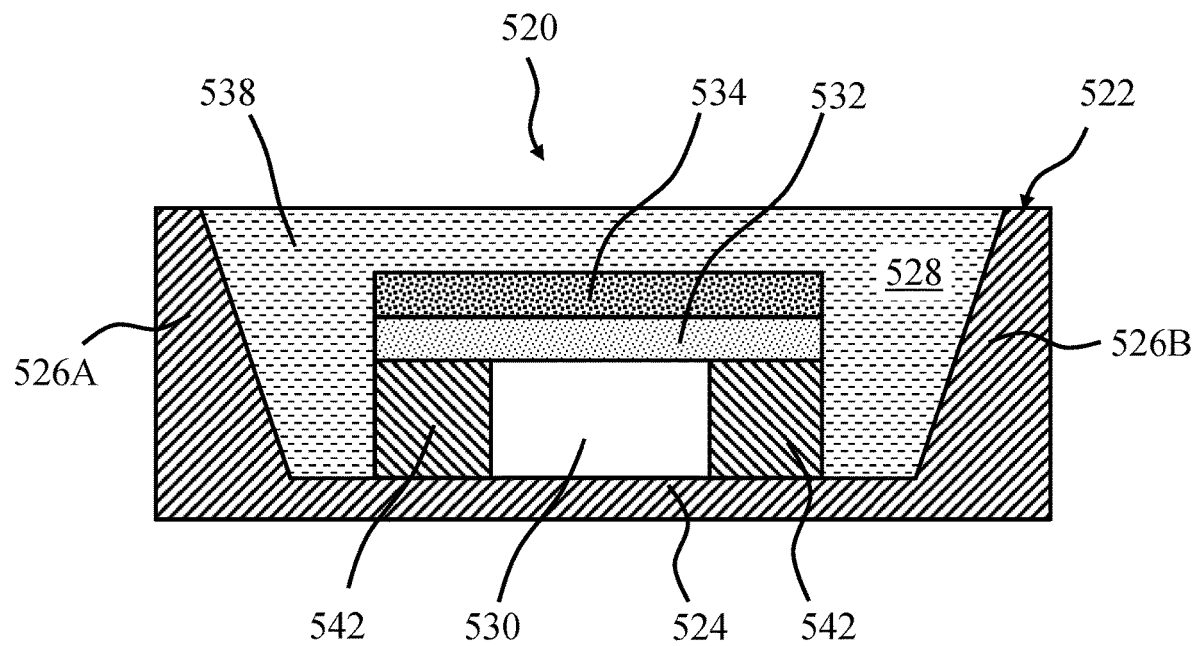
Figure 5H:
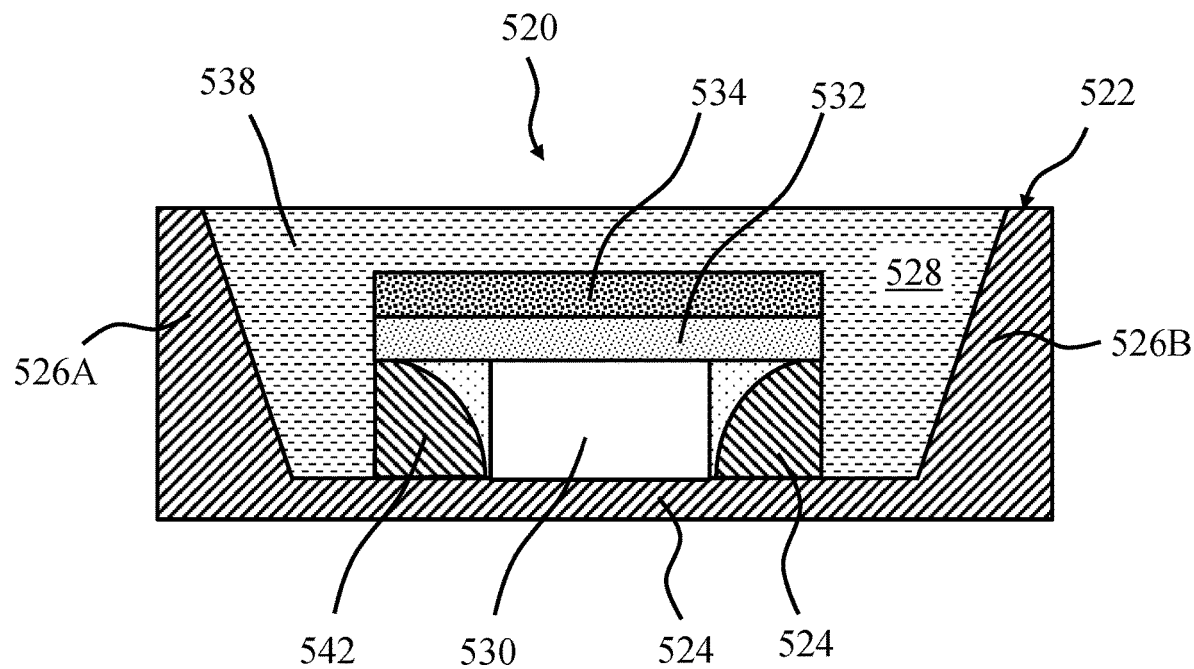

The light emitting devices of FIGS. 5G and 5H can be manufactured by first manufacturing the CSP LEDs as described herein, mounting the CSP LED to the base 524 of the package 522, and optionally then filling the cavity 528 with a light transmissive medium 538.

Compared with the light emitting devices of FIGS. 2 and 3 a uniform thickness coating layer can be preferable as it concentrates all of the manganese-activated fluoride photoluminescence material as close to the LED chip as possible and ensures that regardless of physical location within the layer all of the manganese-activated fluoride photoluminescence material receives exposure to substantially the same excitation light photon density. Such an arrangement can maximize the reduction in manganese-activated fluoride photoluminescence material usage. Initial test data indicates that such an arrangement can reduce manganese-activated fluoride photoluminescence material usage by up to 80% by weight compared with the known white light emitting devices comprising a single photoluminescence layer (for example FIG. 1) The described two-layer light emitting device structure comprising respective first and second photoluminescence layers is not limited to surface mount packaged devices. For instance, it can also be applied in Chip On Board (COB) or Chip Scale Packaged (CSP) applications.

COB (Chip on Board) Packaged White Light Emitting Devices

Figure 6A:
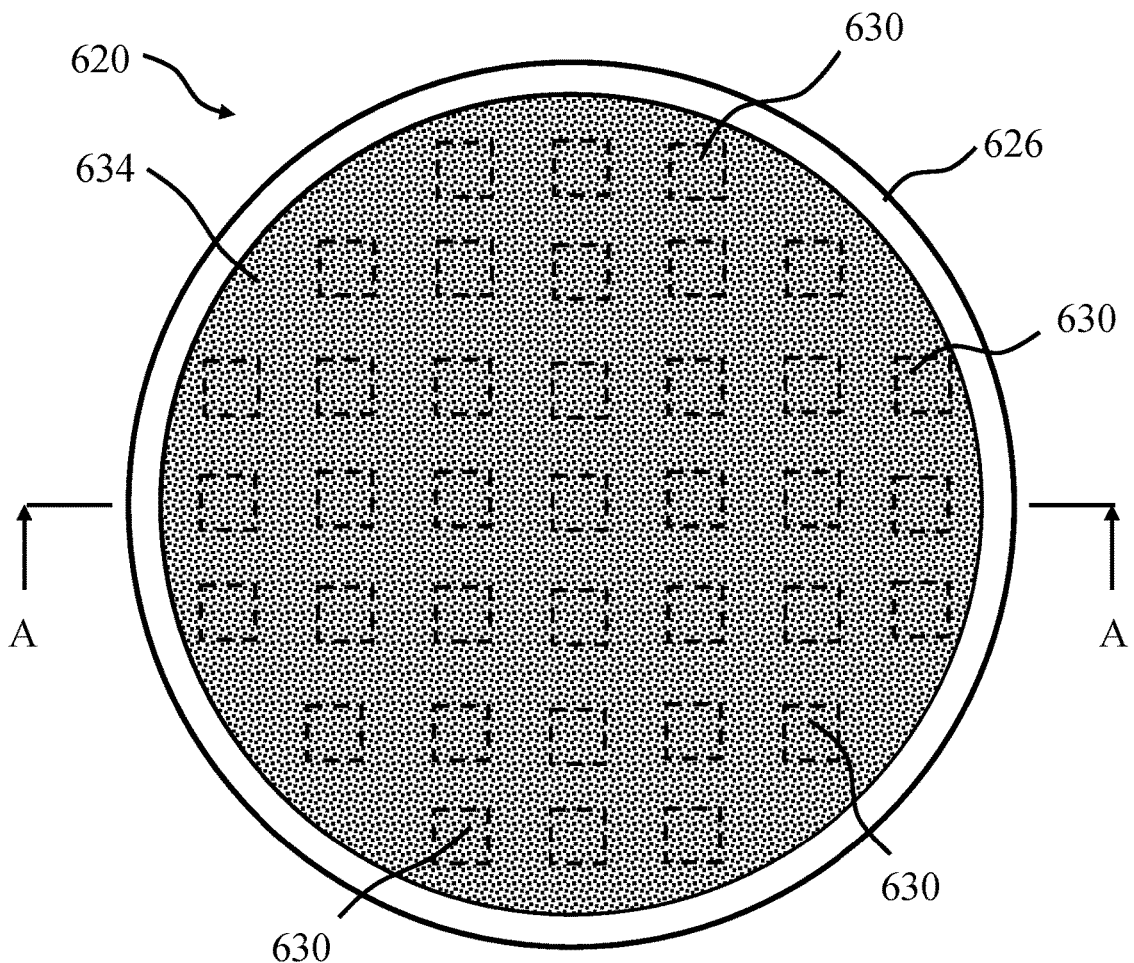
FIGS. 6A and 6B are respectively a plan view and cross sectional side view through A-A a COB (Chip On Board) white light emitting device in accordance with an embodiment of the invention.
Figure 6B:
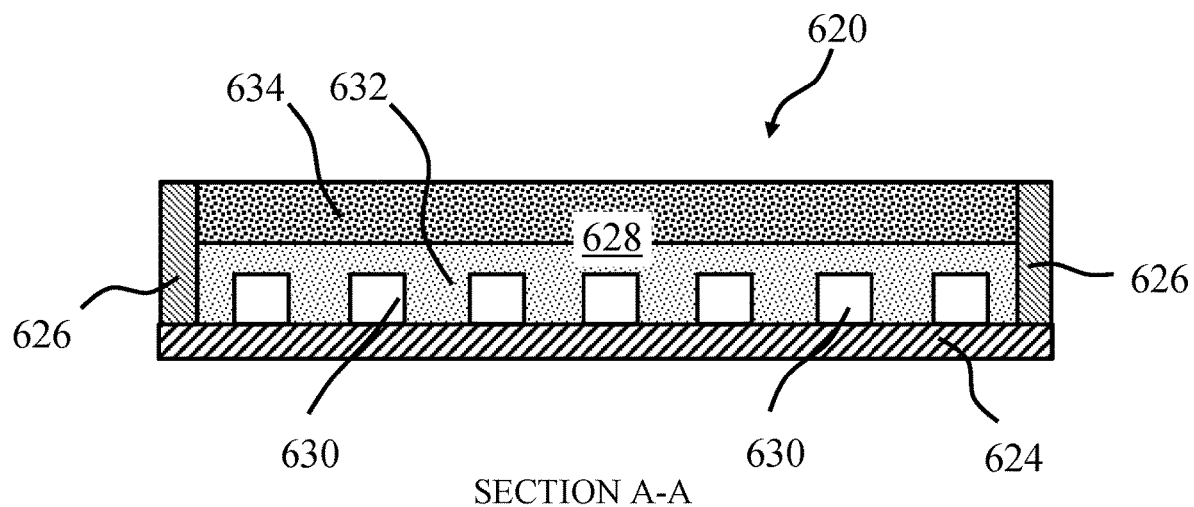

With reference to FIGS. 6A and 6B, there is shown a plan view and a cross section side view through A-A (of FIG. 6A) of a COB light emitting device 620 in accordance with another embodiment of the invention. The light emitting device 620 has a circular shape; and, can as illustrated, comprise a circular substrate (board) 624 which is planar and disk shaped. The substrate typically comprises a circuit board such as a Metal Core Printed Circuit Board (MCPCB). Forming a COB arrangement, 7 arrays (rows) of blue LED dies 630 are evenly distributed on the circular substrate 624. The circular substrate 624 also comprises about its entire perimeter a peripheral (annular) wall 626 which encloses all the arrays of blue LED dies (chips) 630 and in conjunction with the substrate 624 define a volume (cavity) 628.

A first photoluminescence layer 632 comprising a manganese-activated fluoride photoluminescence material is deposited onto the circular substrate 624 and, in this embodiment, completely covers the array of blue LEDs 630. Similarly, a second photoluminescence material layer 634 comprising a cerium-activated yellow garnet phosphor having a general composition $Y_3(Al,Ga)_5O_{12}:Ce$ is deposited onto the first photoluminescence layer 632 comprising the manganese-activated fluoride photoluminescence material. In this way, the first photoluminescence layer 632 and the second photoluminescence layer 634 are located adjacent one another and also contained within the wall 626.

The light emitting device 620 functions and exhibits the same advantages as discussed in relation the light emitting devices of FIGS. 2, 3, 4, 5A to 5E for example. Hence, the statements made in relation to these figures apply equally to the embodiment of FIGS. 6A and 6B.

A method of manufacturing the light emitting device, for example, comprises the steps of: providing an array of blue LEDs; dispensing a manganese-activated fluoride photoluminescence material layer (first photoluminescence layer) at least over said array of blue LEDs; and dispensing a second photoluminescence material layer over said manganese-activated fluoride photoluminescence material layer to fill the volume 628.

Figure 7:
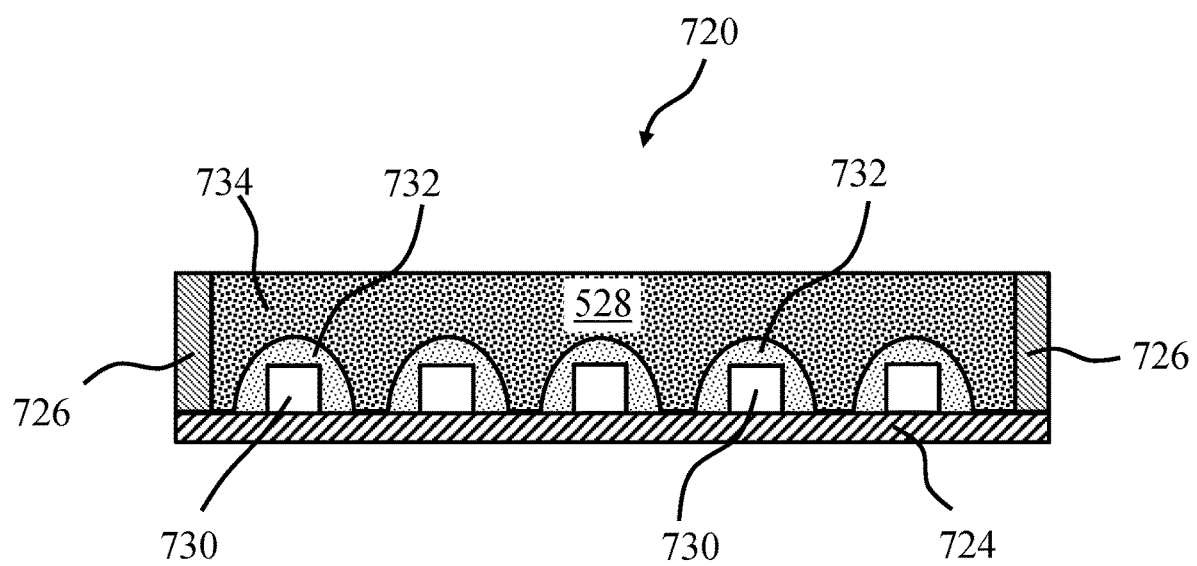
FIG. 7 is a sectional view of a COB (Chip On Board) white light emitting device in accordance with an embodiment of the invention.

FIG. 7 is a sectional view of a COB white light emitting device in accordance with an embodiment of the invention. Referring to FIG. 7, there is shown a COB packaged white light emitting device 720 (white light emitting device package) formed according to another embodiment of the invention. In this embodiment the first photoluminescence layer 732, containing the manganese-activated fluoride photoluminescence material, comprises a respective individual coating layer disposed on and covering each LED chips 730. As illustrated the first photoluminescence layer 732 can be generally hemispherical (dome-shaped) in form. Compared with the first photoluminescence layer 632 of the light emitting device of FIGS. 6A and 6B, the first photoluminescence layer 632 is more uniform in thickness and this reduces the variation in excitation light photon density received by the manganese-activated fluoride photoluminescence material within different physical location within the layer. Initial test data indicates that such an arrangement can reduce manganese-activated fluoride photoluminescence material usage by up to 80% by weight compared with the known white light emitting devices comprising a single photoluminescence layer (for example FIG. 1).

COB White Light Emitting Devices Utilizing CSP LEDs

FIGS. 8A to 8F are cross sectional side views COB (Chip On Board) white light emitting device in accordance with embodiments of the invention that utilize CSP (Chip Scale Packaged) LEDs.

Figure 8A:
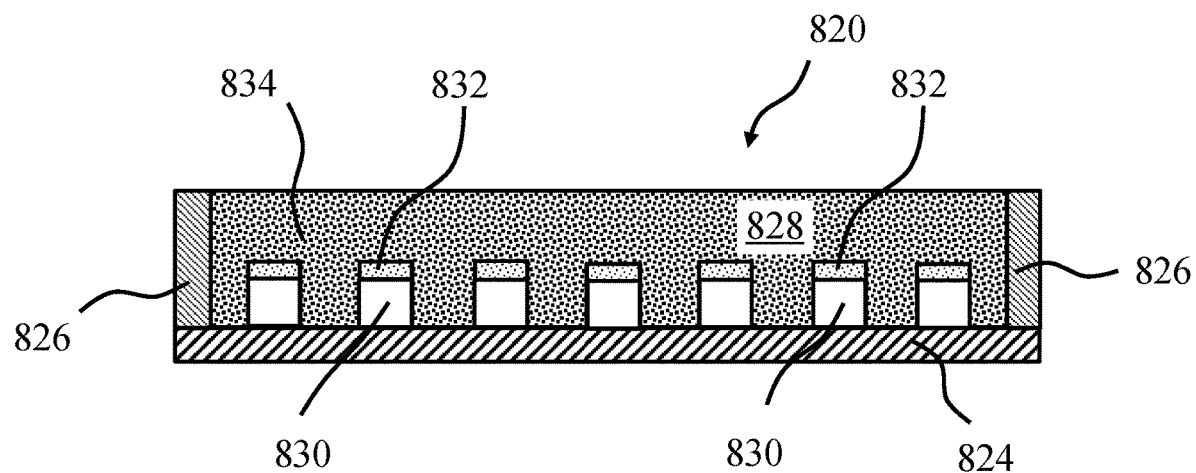
FIGS. 8A to 8F are cross sectional side views of COB (Chip On Board) white light emitting device in accordance with an embodiment of the invention that utilize CSP (Chip Scale Packaged) LEDs.
Figure 8B:
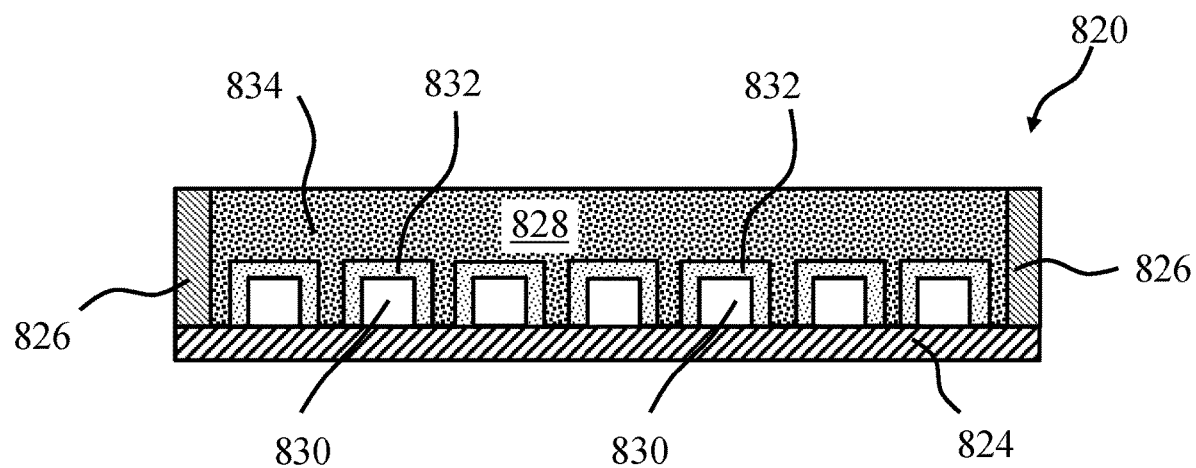

In the COB light emitting devices of FIGS. 8A and 8B the first photoluminescence layer 832 may comprise a respective uniform thickness coating layer that is applied to at least the principle light emitting face of each LED die (chip). As described herein, LED chips with a uniform thickness layer (film) of phosphor on their light emitting faces are often referred to as CSP (Chip Scale Packaged) LEDs. As illustrated in FIG. 8A each LED chip 830 has a uniform thickness layer applied to it top (principle) light emitting face only. As illustrated in FIG. 8B each LED chip 830 has a uniform thickness layer applied to the top light emitting and four side light emitting faces and is in the form of a conformal coating. The COB light emitting devices of FIGS. 8A and 8B can be manufactured by first applying the first photoluminescence layer 832 to at least the principle light emitting face of each of the LED chips 830, for example using a uniform thickness (typically 20 μm to 300 μm) photoluminescence film comprising the manganese-activated fluoride photoluminescence material. The LED chips 830 are then mounted to the base 824 and the second photoluminescence layer 832 then deposited over the array of LED chips to fill the volume 828. Compared with the light emitting devices of FIGS. 6A and 6B a uniform thickness first photoluminescence layer is preferred as it concentrates all of the manganese-activated fluoride photoluminescence material as close to the LED chip as possible and ensures that regardless of physical location within the layer all of the manganese-activated fluoride photoluminescence material receives exposure to substantially the same excitation light photon density. Initial test data indicates that such an arrangement can reduce manganese-activated fluoride photoluminescence material usage by up to 80% by weight compared with the known white light emitting devices comprising a single photoluminescence layer (for example FIG. 1)

FIGS. 8C to 8F are sectional views of further COB white light emitting devices 820 in accordance with embodiments of the invention that utilize CSP LEDs having photoluminescence material that covers the top light emitting face of the LED chip 830 only and a light reflective material (layer) 842 that covers the light emitting side faces. The light emitting devices 820 of FIG. 8C and FIG. 8D utilize a CSP LED of FIG. 9C and FIG. 9L respectively and each comprise a first photoluminescence layer 832 that covers the top light emitting face of the LED chip 830 and a light reflective material 842 that covers each of the four light emitting side faces. The light emitting devices 820 of FIG. 8E and FIG. 8F utilize a CSP LED of FIG. 9E and FIG. 9M respectively and each comprise a first photoluminescence layer 832 that covers the top light emitting face of the LED chip 830, a light reflective material 842 that covers the light emitting side faces, and a second photoluminescence layer 834 that covers the first photoluminescence layer. The CSP LEDs of FIGS. 9D, 9E, 9L and 9M are further described below together with their method of manufacture.

Figure 8C:
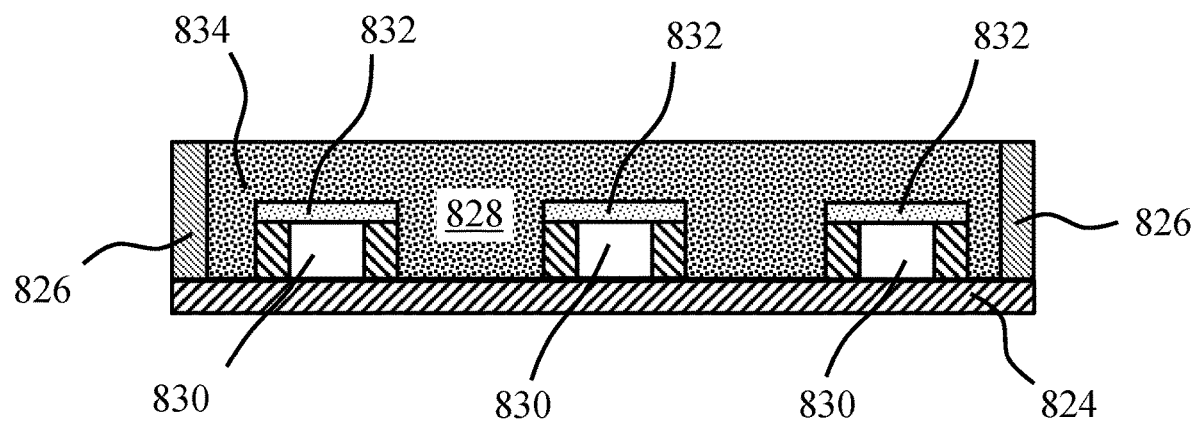
Figure 8D:
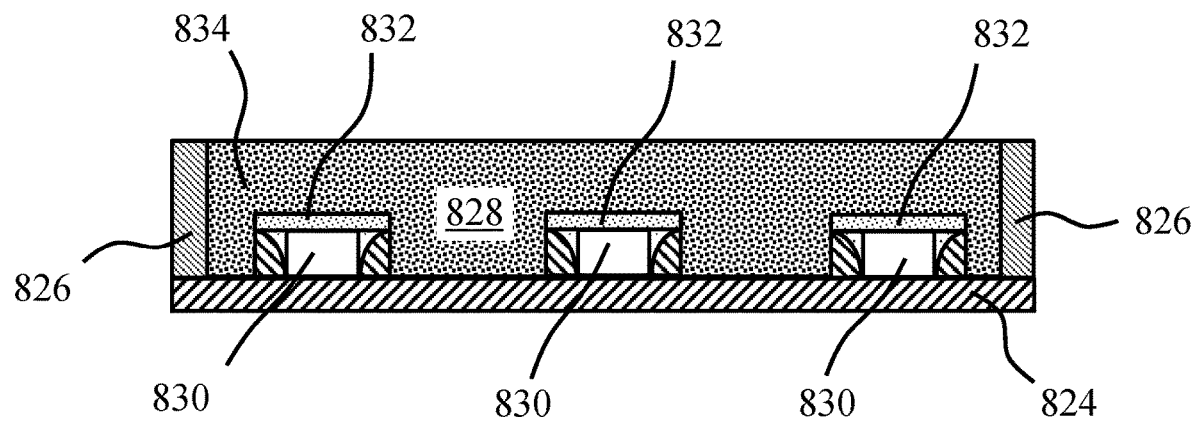

In the embodiments of FIGS. 8C and 8D, the COB packaged white light emitting devices 820 comprises a plurality (array) of CSP LEDs comprising the first photoluminescence layer 832 that are mounted on the substrate (board) 824. The second photoluminescence layer 834 is constituted by filling the volume 828 contained within the peripheral wall 826 with a light transmissive material (optical encapsulant) containing the second photoluminescence material.

Figure 8E:
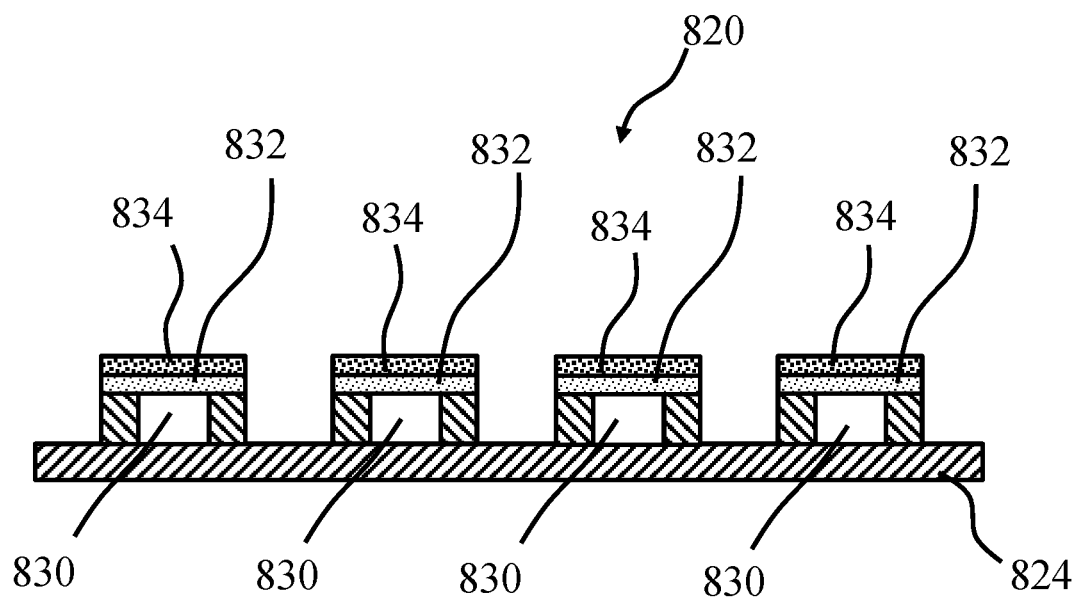
Figure 8F:
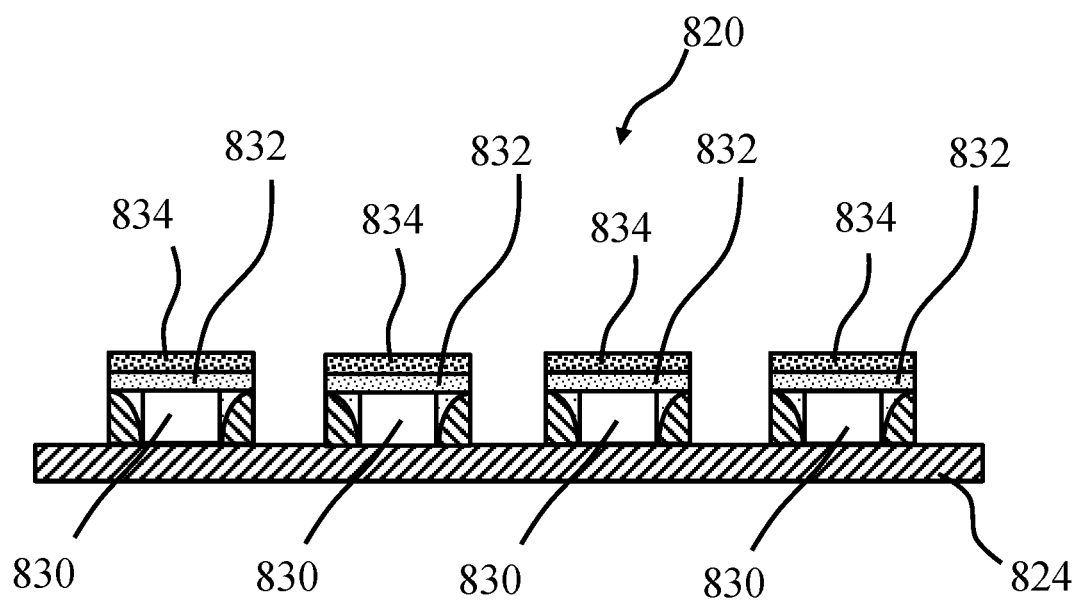

In the embodiments of FIGS. 8E and 8F, the COB packaged white light emitting devices 820 comprises a plurality (array) of CSP LEDs mounted on the substrate (board) 824.

Since the CSP LEDs include both first and second photoluminescence layers 832, 834, there is no need for a peripheral wall or light transmissive optical encapsulant. However, in other embodiments, a peripheral wall and optical encapsulant can be provided to provide environmental protection to the CSP LEDs.

CSP (Chip Scale Packaged) Light Emitting Devices

FIGS. 9A and 9B show side views of CSP light emitting devices 920 in accordance with embodiments of the invention. In each embodiment, a first photoluminescence layer 932 comprising a manganese-activated fluoride photoluminescence material is applied (deposited) as a uniform thickness layer directly onto and covers at least the principle (e.g. top) light emitting face of a blue LED flip chip (die) 930.

As shown in FIG. 9A, a second photoluminescence material layer 934 comprising, for example, a cerium-activated yellow garnet phosphor having a general composition $Y_3(Al,Ga)_5O_{12}$:Ce is applied (deposited) as a uniform thickness layer onto and covers the first photoluminescence layer 932.

As illustrated in FIG. 9B, the LED chip 930 has uniform thickness first and second photoluminescence layers 932, 934 applied to the light emitting top face (top as shown) and four light emitting side faces and can be in the form of a conformal coating.

FIGS. 9C and 9D show side views of CSP light emitting devices 920 in accordance with embodiments of the invention. In each embodiment, a first photoluminescence layer 932 comprising a manganese-activated fluoride photoluminescence material covers (is applied to) the top light emitting face of a blue LED flip chip 930 and a light reflective material 942 covers the light emitting side faces. The light reflective material can comprise a white material such as a white silicone material or alike. The light reflective material layer 942 ensures that all blue light generated by light emitting side faces of the LED chip 930 passes into the first photoluminescence layer 932 comprising a manganese-activated fluoride photoluminescence material. This can be of particular benefit for devices that are configured to generate lower CCT (warm light) light, for example up to 3000K, which require a greater proportion of red light to achieve the desired color temperature. In this way, the inclusion of a light reflective material 942 that substantially covers the light emitting side faces of the LED chip 930 can lessen a need of having to include more manganese-activated fluoride photoluminescence material in the photoluminescence layer to compensate for a "dilution" effect by cooler white created by the emission of blue light from the light emitting side faces of the LED chip. That is, the blue light emission from the light emitting side faces of the LED chip can necessitate more manganese-activated fluoride photoluminescence material usage in the photoluminescence layer to generate the desired lower CCT (warm light) light, for example up to 3000K. A desired warmer color temperature can thus be attained without using more manganese-activated fluoride photoluminescence material in the photoluminescence layer due to the inclusion of a light reflective material that substantially covers the light emitting side faces of the LED chip. Since manganese-activated fluoride photoluminescence material is significantly more expensive than other types of photoluminescence materials (for example, green/yellow garnet-based phosphors), reducing the amount of manganese-activated fluoride photoluminescence material to attain a desired color temperature (warm) by using a relatively inexpensive light reflective material in this way provides a significant cost saving and makes the invention more cost effective and economical to manufacture the light emitting device.

A further benefit of having a light reflective material layer that at least substantially covers the light emitting side faces of the LED chip is that this may lead to a more uniform color and uniform color over angle of emitted light.

In the embodiment of FIG. 9C, the CSP light emitting device 920 comprises a first photoluminescence layer 932, comprising in terms of photoluminescence material only a manganese-activated fluoride photoluminescence material, that is applied (deposited) as a uniform thickness layer directly onto the light emitting top face (top face as shown) of a blue LED flip chip 930. Optionally, as indicated in FIG. 9C the first photoluminescence layer 932 may be provided on a light transmissive substrate 944 (indicated by a dashed line) such as a glass substrate or light transmissive polymer film. Since the first photoluminescence layer can be of a thickness 20 µm to 300 µm, a benefit of depositing/fabricating the first photoluminescence layer on a substrate can be ease of manufacture when manufacturing the first photoluminescence layer as a separate component and then applying this to the LED chip. A further benefit of the substrate is that this can provide environmental protection to the first photoluminescence layer. The CSP light emitting device 920 further comprises a light reflective material 942 that covers the light emitting side faces of the LED flip chip 930 and constitute a light reflective enclosure (cup) around the periphery of the LED flip chip 930. The light reflective material 942 reflects light that would otherwise be emitted from the side faces of the LED chip back into the LED chip 932 and this light is eventually emitted from the LED chip through the top light emitting face. As can be seen FIG. 9C, the first photoluminescence layer 932 completely covers the top surface of the LED chip 930 and the light reflective material 942 thereby ensuring that all light generated by the CSP light emitting device 920 is emitted through the first photoluminescence layer 932.

The CSP light emitting device 920 of FIG. 9D is the same as that of FIG. 9C except that it further comprises a second photoluminescence layer 934 that is in contact with and covers the first photoluminescence layer 932. Optionally, as indicated in FIG. 9D the photoluminescence layers 932, 934 may be provided on a light transmissive substrate 944 (indicated by a dashed line) such as a glass substrate or light transmissive polymer film. Since the photoluminescence layers may be thin, a benefit of depositing/fabricating the photoluminescence layers on a substrate can be ease of manufacture when manufacturing the photoluminescence layers as a separate component and then applying this to the LED chip. A further benefit of the substrate is that this can provide environmental protection to the photoluminescence layers.

FIGS. 9E to 9K illustrate a method of manufacture of the CSP white light emitting device 920 of FIG. 9D.

First, as shown in FIG. 9E, a photoluminescence component (film) 946 is provided comprising the first and second photoluminescence layers 932, 934. The photoluminescence film 946 can be manufactured by for example extrusion, slot die coating or screen printing. As described herein, the photoluminescence layers 932, 934 may be provided on a light transmissive substrate 944 (not shown) such as a glass substrate or light transmissive polymer film.

Next, with the first photoluminescence layer 932 oriented uppermost, a measured quantity of a light transmissive material 948, such as a curable silicone optical encapsulant, is dispensed on the first photoluminescence layer 932 at predetermined locations (FIG. 9F). To maximize device yield from the photoluminescence film 946 the locations may, as illustrated, comprise a square array of rows and columns.

An LED flip chip 930, with its light emitting face 950 facing the photoluminescence film (i.e. base 940 uppermost), is placed on a respective optical encapsulant 948 and pushed into the optical encapsulant 948. The encapsulant 948 bonds the LED chip to photoluminescence film and forms a thin optical coupling layer between the first photoluminescence 932 and the top light emitting face 950 of the LED chip 930.

As indicated in FIG. 9H, there is a square lattice of valleys 952 between rows and columns of LED dies 930. The valleys 952 are filled with a light reflective material 942 such as a for example a white silicone material (FIG. 9I).

Finally, as shown in FIG. 9J, individual CSP devices 920 are produced by cutting along cut lines 954. The cut individual CSP devices 920 can be seen in FIG. 9K.

It will be appreciated that a similar method can be used to manufacture the CSP white light emitting device 920 of FIG. 9C using a photoluminescence film comprising only a first photoluminescence layer 932.

Figure 9M:
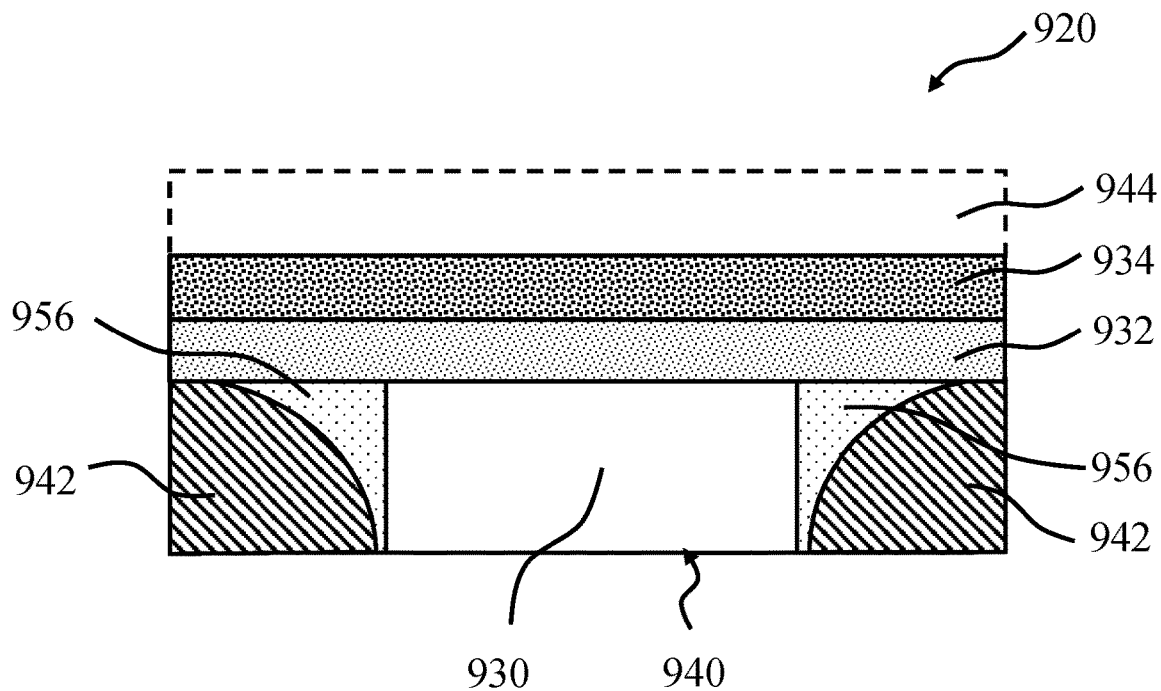

FIGS. 9L and 9M show side views of CSP light emitting devices 920 in accordance with embodiments of the invention. In each embodiment, a first photoluminescence layer 932 comprising a manganese-activated fluoride photoluminescence material covers (is applied to) the top light emitting face of a blue LED chip 930, there is a light transmissive region 956 around the periphery of the LED chip 930 and a light reflective material 942 that covers the light transmissive region 956 and the light emitting side faces of the LED chip. It is to be noted that the first photoluminescence layer 932 extends beyond the light emitting top face of the LED chip and covers at least the light transmissive region 956 and may as indicated in the figures additionally cover the light reflective region 956. The light reflective material can comprise a white material such as a white silicone material.

The light reflective material layer 942 ensures that all blue light generated by light emitting side faces of the LED chip 930 passes into the first photoluminescence layer 932 comprising a manganese-activated fluoride photoluminescence material. The light transmissive region 956 increases the amount of blue light generated by light emitting side faces of the LED chip 930 that reaches the first photoluminescence layer 932. As described herein, this can be of particular benefit for devices that are configured to generate lower CCT (warm light) light, for example up to 3000K, which require a greater proportion of red light to achieve the desired color temperature.

In this way, the inclusion of a light reflective material 942 in combination with the light transmissive portion (layer) 956 that at least substantially covers the light emitting side faces of the LED chip 930 can lessen a need of having to include more manganese-activated fluoride photoluminescence material in the photoluminescence layer to compensate for a "dilution" effect by cooler white created by the emission of blue light from the light emitting side faces of the LED chip. That is, the blue light emission from the light emitting side faces of the LED chip can necessitate more manganese-activated fluoride photoluminescence material usage in the photoluminescence layer to generate the desired lower CCT (warm light) light, for example up to 3000K. A desired warmer color temperature can thus be attained without using more manganese-activated fluoride photoluminescence material in the photoluminescence layer due to the inclusion of a light reflective material that substantially covers the light emitting side faces of the LED chip. Since manganese-activated fluoride photoluminescence material is significantly more expensive than other types of photoluminescence materials (for example, green/yellow garnet-based phosphors), reducing the amount of manganese-activated fluoride photoluminescence material to attain a desired color temperature (warm) by using a relatively inexpensive light reflective material in this way provides a significant cost saving and makes the invention more cost effective and economical to manufacture the light emitting device.

In the embodiment of FIG. 9L, the CSP light emitting device 920 comprises a first photoluminescence layer 932, comprising in terms of photoluminescence material only a manganese-activated fluoride photoluminescence material, that can be applied (deposited) as a uniform thickness layer directly onto the light emitting face (top face as shown) of a blue LED flip chip 930. The light emitting device further comprises a light transmissive portion (layer) 956 applied to each of the four light emitting side faces of the LED chip and has a form which extends upwardly and outwardly from the base 940 of the LED chip. The light transmissive portion 956 defines a light transmissive region around the periphery of the LED chip and allows light emitted from the sides faces of the LED chip to travel to the first photoluminescence layer 932. The CSP light emitting device 920 further comprises a light reflective material 942 in contact with the light transmissive region which extends upwardly and inwardly from the base 940 of the LED chip and defines a light reflective enclosure (cup) around the periphery of the light transmissive portion 956. The light reflective portion 942 reflects light emitted from the side faces of the LED die in an upward direction towards the first photoluminescence layer 932. As can be seen FIG. 9L, the first photoluminescence layer 932 completely covers the top surface of the LED die 930, light transmissive portion 956, and light reflective portion 942 thereby ensuring that all light generated by the CSP light emitting device 920 is emitted through the first photoluminescence layer 932.

The CSP light emitting device 920 of FIG. 9M is the same as that of FIG. 9L except that it further comprises a second photoluminescence layer 934 that is in contact with and covers the first photoluminescence layer 932.

FIGS. 9N to 9T illustrate a method of manufacture of the CSP white light emitting device 920 of FIG. 9M.

Figure 9N:
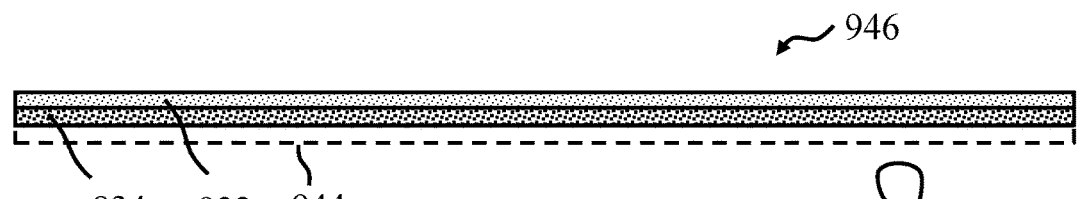
FIGS. 9N to 9T illustrate a method of manufacture of the Chip Scale Packaged (CSP) white light emitting device of FIG. 9M.

First, as shown in FIG. 9N, a photoluminescence film 946 is provided comprising the first and second photoluminescence layers 932, 934. The photoluminescence film 946 can be manufactured by for example extrusion, slot die coating or screen printing. As described herein, the photoluminescence layers 932, 934 may be provided on a light transmissive substrate 944 (not shown) such as a glass substrate or light transmissive polymer film.

Figure 9O:
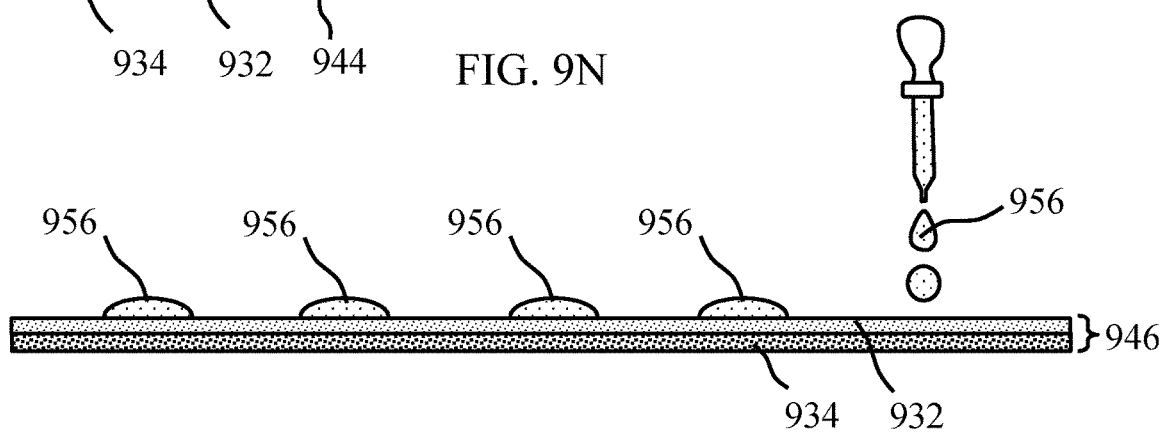

Next, with the first photoluminescence layer 932 oriented uppermost, a measured quantity of a light transmissive material 956, such as a curable silicone optical encapsulant, is dispensed on the first photoluminescence layer 932 at predetermined locations (FIG. 9O). To maximize device yield from the photoluminescence film 946 the locations may, as illustrated, comprise a square array of rows and columns.

Figure 9P:
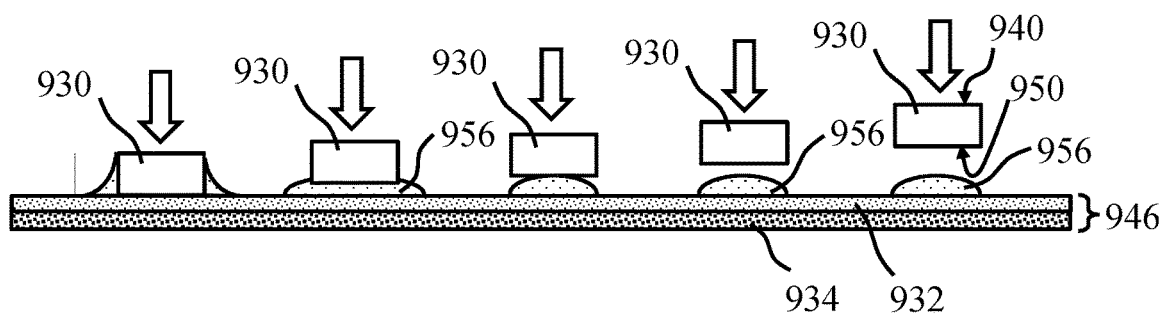

An LED flip chip 930, with its light emitting face 950 facing the photoluminescence film (i.e. base 940 uppermost), is placed on a respective optical encapsulant 956 and pushed into the optical encapsulant 956 (FIG. 9P). The encapsulant 956 forms a concave meniscus that extends up and covers each of the light emitting side faces of the LED dies as shown in FIG. 9Q.

Figure 9Q:
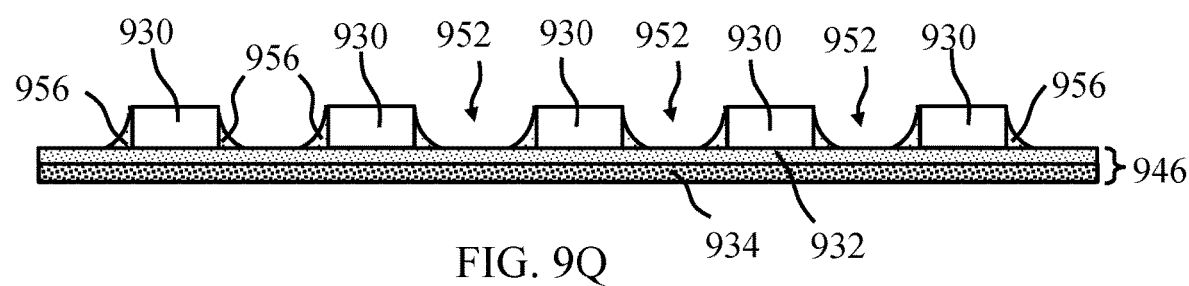
Figure 9R:
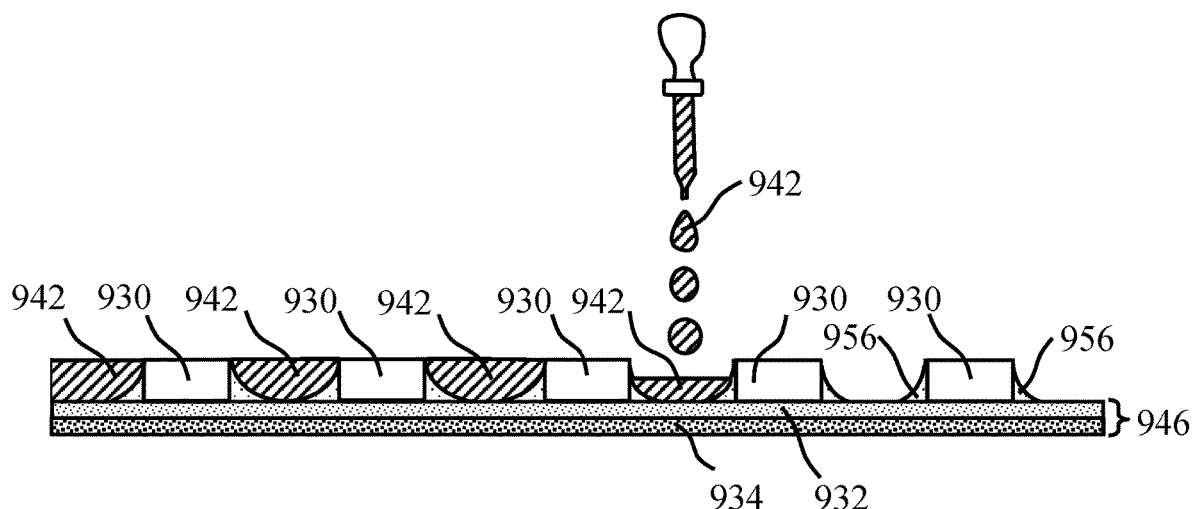

As indicated in FIG. 9Q, there is a square lattice of valleys 952 between rows and columns of LED dies 930. The valleys 952 are filled with a light reflective material 942 such as a for example a white silicone material (FIG. 9R).

Figure 9S:
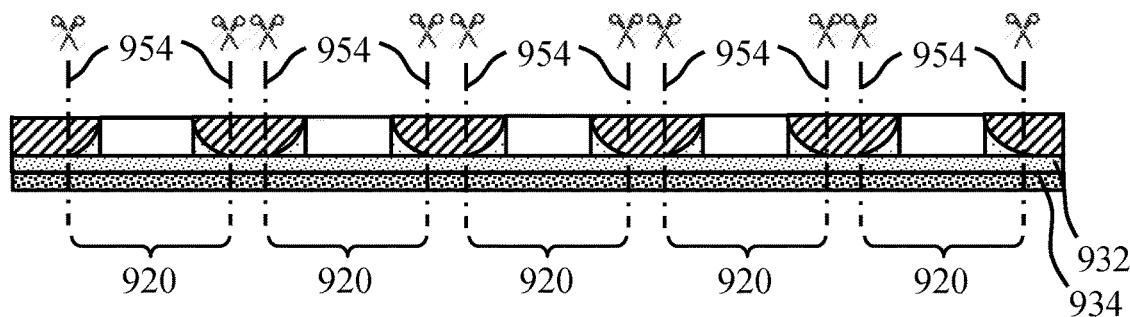
Figure 9T:
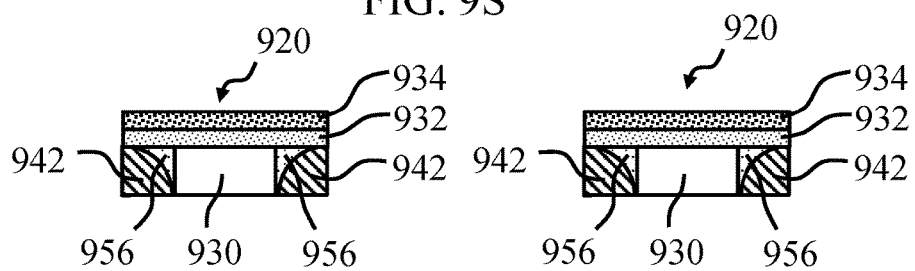

Finally, as shown in FIG. 9S, individual CSP devices 920 are produced by cutting along cut lines 954. The cut individual CSP devices 920 can be seen in FIG. 9T.

It will be appreciated that a similar method can be used to manufacture the CSP white light emitting device 920 of FIG. 9L using a photoluminescence film comprising only a first photoluminescence layer 932.

The light emitting devices 920 of FIGS. 9A to 9D, 9L and 9M function and exhibit the same advantages as discussed in relation the light emitting device of FIG. 2 for example.

Hence, the statements made in relation to FIG. 2 apply equally to the embodiment of FIG. 9A to 9D, 9L and 9M.

Experimental Test Data

In this specification, the following nomenclature is used to denote white light emitting devices: Com.# denotes a comparative (known) white light emitting device comprising a single-phosphor layer and Dev.# denotes a two-phosphor layer white light emitting device in accordance with an embodiment of the invention.

Comparative white light emitting devices (Com.#) and white light emitting devices in accordance with the invention (Dev.#) each comprise SMD 2835 packaged devices containing three serially connected 1133 (11 mil×33 mil) blue LED chips of dominant wavelength $\lambda_d \approx 455$ nm. Each device is a nominal 0.9 W (Drive The rated driving condition is 100 mA and a forward drive voltage $V_f$ of 9 V) device and is intended to generate white light with a target Correlated Color Temperature (CCT) of 2700K and a general color rendering index CRI Ra>90.

The phosphors used in the test devices are KSF ($K_2SiF_6$:$Mn^{4+}$) from Intematix Corporation, green YAG phosphor (Intematix NYAG4156—$(Y, Ba)_{3-x}(Al_{1-y}Ga_y)_5O_{12}$:$Ce_x$ Peak emission wavelength $\lambda_{pe}=550$ nm) and CASN ($Ca_{1-x}Sr_x$-$AlSiN_3$:Eu $\lambda_{pe} \approx 615$ nm). The CASN is included to achieve the 2700K color target and general CRI Ra>90.

For the single-layer comparative devices, Com.#, the three phosphors (KSF, YAG and CASN) were mixed in a phenyl silicone and the mixture dispensed into the 2835 package to fill the cavity. The single-phosphor layer is then cured in an oven.

For the two-layer devices (Dev.#): KSF phosphor is mixed into a phenyl silicone and dispensed into the 2835 package to partially fill the LED cavity. The KSF phosphor layer is cured in an oven. YAG phosphor is mixed with a phenyl silicone and then dispensed on top of KSF layer to fully fill the LED cavity and the cured in an oven. The KSF phosphor layer can additionally include CASN and/or YAG.

Experimental Test Data—Optical Performance

The test method involves measuring total light emission of the packaged white light emitting devices in an integrating sphere.

TABLE 1 tabulates phosphor composition of a comparative device Com.1 (single-layer device) and a two-layer device Dev.1 in accordance with the invention. TABLE 2 tabulates total phosphor usage for the single-layer device (Com.1) and the two-layer device (Dev.1). The phosphor weight values (weight) in TABLES 1 and 2 are normalized to the weight of KSF in the single phosphor layer of comparative device Com.1.

As can be seen from TABLE 1, in terms of phosphor composition: Com. 1 comprises a single phosphor layer comprising a mixture of 69.9 wt % (weight=1.000) KSF, 28.1 wt % (weight=0.400) YAG and 2.1 wt % (weight=0.030) CASN. Dev.1 comprises a two-layered phosphor structure having a $1^{st}$ phosphor layer comprising a mixture of 95.2 wt % (weight=0.457) KSF and 4.8 wt % (weight=0.023) CASN and a $2^{nd}$ phosphor layer comprising 100.0 wt % (weight=0.561) YAG.

TABLE 1

Phosphor composition of a single-layer LED (Com. 1) and a two-layer LED (Dev. 1)

| | $1^{st}$ phosphor layer | | | | | | $2^{nd}$ phosphor layer | | | |
| --- | --- | --- | --- | --- | --- | --- | --- | --- | --- | --- |
| | KSF | | YAG | | CASN | | YAG | | CASN | |
| Device | weight[1] | wt %[2] | weight[1] | wt %[2] | weight[1] | wt %[2] | weight[1] | wt % | weight[1] | wt %[2] |
| Com. 1 | 1.000 | 69.9 | 0.400 | 28.0 | 0.030 | 2.1 | — | — | — | — |
| Dev. 1 | 0.457 | 95.2 | — | — | 0.023 | 4.8 | 0.561 | 100.0 | — | — |

[1]weight-phosphor weight normalized to weight of KSF of single phosphor layer of comparative device (Com. 1)
[2]wt %-phosphor weight percentage of total phosphor content of the layer

TABLE 2

Phosphor usage of a single-layer LED (Com. 1) and a two-layer LED (Dev. 1)

| | Phosphor usage | | | | | | | | | TOTAL |
| --- | --- | --- | --- | --- | --- | --- | --- | --- | --- | --- |
| | KSF | | | YAG | | | CASN | | | |
| Device | weight[1] | % | wt %[3] | weight[1] | % | wt%[3] | weight[1] | % | wt %[3] | weight[1] |
| Com. 1 | 1.000 | 100.0 | 69.9 | 0.400 | 100.0 | 28.0 | 0.030 | 100 | 2.1 | 1.430 |
| Dev. 1 | 0.457 | 46.0 | 43.9 | 0.561 | 129.0 | 53.9 | 0.023 | 76 | 2.2 | 1.041 |

[1]weight-phosphor weight normalized to weight of KSF of single phosphor layer of comparative device (Com. 1)
[3]wt %-phosphor weight percentage of total phosphor content of device TABLE 3 tabulates the measured optical performance of the light emitting devices Com.1 and Dev.1. As can be seen from TABLE 3 the color point of light generated by the devices are very similar with the flux generated by the two layer-device of the invention (Dev.1) being 4.1 lm greater (3.4% brighter: Brightness—Br) than the single-layer comparative device (Com.1). However, as can be seen from TABLE 2, compared with the single-layer device Com.1, KSF usage of the two-layer device Dev.1 in accordance with the invention is reduced from a normalized weight (weight) 1.000 to 0.457, that is a 54% reduction in KSF usage compared with Com.1. Moreover, CASN usage of the two-layer device Dev.1 is also reduced from a normalized weight 0.030 to 0.023, that is a 24% reduction in CASN usage compared with Com.1. While there is an increase of 29% (0.561 from 0.400) in YAG usage, total phosphor usage is reduced from weight=1.430 to 1.041, that is a reduction of 28% total phosphor usage. As noted above, YAG is inexpensive compared with both KSF (typically $\frac{1}{100}$ to $\frac{1}{150}$ of the cost) and CASN (typically at least $\frac{1}{20}$ of the cost). Consequently, since YAG is a fraction of the cost of KSF or CASN, the overall cost of the device is dramatically reduced in this way. As well as the cost saving afforded by the reduction in KSF and CASN content, two-layer devices in accordance with the invention are easier to manufacture as they use less total phosphor material which means that the phosphor material loading in silicone is reduced and this reduction can increase the reliability/stability of the dispensing process.

It is believed that the reason for the increase in YAG usage is that due to less blue excitation light reaching the $2^{nd}$ phosphor layer, more YAG phosphor is required to generate green light to attain the selected color target. As discussed above, it is believed that since the KSF layer contains substantially only KSF (individual KSF layer), KSF usage is reduced, because the KSF can absorb blue excitation light without having to compete with the YAG phosphor as is the case in the known single-layer devices comprising a single layer having a mixture of phosphors.

TABLE 3

Measured optical performance of a single-layer device (Com. 1) and a two-layer device (Dev. 1)

| Device | CIE | | Flux (lm) | Br (%) | CRI | | | |
|---|---|---|---|---|---|---|---|---|
| | x | y | | | Ra | ΔRa | R9 | ΔR9 |
| Com. 1 | 0.4544 | 0.4183 | 121.7 | 100.0 | 90.3 | 0.0 | 57.6 | 0.0 |
| Dev. 1 | 0.4548 | 0.4208 | 125.8 | 103.4 | 90.9 | 0.6 | 57.4 | −0.2 |

TABLE 4 tabulates phosphor composition of a comparative device Com.2 (single-layer device) and two-layer devices Dev.2 to Dev.5 in accordance with the invention for increasing proportion (wt %) of KSF in the $1^{st}$ phosphor layer. TABLE 5 tabulates total phosphor usage for the single-layer device (Com.2) and the two-layer devices (Dev.2 to Dev.5). The phosphor weights in TABLES 4 and 5 are normalized to the weight of KSF in the comparative device Com.2.

As can be seen from TABLE 4, in terms of phosphor composition: Com.2 comprises a single phosphor layer comprising a mixture of 68.9 wt % (weight=1.000) KSF, 29.0 wt % (weight=0.421) YAG and 2.1 wt % (weight=0.031) CASN. Devices Dev.2 to Dev.5 comprise a $1^{st}$ phosphor layer having an increasing proportion (wt %) of KSF in the $1^{st}$ phosphor layer (76.8 wt % to 100 wt %). More specifically: Dev.2 comprises a two-layered structure having a $1^{st}$ phosphor layer comprising a mixture of 76.8 wt % (weight=0.770) KSF, 3.2 wt % (weight=0.032) CASN and 20.0 wt % (weight=0.200) YAG, and a $2^{nd}$ phosphor layer comprising 100.0 wt % YAG (weight=0.345); Dev.3 comprises a two-layered structure having a $1^{st}$ phosphor layer comprising a mixture of 86.4 wt % (weight=0.665) KSF, 3.6 wt % (weight=0.028) CASN and 10.0 wt % (weight=0.077) YAG and a $2^{nd}$ phosphor layer comprising 100.0 wt % YAG (weight=0.506); Dev.4 comprises a two-layered structure having a $1^{st}$ phosphor layer comprising a mixture of 96.0 wt % (weight=0.639) KSF, 4.0 wt % (weight=0.0270) CASN and a $2^{nd}$ phosphor layer comprising 100.0 wt % YAG (weight=0.580); and Dev.5 comprises a two-layered structure having a $1^{st}$ phosphor layer comprising 100.0 wt % (weight=0.551) KSF and a $2^{nd}$ phosphor layer comprising a mixture of 96.0 wt % YAG (weight=0.595) and 4.0 wt % (weight=0.025) CASN.

TABLE 4

Phosphor composition of a single-layer LED (Com. 2) and two-layer LEDs (Dev. 2 to Dev. 5) with increasing wt % KSF content in $1^{st}$ layer

| | $1^{st}$ phosphor layer | | | | | | $2^{nd}$ phosphor layer | | | | |
|---|---|---|---|---|---|---|---|---|---|---|---|
| | KSF | | YAG | | CASN | | YAG | | | CASN | |
| Device | weight[1] | wt %[2] | weight[1] | wt %[2] | weight[1] | wt %[2] | weight[1] | wt %[2] | %[4] | Weight[1] | wt %[2] |
| Com. 2 | 1.000 | 68.9 | 0.421 | 29.0 | 0.031 | 2.1 | — | — | — | — | — |
| Dev. 2 | 0.770 | 76.8 | 0.200 | 20.0 | 0.032 | 3.2 | 0.345 | 100.0 | 63.3 | — | — |
| Dev. 3 | 0.665 | 86.4 | 0.077 | 10.0 | 0.028 | 3.6 | 0.506 | 100.0 | 86.8 | — | — |
| Dev. 4 | 0.639 | 96.0 | — | — | 0.027 | 4.0 | 0.580 | 100.0 | 100.0 | — | — |
| Dev. 5 | 0.551 | 100.0 | — | — | — | — | 0.595 | 96.0 | 100.0 | 0.025 | 4.0 |

[1]weight-phosphor weight normalized to weight of KSF of single phosphor layer of comparative device (Com. 1)
[2]wt %-phosphor weight percentage of total phosphor content of the layer
[4]%-percentage of total YAG content in $2^{nd}$ phosphor layer

TABLE 5

Phosphor usage of a single-layer LED (Com. 1) and a two-layer LED (Dev. 1)

| | Phosphor usage | | | | | | | | | TOTAL |
|---|---|---|---|---|---|---|---|---|---|---|
| | KSF | | | YAG | | | CASN | | | |
| Device | weight[1] | % | wt %[3] | weight[1] | % | wt %[3] | weight[1] | % | wt %[3] | weight[1] |
| Com. 2 | 1.000 | 100 | 40.3 | 0.715 | 100 | 28.8 | 0.052 | 100 | 30.9 | 2.482 |
| Dev. 2 | 0.770 | 77 | 44.0 | 0.925 | 129 | 52.9 | 0.054 | 104 | 3.1 | 1.749 |
| Dev. 3 | 0.665 | 67 | 39.1 | 0.990 | 138 | 58.1 | 0.047 | 90 | 2.8 | 1.702 |
| Dev. 4 | 0.639 | 64 | 38.2 | 0.985 | 138 | 59.0 | 0.045 | 87 | 2.7 | 1.669 |
| Dev. 5 | 0.551 | 55 | 34.4 | 1.009 | 141 | 63.0 | 0.042 | 81 | 2.6 | 1.602 |

[1]weight-phosphor weight normalized to weight of KSF of single phosphor layer of comparative device (Com. 1)
[3]wt %-phosphor weight percentage of total phosphor content of device TABLE 6 tabulates the measured optical performance of the light emitting devices Com.2 and Dev.2 to Dev.5. As can be seen from TABLE 6 the optical performance/color point of the devices are very similar with the flux generated by the two layer-devices of the invention (Dev.2 to Dev.5) being between about 0.7% and 2.0% brighter (Brightness—Br) than the single-layer comparative device (Com.2). However, as can be seen from TABLE 5, compared with the single-layer device Com.2, KSF usage of the two-layer devices Dev.2 to Dev.5 in accordance with the invention is reduced by 23% up to 45% depending on the proportion (wt %) of KSF in the $1^{st}$ phosphor layer. It will be noted from TABLE 5 that the greatest reduction in KSF usage is when the $1^{st}$ phosphor layer, in terms of total phosphor content of the layer, exclusively comprises KSF (i.e. Dev.5-100 wt % KSF in $1^{st}$ phosphor layer). This being said, it will be appreciated that even for a device having about a 75% wt % proportion of KSF of a total phosphor content in the $1^{st}$ phosphor layer (Dev.2), the saving in KSF usage is still about 25% which is substantial when the high cost of KSF is taken into account, resulting in nearly a 25% reduction in the overall cost of the manufacturing of the device.

As evidenced in TABLE 5, increasing the proportion (wt %) of KSF in the $1^{st}$ phosphor layer has the effect of (i) reducing KSF usage (23% to 45%), (ii) reducing CASN usage, (iii) increasing YAG usage, and (iv) reducing total phosphor usage. These effects together provide a significant cost reduction.

It will be further noted that in devices in accordance with the invention, the $2^{nd}$ phosphor layer can comprise from about 60% (Dev.2) to 100% (Devs.4 and 5) YAG (green photoluminescence material) of the total YAG content of the device.

TABLE 6

Optical performance of single-layer LED (Com. 2) and two-layer LEDs (Dev. 2 to Dev. 5)

| | CIE | | CCT | Flux | LE | Br | CRI | | | |
|---|---|---|---|---|---|---|---|---|---|---|
| Device | x | y | (K) | (lm) | (lm/W) | (%) | Ra | ΔRa | R9 | ΔR9 |
| Com. 2 | 0.4591 | 0.4169 | 2759 | 110.1 | 345.4 | 100.0 | 93.5 | 0.0 | 65.5 | 0.0 |
| Dev. 2 | 0.4591 | 0.4173 | 2763 | 111.2 | 347.2 | 100.9 | 92.5 | −1.0 | 61.4 | −4.1 |
| Dev. 3 | 0.4587 | 0.4170 | 2767 | 111.7 | 345.8 | 101.4 | 93.0 | −0.5 | 64.1 | −1.4 |
| Dev. 4 | 0.4589 | 0.4175 | 2766 | 110.9 | 345.3 | 100.7 | 93.5 | 0.0 | 67.5 | 2.0 |
| Dev. 5 | 0.4599 | 0.4135 | 2722 | 112.8 | 341.7 | 102.4 | 94.8 | 1.3 | 79.0 | 13.5 |

Experimental Test Data—Thermal Performance

TABLE 7 tabulates the thermal stability of the single-layer light emitting device Com.1 and two-layer light emitting device Dev.1. As can be seen from TABLE 7, compared with the single-layer device Com.1, the two-layer devices Dev.1 in accordance with the invention exhibits greater thermal stability in terms of light emission and emission color stability.

For example, the average flux generated by Dev.1 drops 12.3% (116.5 lm to 102.1 lm) when operated at 85° C. (H) compared with being operated at 25° C. (C). In comparison the average flux generated by Com.1 drops 12.7% (From 115.9 lm to 101.2 lm) when operated at 85° C. (H) compared with being operated at 25° C. (C).

In terms of luminous efficacy (LE), the average value of LE of Dev.1 drops 10.4% (From 123.1 lm/W to 110.4 lm/W) when operated at 85° C. (H) compared with being operated at 25° C. (C). In comparison, the average value of LE of Com.1 drops 11.6% (From 122.9 lm/W to 108.6 lm/W) when operated at 85° C. (H) compared with being operated at 25° C. (C). This demonstrates the superior thermal stability of a device formed in accordance with the invention since the drop in average LE of 10.4% (Dev.1) is less than the drop of 11.6% (Com.1).

In terms of general color rendering index CRI Ra, the average value of CRI Ra of Dev.1 increases by an amount of only 1.5 (From 93.2 to 95.2) when operated at 85° C. (H) compared with being operated at 25° C. (C). In comparison, the average value of CRI Ra of Com.1 increases by an amount 2.0 (From 91.2 to 93.3) when operated at 85° C. (H) compared with being operated at 25° C. (C). This demonstrates the superior thermal stability of a device formed in accordance with the invention since the increase of average CRI Ra of 1.5 (Dev.1) is less than the increase of 2.0 (Com.1).

In terms of color rendering index CRI R8, the average value of CRI R8 of Dev. 1 increases by an amount of only 0.6 (From 97.1 to 97.7) when operated at 85° C. (H) compared with being operated at 25° C. (C). In comparison, the average value of CRI R8 of Com.1 increases by an amount 1.2 (From 82.6 to 83.9) when operated at 85° C. (H) compared with being operated at 25° C. (C). This demonstrates the superior thermal stability of a device formed in accordance with the invention since the increase of average CRI R8 of 0.6 (Dev.1) is less than the increase of 1.2 (Com.1).

In terms of color rendering index CRI R9, the average value of CRI R9 of Dev. 1 increases by an amount of only 2.3 (From 83.3 to 85.5) when operated at 85° C. (H) compared with being operated at 25° C. (C). In comparison, the average value of CRI R9 of Com.1 increases by an amount 5.7 (From 57.4 to 63.1) when operated at 85° C. (H) compared with being operated at 25° C. (C). This demonstrates the superior thermal stability of a device formed in accordance with the invention since the increase of average CRI R9 of 2.3 (Dev.1) is less than the increase of 5.7 (Com.1).

TABLE 7

Thermal stability of a single-layer LED (Com. 1) and two-layer LED (Dev. 1)

| Device | Condition | Flux (lm) | LE (lm/W) | CIE x | CIE y | CRI Ra | CRI R8 | CRI R9 |
|---|---|---|---|---|---|---|---|---|
| Com. 1 | Cold (C) 25° C. | 115.0 | 123.2 | 0.4542 | 0.4073 | 91.0 | 82.4 | 57.0 |
| | | 117.3 | 119.8 | 0.4534 | 0.4083 | 91.3 | 82.5 | 57.3 |
| | | 115.4 | 125.6 | 0.4523 | 0.4101 | 91.4 | 83.0 | 57.8 |
| | Average | 115.9 | 122.9 | 0.4533 | 0.4086 | 91.2 | 82.6 | 57.4 |
| | Hot (H) 85° C. | 100.4 | 107.1 | 0.4579 | 0.3985 | 92.9 | 83.4 | 62.2 |
| | | 102.9 | 109.6 | 0.4570 | 0.3991 | 93.4 | 83.9 | 63.2 |
| | | 100.2 | 109.1 | 0.4562 | 0.4008 | 93.5 | 84.4 | 63.9 |
| | Average | 101.2 | 108.6 | 0.4570 | 0.3995 | 93.3 | 83.9 | 63.1 |
| | Δ C to H | −12.7% | −13.1% | 0.0037 | −0.0088 | 1.9 | 1.0 | 5.2 |
| | | −12.3% | −8.5% | 0.0036 | −0.0092 | 2.1 | 1.4 | 5.9 |
| | | −13.2% | −13.1% | 0.0039 | −0.0093 | 2.1 | 1.4 | 6.1 |
| | Average | −12.7% | −11.6% | 0.0040 | −0.0090 | 2.0 | 1.2 | 5.7 |
| Dev. 1 | Cold (C) 25° C. | 118.5 | 125.0 | 0.4456 | 0.4322 | 92.7 | 96.0 | 79.4 |
| | | 116.7 | 126.2 | 0.4467 | 0.4298 | 93.6 | 96.8 | 81.7 |
| | | 114.4 | 118.2 | 0.4512 | 0.4265 | 94.7 | 98.4 | 88.9 |
| | Average | 116.5 | 123.1 | 0.4478 | 0.4295 | 93.4 | 97.1 | 83.3 |
| | Hot (H) 85° C. | 103.9 | 112.3 | 0.4495 | 0.4242 | 94.5 | 96.7 | 82.1 |
| | | 102.3 | 112.1 | 0.4505 | 0.4216 | 95.4 | 97.3 | 84.2 |
| | | 100.2 | 106.8 | 0.4553 | 0.4182 | 95.7 | 99.0 | 90.5 |
| | Average | 102.1 | 110.4 | 0.4502 | 0.4213 | 95.2 | 97.7 | 85.6 |
| | Δ C to H | −12.3% | −10.1% | 0.0039 | −0.0080 | 1.8 | 0.7 | 2.7 |
| | | −12.3% | −11.3% | 0.0038 | −0.0082 | 1.8 | 0.5 | 2.5 |
| | | −12.4% | −9.7% | 0.0041 | −0.0083 | 1.0 | 0.6 | 1.6 |
| | Average | −12.3% | −10.4% | 0.0040 | −0.0080 | 1.5 | 0.6 | 2.3 |

Figure 10:
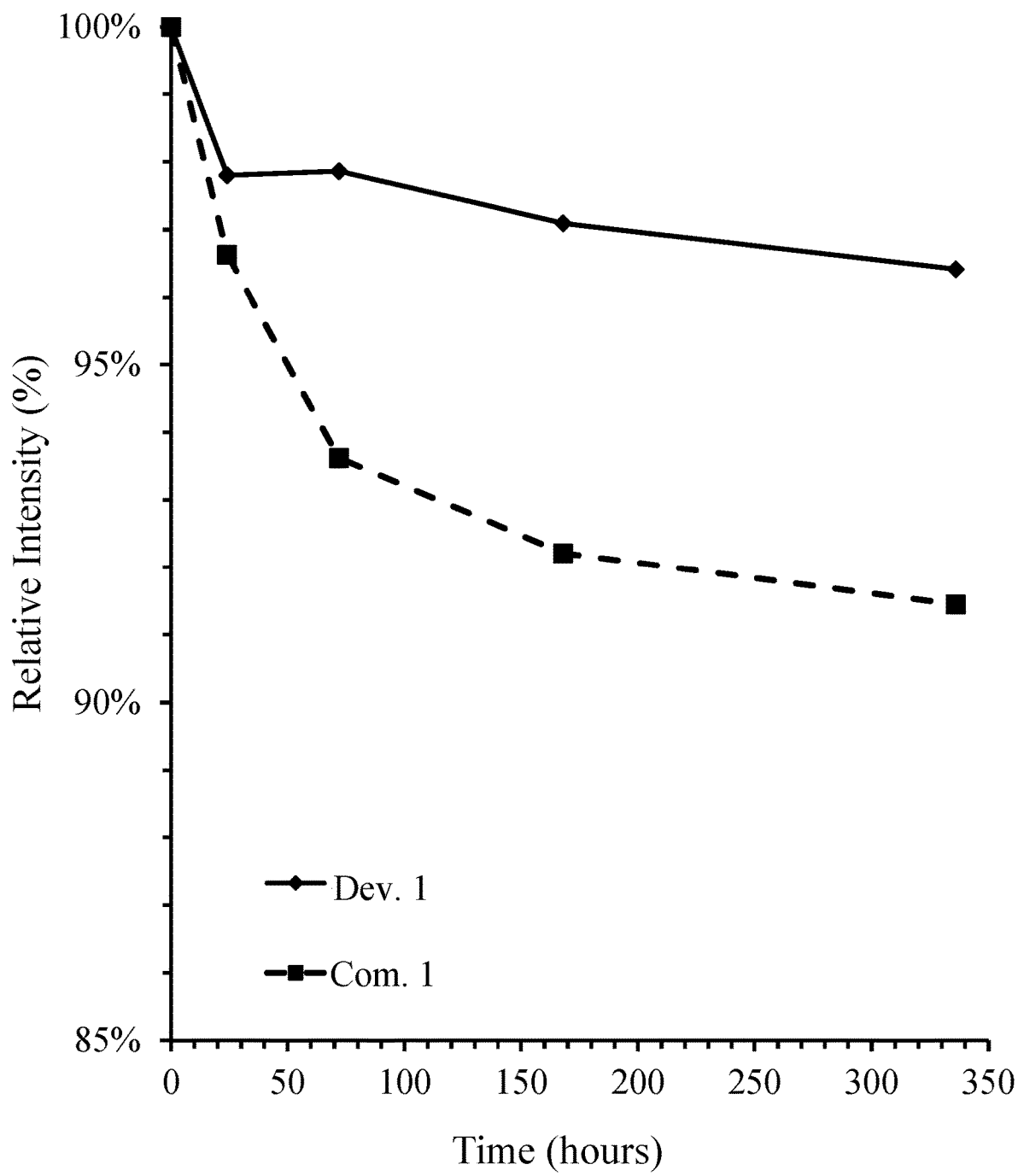
FIG. 10 shows reliability data, relative intensity versus time, for devices operated under accelerated testing conditions 85° C./85% RH for (i) a known 2700 K light emitting device (Com. 1) and (ii) a 2700K light emitting device (Dev. 1) according to some embodiments.

The reliability, relative brightness, of a light emitting device in accordance with the invention (Dev.1) comprising two-layers is compared with the reliability of a known device (Com.1) comprising a single-layer of mixed photoluminescence materials under Wet High Temperature Operation Life test condition (WHTOL), temperature is 85° C., relative humidity is 85%. The driving condition is 9V and 120 mA. As shown in FIG. 10, the two-layer LED's (Dev.1) relative intensity at 336 hrs is 96.4% while the relative intensity of the known single-layer LED (Com. 1) dropped to 91.45% at 336 hrs. It is believed that this improvement in reliability is due to a combination of the reduced usage of KSF phosphor as discussed above and the protection provided by the $2^{nd}$ photoluminescence layer covering the manganese-activated fluoride photoluminescence layer ($1^{st}$ layer).

Another accelerated reliability is a water boiling test. In this test, the LEDs were immersed in 85° C. deionized water for 4 hours. The LED brightness is tested before and after immersion in water. The results of this test are tabulated in TABLE 8. Under these conditions, it is believed that hot water may penetrate the upper photoluminescence layer silicone surface to react with Fluoride photoluminescence material. The two-layer device of the invention provides increased isolation between water and the KSF (manganese-activated fluoride photoluminescence material) in the 1$^{st}$ phosphor layer, resulting in better lumen maintenance than the single-layer device.

TABLE 8

Relative brightness of single-layer LEDs (Com. 1) and two-single-layer LEDs (Dev. 1) under immersion in boiling water (85° C.) for 4 hours Relative Brightness (%) after 4 hours Sample number

| Device | 1 | 2 | 3 | 4 | 5 | 6 | 7 | 8 | 9 | 10 | max | min | avg |
|---|---|---|---|---|---|---|---|---|---|---|---|---|---|
| Com. 1 | 95.4 | 96.4 | 96.7 | 93.9 | 94.7 | 96.1 | 93.5 | 94.1 | 93.0 | 94.6 | 96.7 | 93.0 | 94.8 |
| Dev. 1 | 97.3 | 97.1 | 97.5 | 97.6 | 98.0 | 98.3 | 98.2 | 98.0 | 98.4 | 97.3 | 98.4 | 97.1 | 97.8 |

Experimental Data—Packaged White Light Emitting Devices Utilizing CSP LEDs

TABLE 9 tabulates the measured optical performance of packaged white light emitting devices Devs. 6 to 8 that utilize CSP LEDs.

Dev.6 has the packaging arrangement of FIG. 5D and comprises a 2835 package containing a 4343 (43 mil×43 mil≈1.1 mm$^2$) CSP flip chip LED of dominant wavelength $\lambda_d$≈455 nm. The LED flip chip has a single photoluminescence layer which in terms of photoluminescence material (phosphor) consists of only KSF applied to its top light emitting face only. The photoluminescence layer is provided on a glass substrate. The package cavity is filled with a light reflective white silicone to a level that at least substantially or completely covers the side faces of the LED chip without covering the glass substrate. The remainder of the cavity is filled with silicone containing a mixture of broadband green to red emitting photoluminescence materials. The device is a nominal 0.3 W (rated driving condition is 120 mA and a forward drive voltage of 2.75 V) device and is intended to generate white light with a target Correlated Color Temperature (CCT) of 2700K and a general color rendering index CRI Ra≥90 and a CRI R9 of at least 50.

Dev.7 has the packaging arrangement of FIG. 5F and comprises a 2835 package containing a 4343 (43 mil×43 mil≈1.1 mm$^2$) CSP flip chip LED of dominant wavelength $\lambda_d$≈455 nm. The LED flip chip has a single photoluminescence layer which in terms of photoluminescence material (phosphor) consists of only KSF applied to its top light emitting face only. The photoluminescence layer is provided on a glass substrate. The CSP LED further comprises light reflective material that covers the four light emitting side faces of the LED chip. The package cavity is filled with silicone containing a mixture of broadband green to red emitting photoluminescence materials. The device is a nominal 0.3 W (rated driving condition is 120 mA and a forward drive voltage of 2.75 V) device and is intended to generate white light with a target Correlated Color Temperature (CCT) of 2700K and a general color rendering index CRI Ra≥90 and a CRI R9 of at least 50.

Dev.8 has the packaging arrangement of FIG. 5A and comprises a 2835 package containing a 4343 (43 mil×43 mil≈1.1 mm$^2$) CSP flip chip LED of dominant wavelength $\lambda_d$≈455 nm. The LED flip chip has a single photoluminescence layer which in terms of photoluminescence material (phosphor) consists of only KSF applied to its top light emitting face only. The photoluminescence layer is provided on a glass substrate The package cavity is fded with silicone containing a mixture of broadband green to red emitting photoluminescence materials. The device is a nominal 0.3 W (rated driving condition is 120 mA and a forward drive voltage of 2.75 V) device and is intended to generate white light with a target Correlated Color Temperature (CCT) of 4000K and a general color rendering index CRI Ra≥90 and a CRI R9 of at least 50.

TABLE 9

Optical performance of 2700K (Devs. 6 and 7) and 4000K (Dev. 8) packaged white light emitting device utilizing CSP LEDs

| Device | $I_F$ (mA) | $V_F$ (V) | Flux (lm) | LE (lm/W) | CIE x | CIE y | CCT (K) | CRI Ra | CRI R9 |
|---|---|---|---|---|---|---|---|---|---|
| Dev. 6 | 120 | 2.84 | 50.7 | 149 | 0.4578 | 0.4213 | 2811 | 91.7 | 57.2 |
|  | 65 | 2.75 | 28.5 | 160 | 0.4598 | 0.4191 | 2766 | 93.3 | 62.1 |
| Dev. 7 | 120 | 2.80 | 52.3 | 155 | 0.4576 | 0.4193 | 2799 | 92.8 | 62.5 |
|  | 65 | 2.72 | 29.4 | 166 | 0.4598 | 0.4193 | 2750 | 94.2 | 67.1 |
| Dev. 8 | 120 | 2.80 | 67.2 | 204 | 0.3833 | 0.3856 | 3989 | 89.1 | 52.8 |

Color Temperature Tunable White Light Emitting Devices

While the foregoing description has been in relation to fixed color temperature light emitting devices, embodiments of the invention also find utility in color temperature tunable white light emitting devices. Color temperature tunable white light emitting devices according to the invention comprise first and second LED chips (dies) for generating light of first and second different color temperatures. The LED chips are electrically configured such that electrical power can be applied independently to the first and second LED chips enabling color temperature tuning of light generated by the device. For example, when electrical power is provided to only the first LED chip(s) the device generates light of the first color temperature. When electrical power is provided to only the second LED chip(s) the device generates light of the second color temperature. When electrical power is provided to both the first and second LED chips the device generates light with a color temperature between the first and second color temperatures. The exact color temperature of light generated by the device depends on the ratio of the electrical power provided to the first and second LED chips. In the following description, LED chips with a suffix "a" are used to indicate LED chips that generate light of a first color temperature and LED chips with a suffix "b' are used to indicate LED chips that generate light of a second different color temperature.

Packaged Color Temperature Tunable White Light Emitting Devices Utilizing CSP LEDs FIG. 11A to 11E are cross sectional side views of packaged color temperature tunable white light emitting devices 1120 in accordance with embodiments of the invention that utilize CSP (Chip Scale Packaged) LEDs 1158.

Figure 11A:
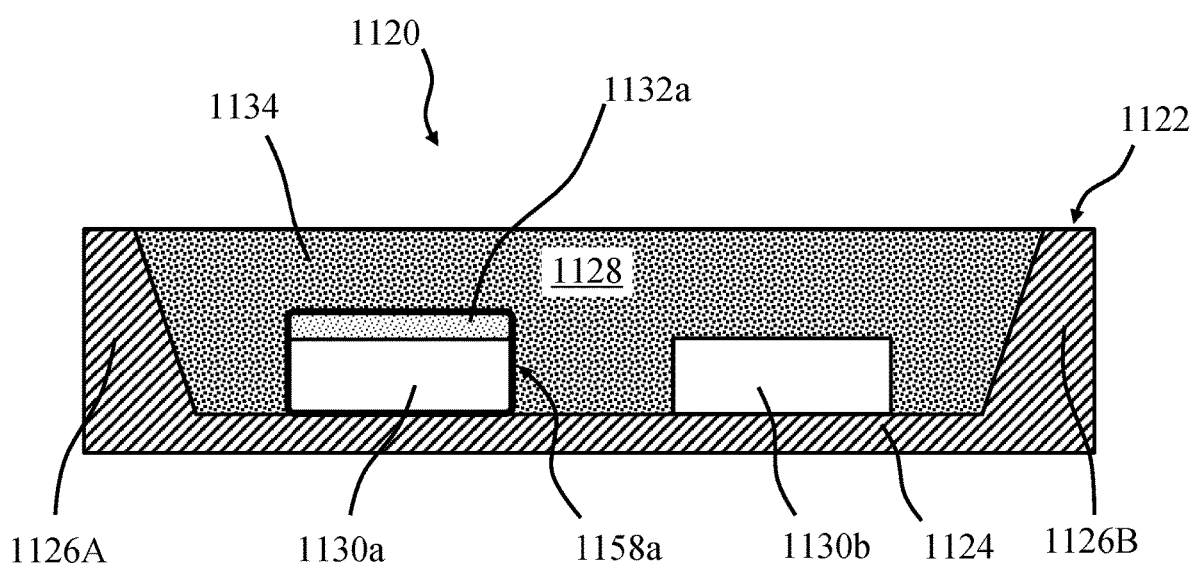
FIGS. 11A to 11E are cross sectional side views of color tunable white light emitting devices in accordance with embodiments of the invention that utilize CSP (Chip Scale Packaged) LEDs.
Figure 11B:
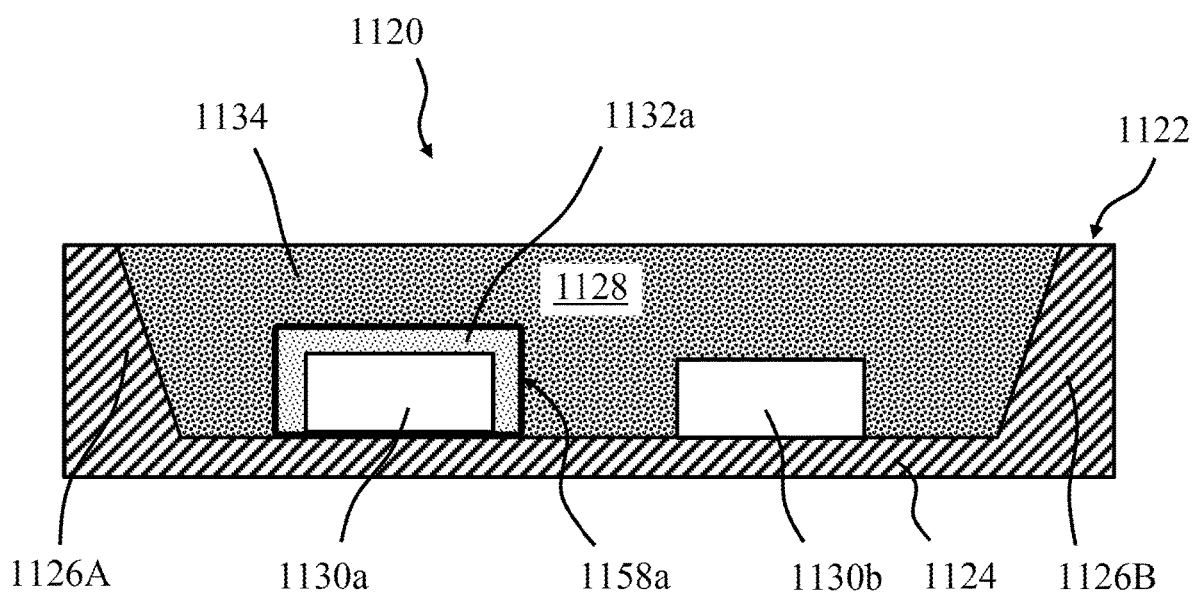
Figure 11C:
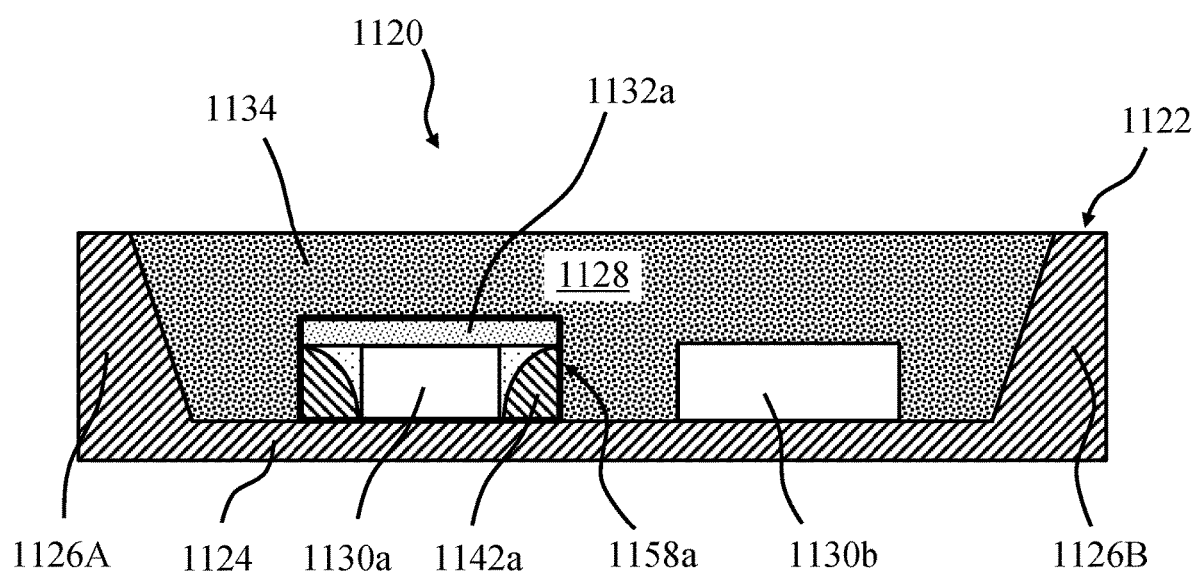

Each of the color temperature tunable devices 1120 of FIGS. 11A to 11C comprise a package 1122 comprising a base 1124 with side walls 1126A, 1126B, one or more first CSP LEDs 1158a (indicated by a heavy solid line), one or more second blue LED chips 1130b, and second photoluminescence layer 1134 that covers the first CSP LED(s) 1158a and the second LED chip(s) 1130b. The one or more first CSP LEDs 1158a comprise a first LED chip 1130a with a first photoluminescence layer 1132a that covers at least its light emitting top face. The first photoluminescence layer 1132a comprises a manganese-activated fluoride photoluminescence material only and can be applied in direct contact with the light emitting top face of the first LED chip 1130a and may be of a substantially uniform thickness.

As shown in FIG. 11A, a color tunable light emitting device 1120 comprises a package 1122 with one or more first CSP LEDs 1158a comprising a first LED chip 1130a with a first photoluminescence layer 1132a covering (applied to) its light emitting top face only. The device further comprises one or more second LED chips 1130b. A second photoluminescence layer 1134 is deposited so as to fill the cavity 1128 and cover the first CSP LED(s) 1158a and cover the second LED chip(s) 1130b. The first CSP LED(s) 1158a in conjunction with the second photoluminescence layer 1134 generate white light of a first color temperature while the second blue LED chip(s) 1130b in conjunction with the second photoluminescence layer 1134 generate white light of a second different color temperature. Since light generated by the first CSP LED(s) 1158a additionally includes red light generated by the manganese-activated fluoride phosphor of the first photoluminescence layer 1132a it will typically be warmer in color (that is lower in color temperature) than the light generated by the second LED chip(s) 1130b which includes light generated by the second photoluminescence layer 1134 only.

In the color tunable light emitting device 1120 of FIG. 11B the CSP LED(s) 1158a comprise an LED chip 1130a with a first photoluminescence layer 1132a that covers the light emitting top face and four side light emitting faces of the first LED chip 1130a. As indicated the first photoluminescence layer can be in the form of a conformal coating.

As shown in FIG. 11C the CSP LED(s) 1158a comprise the CSP packaging arrangement of FIG. 9L with a first photoluminescence layer 1132a that covers the light emitting top face and a light reflective material 1142a that covers each of the four side light emitting faces of the first LED chip 1130a.

The color temperature tunable light emitting devices of FIGS. 11A to 11C can be manufactured by mounting the CSP LED(s) 1158a and second blue LED chip(s) 1130b to the base (floor) 1124 of the package cavity 1128 and then depositing the second photoluminescence layer 1132 so as to fill the volume (cavity) 1128 and cover the CSP LED(s) 1158a and LED chip 1130b.

Figure 11D:
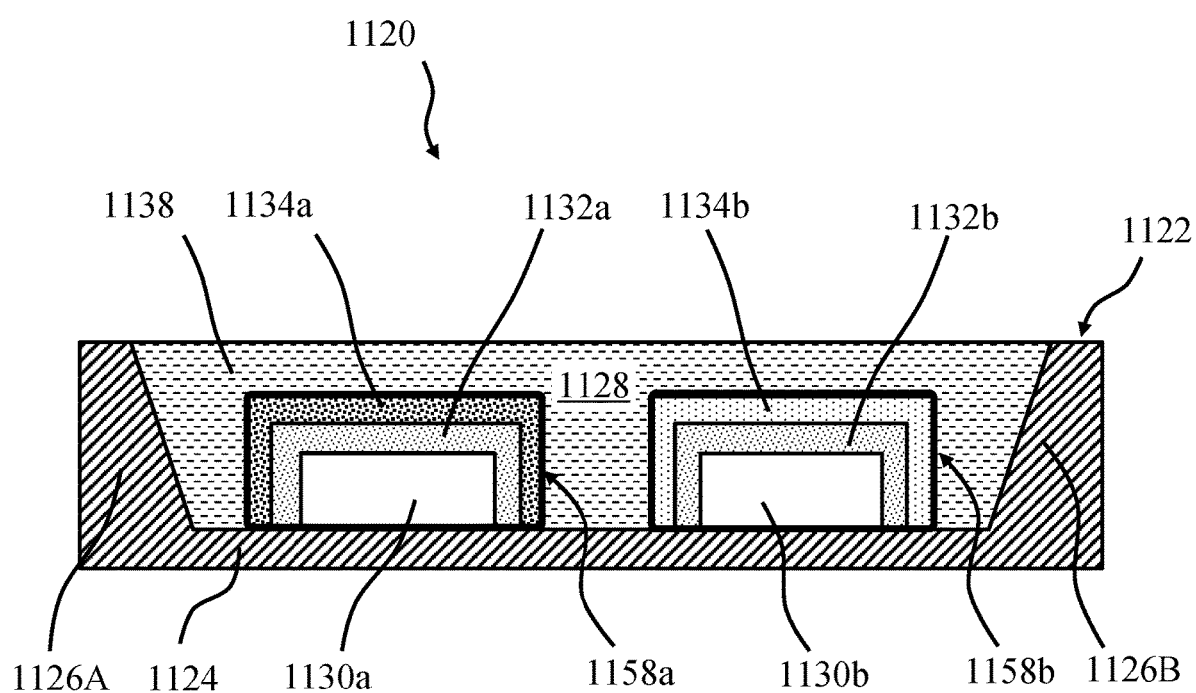
Figure 11E:
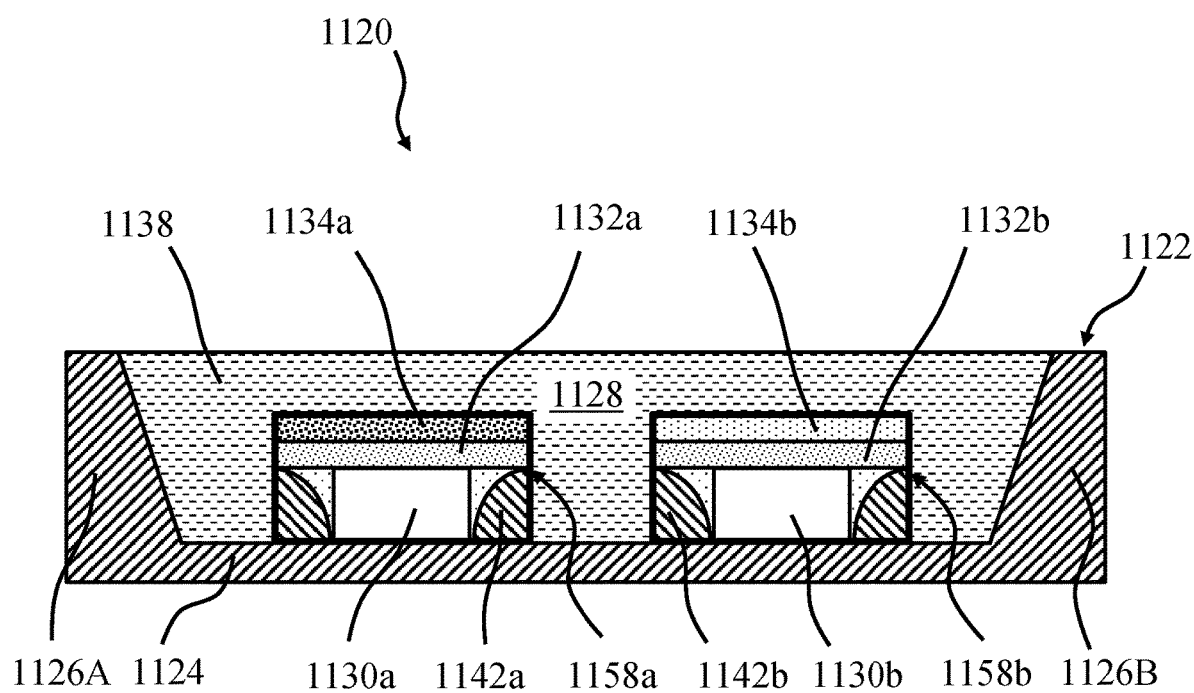

The color temperature tunable devices of FIGS. 11D and 11E comprise one or more first CSP LEDs 1158a that generate white light of a first color temperature and one or more second CSP LEDs 1158b that generate white light of a second different color temperature. The first and second CSP LEDs 1158a, 1158b each respectively comprise an LED chip 1130a, 1130b with first photoluminescence layer 1132a, 1132b applied to at least its light emitting top face and a second photoluminescence layer 1134a, 1134b cover the first photoluminescence layer. The first and second photoluminescence layers may be of uniform thickness.

As shown in FIG. 11D a color temperature tunable light emitting device 1120 comprises a package 1122 comprising a base 1124 with side walls 1126A, 1126B with one or more first and second CSP LEDs 1158a, 1158b. As illustrated, the first and second CSP LEDs 1158a, 1158b can, as shown, comprise the CSP packaging arrangement of FIG. 9B comprising LED chips 1130a, 1130b with first and second photoluminescence layers 1132, 1134 applied to their light emitting top face and four side light emitting faces in the form of a conformal coating. Optionally, the package cavity 1128 can be filled with a light transmissive material (optical encapsulant) 1138 such as a silicone material to provide environment protection to the CSP LEDs 1158a, 1158b.

In another embodiment, as shown in FIG. 11E, the first and second CSP LED(s) 1158a, 1158b can comprise the CSP packaging arrangement of FIG. 9M comprising an LED chips 1130a, 1158b, each with a first photoluminescence layer 1132a, 1132b that covers the top light emitting face of the LED chip 1130a, 1130b, a second photoluminescence layer 1134a, 1134b that covers the first photoluminescence layer, and a light reflective material 1142a, 1142b that covers the light emitting side faces of the LED chip 1130a, 1130b.

The color temperature tunable light emitting devices of FIGS. 11D and 11E can be manufactured by first manufacturing the CSP LEDs 1158a, 1158b, as herein described (FIGS. 9N to 9T), mounting the CSP LEDs to the floor of the package cavity 1128 and then filling the cavity with a light transmissive material (optical encapsulant) 1138 to provide environment protection to the CSP LEDs 1158a, 1158b.

COB Color Tunable White Light Emitting Devices Utilizing CSP LEDs

FIGS. 12A to 12E are cross sectional side views of COB (Chip On Board) color temperature tunable white light emitting devices in accordance with embodiments of the invention that utilize CSP (Chip Scale Packaged) LEDs.

Figure 12A:
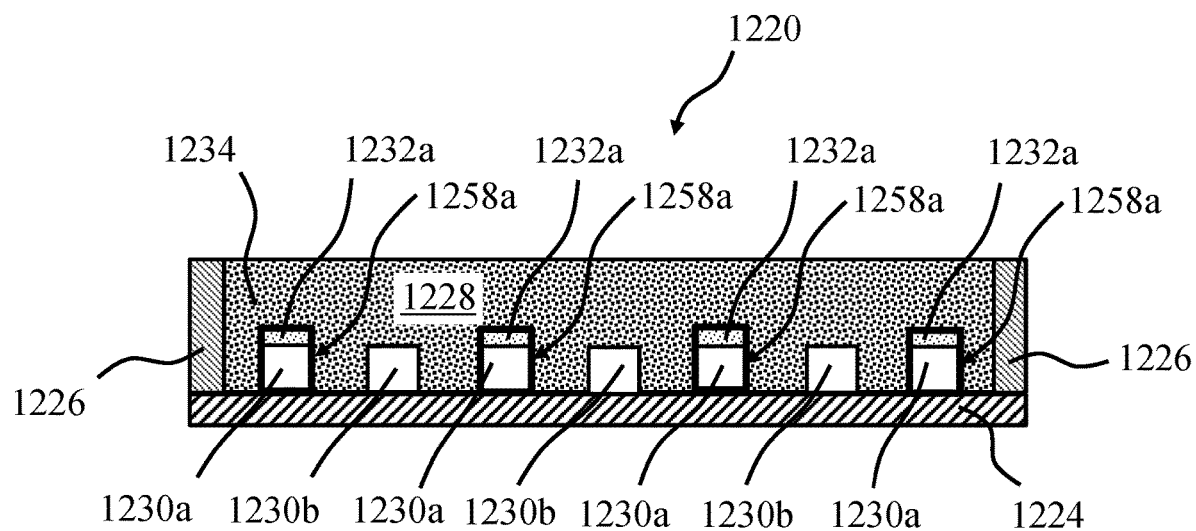
FIGS. 12A to 12E are cross sectional side views of COB (Chip On Board) color tunable white light emitting devices in accordance with embodiments of the invention that utilize CSP (Chip Scale Packaged) LEDs.
Figure 12B:
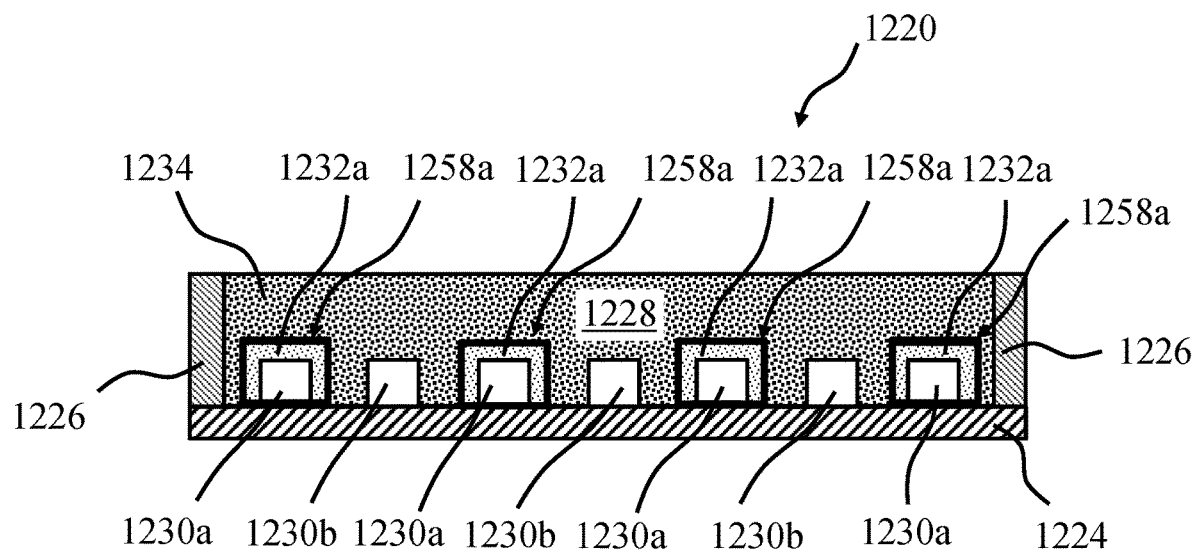
Figure 12C:
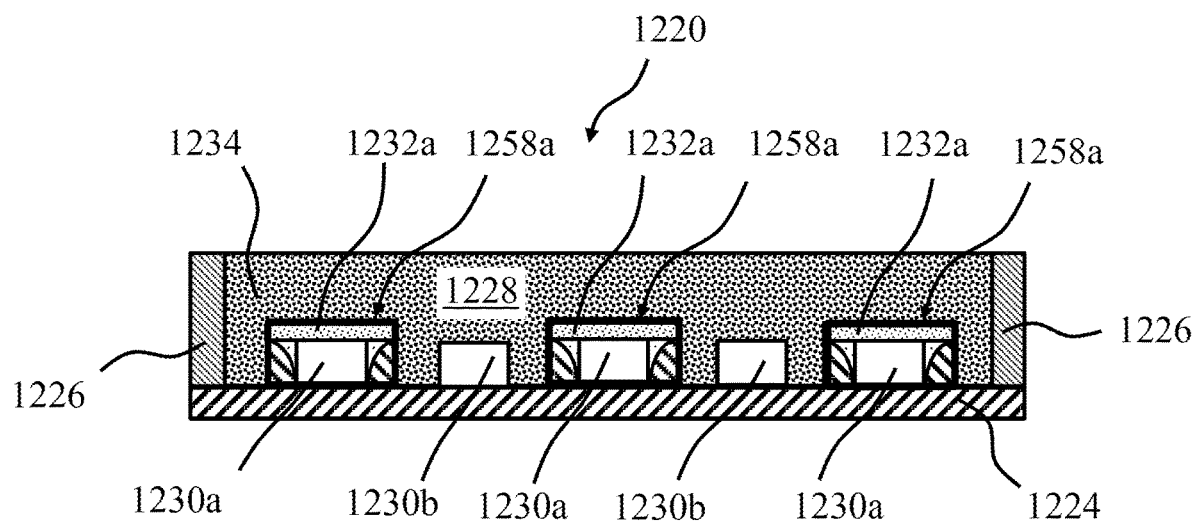

Each of the color temperature tunable devices of FIGS. 12A to 12C comprise a substrate 1124, one or more first CSP LEDs 1158a (indicated by a heavy solid line), one or more second blue LED chips 1130b, and second photoluminescence layer 1134 that covers the first CSP LED(s) 1158a and the second LED chip(s) 1130b. The one or more first CSP LEDs 1158a comprise a first LED chip 1130a with a first photoluminescence layer 1132 that covers at least its light emitting top face. The first photoluminescence layer 1132 comprises a manganese-activated fluoride photoluminescence material only and can be applied in direct contact with and may be of a substantially uniform thickness.

In an embodiment, as shown in FIG. 12A, a COB color tunable light emitting device 1220 comprises a planar substrate (board) 1224 which may typically comprise a circuit board such as a Metal Core Printed Circuit Board (MCPCB). An array of first CSP LEDs 1258a and an array of second blue LED chips 1230b are evenly distributed on the substrate 1224. To ensure a uniform emission color of light, the CSP LEDs 1258a and second LED chips 1230b can be interspersed. Each CSP LED 1258a comprises a first LED chip 1230a with a uniform thickness first photoluminescence layer 1132a applied to its light emitting top face only. The substrate 1224 further comprises about its entire perimeter a peripheral wall 1226 which encloses all the arrays of CSP LEDs 1258a and LED chips 1230b and in conjunction with the substrate 1224 define a volume (cavity) 1228. A second photoluminescence layer 1134 is deposited so as to fill the volume 1228 and cover the first CSP LED(s) 1258a and second LED chip(s) 1230b. The first CSP LED(s) 1258a in conjunction with the second photoluminescence layer 1234 generates white light of a first color temperature while the second LED chip(s) 1230b in conjunction with the second photoluminescence layer 1234 generates white light of a second different color temperature.

In the color tunable light emitting device 1220 of FIG. 12B the CSP LED(s) 1258a comprise an LED chip 1230a with a uniform thickness first photoluminescence layer 1232a applied to its light emitting top face and four side light emitting faces and is in the form of a conformal coating.

As shown in FIG. 12C the CSP LED(s) 1250a can comprise the CSP packaging arrangement of FIG. 9L in which a first photoluminescence layer 1132a covers the light emitting top face and a light reflective material covers each of the four side light emitting faces of the LED chip 1230a.

The COB color temperature tunable light emitting devices of FIGS. 12A to 12C can be manufactured by mounting the first CSP LED(s) 1258a and second LED chip(s) 1230b to the substrate (board) 1224 and then depositing the second photoluminescence layer 1234 so as to fill the volume (cavity) 1128 and cover the first CSP LEDs 1258a and second LED chips 1130b.

Figure 12D:
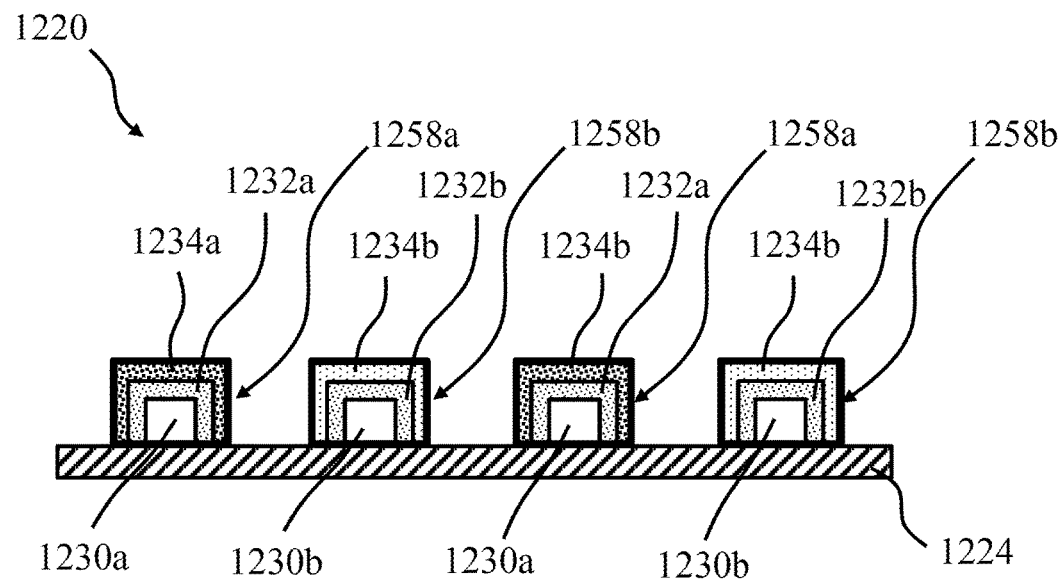
Figure 12E:
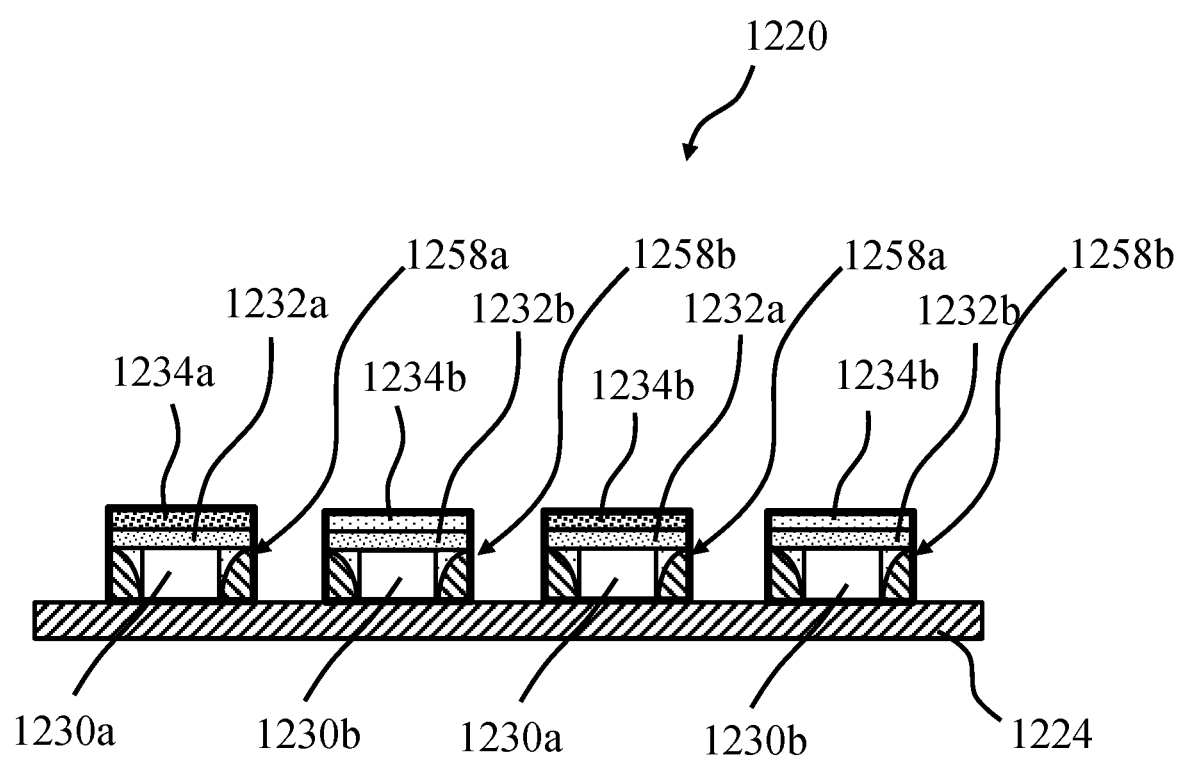

FIGS. 12D and 12E are cross sectional side views of COB (Chip On Board) color temperature tunable white light emitting devices 1220 that each comprise a plurality of first CSP LEDs 1258a that generate white light of a first color temperature and a plurality of CSP LEDs 1258b that generate white light of a second different color temperature. The first and second CSP LEDs 1158a, 1158b each respectively comprise an LED chip 1130a, 1130b, each with a uniform thickness first photoluminescence layer 1132a, 1132b applied to at least its light emitting top face and a second photoluminescence layer 1134a, 1134b that covers the first photoluminescence layer 1132a, 1132b.

In the embodiment shown in FIG. 12D, a COB color temperature tunable light emitting device 1220 comprises a substrate (board) 1124 with an array of first and second CSP LEDs 1258a, 1258b. As illustrated, the first and second CSP LEDs 1258a, 1258b can comprise the CSP packaging arrangement of FIG. 9B comprising LED chips 1230a, 1230b with respective first and second photoluminescence layers 1232a, 1232b, 1234a, 1234b applied to their light emitting top face and four side light emitting faces in the form of a conformal coating. As indicated in FIG. 12D there is no need for a peripheral wall, though a peripheral wall may be provided and the volume within the wall filled with a light transmissive material (optical encapsulant) such as a silicone material to provide environmental protection to the first and second CSP LEDs 1258a, 1258b.

In another embodiment, as shown in FIG. 12E, the first and second CSP LED(s) 1258a, 1258b can comprise the CSP packaging arrangement of FIG. 9M comprising LED chips 1230a, 1230b each with a first photoluminescence layer 1232a, 1232b that covers the top light emitting face of the LED chip 1230a, 1230b, a second photoluminescence layer 1234a, 1234b that covers the first photoluminescence layer 1232a, 1232b and a light reflective material 1242a, 1242b that covers the light emitting side faces of the LED chip 1230a, 1230b.

The COB color temperature tunable light emitting devices of FIGS. 12D and 12E can be manufactured by first manufacturing the first and second CSP LEDs 1258a, 1258b as herein described and then mounting them to the substrate (board) 1224.

As used in this document, both in the description and in the claims, and as customarily used in the art, the words "substantially," "approximately," and similar terms of approximation are used to account for manufacturing tolerances, manufacturing variations, manufacturing imprecisions, and measurement inaccuracy and imprecision that are inescapable parts of fabricating and operating any mechanism or structure in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the abstract of this document, and any summary statements in this document, are merely exemplary; they are not, and cannot be interpreted as, limiting the scope of the claims. Further, the figures are merely exemplary and not limiting. Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. Therefore, the invention is not to be restricted or limited except in accordance with the following claims and their legal equivalents.

LIST OF REFERENCE NUMERALS

10 Known light emitting device
12 Package
14 Cavity
16 LED die (chip)
18 Optical encapsulant
20 Light Emitting Device
22 Package
24 Base
26 Wall
28 Cavity
30 LED chip (die)
32 First Photoluminescence layer
34 Second photoluminescence layer
36 Passivation layer
38 Light transmissive material
40 LED chip base
42 Light reflective material
44 Light transmissive substrate

46 Photoluminescence component (film)
48 Light transmissive material
50 LED chip light emitting face
52 Valleys
54 Cut lines
56 Light transmissive region (layer)
58 CSP LED
=Figure number

What is claimed is:

1. A tunable packaged light emitting device comprising:
a substrate;
a package having a cavity wherein the substrate comprises a floor of the cavity;
at least one Chip Scale Packaged (CSP) Light Emitting Diode (LED) mounted on the substrate, the CSP LED comprising a first LED chip that generates excitation light with a dominant wavelength from 440 nm to 470 nm;
at least one second LED chip that generates excitation light with a dominant wavelength from 440 nm to 470 nm mounted on the substrate;
an electrical arrangement for changing a relative power applied to the at least one CSP LED and the at least one second LED chip to tune a color of light generated by the light emitting device; and
a photoluminescence layer that covers the at least one CSP LED and the at least one second LED chip, the photoluminescence layer comprising photoluminescence material that generates light with a peak emission wavelength from 500 nm to 650 nm,
wherein the at least one CSP LED comprises a further photoluminescence layer that covers a light emitting face of the first LED chip, the further photoluminescence layer comprising from 75 weight percent (wt %) to 100 wt % of a manganese-activated fluoride photoluminescence material of a total photoluminescence material content of the further photoluminescence layer.

2. The light emitting device of claim 1, further comprising a light reflective material that covers light emitting side faces of the first LED chip.

3. The light emitting device of claim 2, further comprising a light transmissive material disposed between the light reflective material and the light emitting side faces of the first LED chip.

4. The light emitting device of claim 1, wherein the further photoluminescence layer covers all light emitting faces of the first LED chip.

5. The light emitting device of claim 1, wherein the further photoluminescence layer has a thickness from 20 μm to 300 μm.

6. The light emitting device of claim 1, wherein the further photoluminescence layer comprises from 95 wt % to 100 wt % manganese-activated fluoride photoluminescence material of the total photoluminescence material content of the further photoluminescence layer.

7. The light emitting device of claim 1, wherein the manganese-activated fluoride photoluminescence material comprises at least one of: $K_2SiF_6:Mn^{4+}$, $K_2TiF_6:Mn^{4+}$, and $K_2GeF_6:Mn^{4+}$.

8. A tunable packaged light emitting device comprising:
a substrate;
a package having a cavity wherein the substrate comprises a floor of the cavity;
at least one first Chip Scale Packaged (CSP) Light Emitting Diode (LED) mounted on the substrate;
at least one second CSP LED mounted on the substrate; and
an electrical arrangement for changing a relative power to the first and second CSP LEDs to tune color of light generated by the light emitting device,
wherein the at least one first CSP LED generates light of a first color and the at least one second CSP LED generates light of a second different color,
wherein the at least one first and second CSP LEDs each comprise:
an LED chip that generates excitation light;
a first photoluminescence layer that covers a light emitting face of the LED chip, said photoluminescence layer comprising from 75 weight percent (wt %) to 100 wt % of a manganese-activated fluoride photoluminescence material of a total photoluminescence material content of the layer;
a second photoluminescence layer comprising photoluminescence material that generates light with a peak emission wavelength from 500 nm to 650 nm, wherein the second photoluminescence layer covers the first photoluminescence layer; and
a light reflective material that covers light emitting side faces of the LED chip.

9. The light emitting device of claim 8, wherein the at least one first and second CSP LEDs further comprise a light transmissive material disposed between the light reflective material and the light emitting side faces of the LED chip.

10. The light emitting device of claim 8, wherein the first photoluminescence layer has a thickness from 20 μm to 300 μm.

11. The light emitting device of claim 8, wherein the first photoluminescence layer comprises from 95 wt % to 100 wt % manganese-activated fluoride photoluminescence material of the total photoluminescence material content of the first photoluminescence layer.

12. The light emitting device of claim 8, wherein the manganese-activated fluoride photoluminescence material comprises at least one of: $K_2SiF_6:Mn^{4+}$, $K_2TiF_6:Mn^{4+}$, and $K_2GeF_6:Mn^{4+}$.

13. A tunable packaged light emitting device comprising:
a substrate;
a package having a cavity wherein the substrate comprises a floor of the cavity;
at least one first Chip Scale Packaged (CSP) Light Emitting Diode (LED) mounted on the substrate;
at least one second CSP LED mounted on the substrate; and
an electrical arrangement for changing a relative power to the at least one first and second CSP LEDs to tune a color of light generated by the light emitting device,
wherein the at least one first CSP LED generates light of a first color and the at least one second CSP LED generates light of a second different color,
wherein the at least one first and second CSP LEDs each comprise:
an LED chip that generates excitation light;
a first photoluminescence layer that covers all light emitting faces of the LED chip, said photoluminescence layer comprising from 75 weight percent (wt %) to 100 wt % of a manganese-activated fluoride photoluminescence material of a total photoluminescence material content of the layer; and
a second photoluminescence layer comprising photoluminescence material that generates light with a peak emission wavelength from 500 nm to 650 nm, wherein the second photoluminescence layer covers the first photoluminescence layer.

14. The light emitting device of claim 13, wherein the first photoluminescence layer has a thickness from 20 μm to 300 μm.

15. The light emitting device of claim 13, wherein the first photoluminescence layer comprises from 95 wt % to 100 wt % manganese-activated fluoride photoluminescence material of the total photoluminescence material content of the first photoluminescence layer.

16. The light emitting device of claim 13, wherein the manganese-activated fluoride photoluminescence material comprises at least one of: $K_2SiF_6:Mn^{4+}$, $K_2TiF_6:Mn^{4+}$, and $K_2GeF_6:Mn^{4+}$.

* * * * *

UNITED STATES PATENT AND TRADEMARK OFFICE
CERTIFICATE OF CORRECTION

| | | |
|---|---|---|
| PATENT NO. | : 11,631,792 B2 | Page 1 of 1 |
| APPLICATION NO. | : 17/379272 | |
| DATED | : April 18, 2023 | |
| INVENTOR(S) | : Jun-Gang Zhou, Gang Wang and Yi-Qun Li | |

It is certified that error appears in the above-identified patent and that said Letters Patent is hereby corrected as shown below:

In the Claims

Column 38, Line 4, that portion of Claim 8 reading:
"to tune color of light"
Should read:
--to tune a color of light--

Signed and Sealed this
Sixteenth Day of May, 2023

Katherine Kelly Vidal
*Director of the United States Patent and Trademark Office*